US006914806B2

(12) United States Patent
Kunikiyo

(10) Patent No.: US 6,914,806 B2
(45) Date of Patent: Jul. 5, 2005

(54) MAGNETIC MEMORY DEVICE

(75) Inventor: Tatsuya Kunikiyo, Tokyo (JP)

(73) Assignee: Renesas Technology Corp., Tokyo (JP)

(*) Notice: Subject to any disclaimer, the term of this patent is extended or adjusted under 35 U.S.C. 154(b) by 284 days.

(21) Appl. No.: 10/262,941

(22) Filed: Oct. 3, 2002

(65) Prior Publication Data

US 2003/0223283 A1 Dec. 4, 2003

(30) Foreign Application Priority Data

Apr. 3, 2002  (JP) ......................... 2002-100806

(51) Int. Cl.[7] .............................................. G11C 11/00
(52) U.S. Cl. ......................................... 365/158; 365/55
(58) Field of Search .......................... 365/158, 55, 74, 365/148, 171, 209, 232

(56) References Cited

U.S. PATENT DOCUMENTS

| 5,640,343 | A | 6/1997 | Gallagher et al. |
| 5,732,016 | A | 3/1998 | Chen et al. |
| 5,793,697 | A | 8/1998 | Scheuerlein |
| 5,940,319 | A | 8/1999 | Durlam et al. |
| 5,946,227 | A | 8/1999 | Naji |
| 6,252,471 | B1 | 6/2001 | Salter et al. |
| 6,272,040 | B1 | 8/2001 | Salter et al. |
| 6,549,455 | B2 * | 4/2003 | Yamada ...................... 365/158 |

FOREIGN PATENT DOCUMENTS

JP         2001-267524         9/2001

* cited by examiner

*Primary Examiner*—Thong Q. Le
(74) *Attorney, Agent, or Firm*—Oblon, Spivak, McClelland, Maier & Neustadt, P.C.

(57) ABSTRACT

There is provided a MRAM capable of reading at any timing information of memory cells at different addresses connected to the same bit line. Specifically, a memory cell of an address (AD00) has MOS transistors (Q1, Q2) connected in series and a magnetic tunnel resistive element (MR00), which are disposed between bit lines (BL0a, BL0b). The gate electrodes of the MOS transistors (Q1, Q2) are respectively connected to word lines (WL0a, WL0b). Memory lines (ML0, ML1) are connected in common to a reference voltage source (VR1) via N-channel MOS transistors (Q3, Q31), and are respectively connected to current sources with a switch (S1, S2). The bit lines (BL0a, BL0b, BL1a, BL1b) are respectively connected to inputs of buffers with a switch (B1 to B4), and their outputs are supplied to the corresponding sense amplifier (SA1).

18 Claims, 42 Drawing Sheets

F I G . 3 9 (BACKGROUND ART)
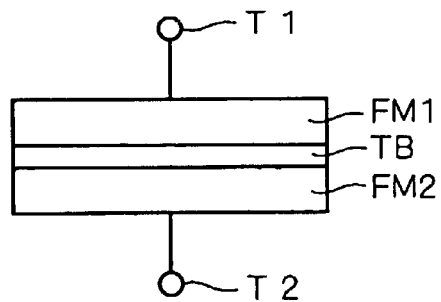
F I G . 4 0 (BACKGROUND ART)
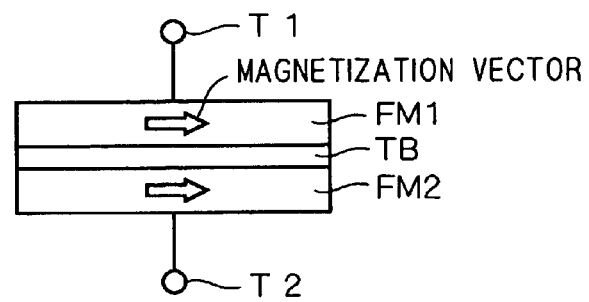
F I G . 4 1 (BACKGROUND ART)
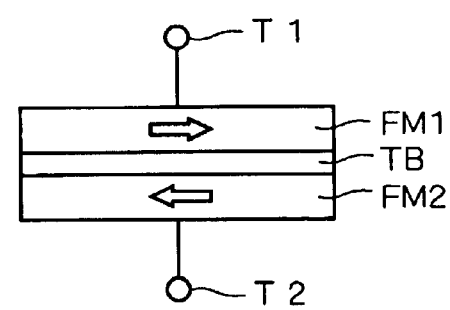

MAGNETIC MEMORY DEVICE

BACKGROUND OF THE INVENTION

1. Field of the Invention

The present invention relates to magnetic memory devices, and more particularly to magnetic memory devices that have non-volatile memory arrays using magnetic tunnel resistive elements as the individual memory cells.

2. Description of the Background Art

A structure in which an insulative material is sandwiched between two ferromagnetic materials is called "magnetic tunnel junction (MTJ)."

FIG. 39 is a schematic diagram of a MTJ. In FIG. 39, an insulator layer TB is disposed between ferromagnetic layers FM1 and FM2. It is constructed so as to supply a terminal voltage to the ferromagnetic layers FM1 and FM2 via terminals T1 and T2, respectively. The resistance between the terminals T1 and T2 is referred to as "resistance of magnetic tunnel resistive element."

When some measurements are made of the current tunneling through the insulator layer TB in this structure, there can observe the phenomenon that the current values are different, namely the resistances of magnetic tunnel resistive elements are different for different directions of the magnetization of the two ferromagnetic layers. In place of the insulator layer TB, a non-magnetic layer may be used.

This phenomenon is called "tunnel magnetic resistance (TMR) effect."

Tunnel Magnetic Resistance Effect

The concept of tunnel magnetic resistance effect will be described with reference to FIGS. 40 and 41. FIG. 40 shows a state that the magnetization vector directions of the ferromagnetic layers FM1 and FM2 are matched with each other (i.e., parallel state). In this state, the resistance between the terminals T1 and T2 is the minimum.

FIG. 41 shows a state that the magnetization vector direction difference between the ferromagnetic layers FM1 and FM2 is 180° (i.e., antiparallel state), in which the resistance between the terminals T1 and T2 is the maximum.

Therefore, a MRAM (magnetic random access memory) stores information by utilizing the following configuration that the magnetization vector direction of one of the ferromagnetic layers FM1 and FM2 is fixed whereas the magnetization vector direction of the other can be changed arbitrarily to the same as or antithetical to that of one ferromagnetic layer, in order that the magnetization directions of the two ferromagnetic layers correspond to "bit 0" or "bit 1."

Specifically, information can be stored by setting a high resistance combination in two combinations of magnetization directions of the two ferromagnetic layers to "bit 1" and a low resistance combination to "bit 0" (or vice versa).

FIG. 42 shows a basic configuration of a spin valve magnetic tunnel junction element using the tunnel magnetic resistance effect.

Referring to FIG. 42, an insulator layer TB (any non-magnetic layer is also usable) is disposed between ferromagnetic layers FM1 and FM2. An antiferromagnetic layer AFM is disposed below the ferromagnetic layer FM2.

The ferromagnetic layer FM2 is formed by COFe having a large coercivity, the ferromagnetic layer FM1 is formed by permalloy having a relatively small coercivity, and the antiferromagnetic layer AFM is formed by IrMn. With this configuration, the antiferromagnetic layer AFM can fix the magnetization direction of the ferromagnetic layer FM2. The magnetization direction is less subject to reversal against the external magnetic field because of the large coercivity of the ferromagnetic layer FM2. On the other hand, the ferromagnetic layer FM1 is subject to magnetization direction change due to the external magnetic field. Therefore, changing the magnetization direction of the ferromagnetic layer FM1 by the external magnetic field enables to change the resistance of the magnetic tunnel resistive element.

Since MRAM technology has general-purpose properties and is low in cost, it has been considered to use this in place of memory technology such as flash memory, SRAM (static RAM), DRAM (dynamic RAM), etc.

Example of MRAM Configuration

In a MRAM, information stored in a magnetic tunnel resistive element constituting a memory cell can be read by passing a predetermined current through the cell and sensing both-end voltages of the magnetic tunnel resistive element. Since a larger tunnel magnetic resistance rate (TMRR) facilitates sensing, a ferromagnetic material having a large spin polarizability (which affects tunnel probability) is advantageous to the MRAM.

Information can be written on the magnetic tunnel resistive element of the MRAM by determining the magnetization vector direction of one of two ferromagnetic layers by using a magnetic field that occurs when a predetermined current is passed through wiring (word lines and bit lines).

As examples of MRAM, the structure and operation of MRAMs disclosed in U.S. Pat. No. 5,793,697 and U.S. Pat. No. 5,640,343 will be described with reference to FIGS. 43 to 46.

FIG. 43 is a perspective view of MRAM cell arrays and cells. In FIG. 43, bit lines 4, 5, and 6 are disposed in parallel so as to cross over word lines 1, 2, and 3 disposed in parallel.

A MRAM cell 9 (hereinafter merely referred to as a "cell" in some cases) is formed at each cross point sandwiched between the word line and bit line. As illustrated in an enlarged scale in FIG. 43, the MRAM cell 9 has such a structure that a magnetic tunnel junction element (MTJ) 8 is stacked on top of a silicon pn junction diode 7 disposed on the word line.

FIG. 44 is a schematic diagram showing a sectional structure of the MRAM cell 9. Specifically, the MRAM cell 9 on the word line 3 is for example shown, in which the word line 3 is disposed on a silicon substrate 80, and an $n^+$ silicon layer 10 and a $p^+$ silicon layer 11 are stacked in this order on the word line 3, thereby obtaining a pn junction diode 7. The pn junction diode 7 is covered with a silicon oxide film 13.

Disposed on the pn junction diode 7 is a tungsten stud 12, and the pn junction diode 7 is electrically connected via the tungsten stud 12 to the MTJ 8. The silicon oxide film 13 is disposed such that it also covers the tungsten stud 12. The surfaces of the tungsten stud 12 and silicon oxide film 13 are planarized by CMP (chemical mechanical polishing).

The MTJ 8 is of a stacked structure comprising, from bottom to top, a template layer 15 (10 nm thick) of platinum (Pt), an initial ferromagnetic layer 16 (4 nm thick) of $Ni_{81}Fe_{19}$ permalloy, an antimagnetic layer 18 (10 nm thick) of $Mn_{54}Fe_{46}$, a ferromagnetic layer (FMF layer) 20 (8 nm thick) that is composed of CoFe or $Ni_{81}Fe_{19}$ permalloy and its magnetization direction is fixed, a tunnel barrier layer 22 of $Al_2O_3$, a soft ferromagnetic layer (FMS layer) 24 that is made of a multilayer film of a 2-nm-thick CoFe and a 20-nm-thick $Ni_{81}Fe_{19}$, and a contact layer 25 of Pt.

The tunnel barrier layer 22 is made by depositing Al in a thickness of 1 nm to 2 nm and, by plasma oxidation method, performing oxidization at an oxygen pressure of 100 mTorr and a power density of 25 $W/cm^2$ for 60 to 240 seconds.

Although there is no illustration in FIG. 44, a single large MTJ is actually formed on the entire surface of the silicon oxide film 13 overlying the substrate 80. This large MTJ is then patterned by argon ion milling using a photoresist mask, into many small MTJs shown in FIG. 44. The individual MTJs 8 are covered with the silicon oxide film 26. The contact layer 25 has a connection to the bit lines, although this is not shown in FIG. 44.

The MTJ 8 changes magnetic tunnel resistance when the magnetization direction of the soft ferromagnetic layer 24 switches from being parallel to being antiparallel to the magnetization direction of the ferromagnetic layer 20, as previously described. The magnetization direction of the soft ferromagnetic layer 24 can be changed by a magnetic field generated when current is passed through the bit lines and word lines.

The magnetic tunnel resistance of the MTJ 8 is also strongly dependent on the thickness of the tunnel barrier layer 22, its barrier height, and the layer material properties, such as the roughness of the interface underlying the junction.

The soft ferromagnetic layer 24 is formed so as to have the so-called "easy axis" that is a direction in which it is easy to produce magnetization. There are two possible directions of magnetization along this easy axis, and two data of "0" and "1" of the memory cell can be made equivalent to the two directions, respectively.

On the other hand, the ferromagnetic layer 20 is formed such that its magnetization direction is the same as the easy axis of the soft ferromagnetic layer 24, and also remains its direction irrespective of the MRAM operation state.

This magnetization direction is called "unidirectional anisotropy direction." The easy axis of the soft ferromagnetic layer 24 is determined by combining the intrinsic anisotropy, stress induced anisotropy, and shape anisotropy of the MTJ 8.

The term "intrinsic anisotropy" means the anisotropy of magnetization inherent in the physical properties of a ferromagnetic material. The term "stress induced anisotropy" means the anisotropy of magnetization generated when a ferromagnetic material is stressed.

Referring to FIG. 43, the MTJ 8 is, when viewed from above, in a shape of a rectangle of length L and width W (wherein L is larger than W). This is because the easy axis of the soft ferromagnetic layer 24 is determined by using the shape anisotropy of the MTJ 8.

Following is a method of setting the unidirectional magnetization direction of the ferromagnetic layer 20. The initial ferromagnetic layer 16, which is formed by deposition on the template layer 15, grows with a plane of (111)-oriented crystal orientation (i.e., the (100) plane) facing up. The antimagnetic layer 18 of MnFe is deposited on the initial ferromagnetic layer 16.

These ferromagnetic layers are deposited under a magnetic field directed parallel to the easy axis of the soft ferromagnetic layer 24 being later deposited, thereby determining the unidirectional anisotropy direction of the ferromagnetic layer 20.

Since a magnetic flux is closed between the ferromagnetic layer 20 and antimagnetic layer 18, the magnetization direction of the ferromagnetic layer 20 is less changeable by the external magnetic field than the soft ferromagnetic layer 24. As the result, the magnetization direction of the ferromagnetic layer 20 is fixed in the range of the magnitude of a magnetic field generated when current is passed through the bit lines and word lines. Further, magnetization anisotropy induced by the shape of the ferromagnetic layer 20 will occur because the MTJ 8 is made in a rectangle when viewed from above. This also contributes to the magnetization direction stability of the ferromagnetic layer 20.

Outline of Write/Read Operation of MRAM

Following is write and read operations of the MRAM shown in FIGS. 43 and 44.

When passing a predetermined current through the word lines and bit lines for performing address selection (referred to as "select word lines" and "select bit lines"), a magnetic field is generated around each line, and a coupled magnetic field where the respective magnetic fields are coupled to each other is generated at the intersection of the both lines (i.e., a select address). When this magnetic field is applied, the magnetization direction of the soft ferromagnetic layer 24 of the MTJ 8, which is disposed at the above-mentioned intersection, is rotated within the layer plane thereby to write data.

This magnetic field magnitude is designed so as to be larger than the switching magnetic field of the soft ferromagnetic layer 24 (i.e., a magnetic field on which the magnetization direction is started in reversal), and it is determined mainly by the coercivity and magnetization anisotropy of the soft ferromagnetic layer 24.

It is also necessary to design such that the magnetic field generated around the select word line and select bit line are sufficiently small to avoid rotation of the unidirectional anisotropy direction of the ferromagnetic layer 20. The reason for this is to maintain the magnetization directions of half select cells. The term "half select cells" means those over which current is passing only one of the word line and bit line locating at their upper and lower parts, respectively.

Thus in the memory array architecture, it is designed such that a write current does not directly pass through the MTJ 8 in order to reduce the power consumption during a write operation.

Data that is written on the MRAM cell 9 can be read by sensing current perpendicularly passing through the pn junction diode 7 and MTJ 8. Since tunnel current passes vertically through the MRAM cell 9 during an operation, the area occupied by the MRAM cell 9 can be reduced.

The resistance of the tunnel barrier layer 22 of $Al_2O_3$ in the MTJ 8 is changed almost exponentially with respect to its layer thickness. That is, the current passing through a tunnel barrier is decreased as the layer thickness is increased, so that only the current tunneling the junction passes perpendicularly to the junction.

Data of the MRAM cell 9 can be read by monitoring the voltage of the MRAM cell 9 that is generated when a considerably smaller sense current than the write current passes perpendicularly through the MTJ 8.

As previously described, the tunneling probability of MTJ 8 increases as the ferromagnetic layer 20 in its terminal state retains more spin state density of the same polarization as the spin polarization in the soft ferromagnetic layer 24 in its initial state.

Accordingly, the magnetic tunnel resistance of the MTJ 8 is low when the soft ferromagnetic layer 24 and ferromagnetic layer 20 are in the same spin state, namely when the both layers have the same magnetization direction, whereas it is high when the both layers have opposite magnetization directions. Therefore, the data of the MRAM cell 9 can be read by monitoring the resistance of the MTJ 8 with micro current.

Any magnetic field induced by a sense current can be ignored because it exerts no influence on the magnetization state of the MRAM cell 9. In addition, only the array of bit lines and word lines shown in FIG. 43 is necessary for reading/writing the data of the MRAM 9. This allows for an efficient memory cell array configuration.

Write Operation

The write operation of the MRAM will be further described with reference to FIGS. 45 and 46.

FIG. 45 is an equivalent circuit diagram of the memory cell array shown in FIG. 43. Both ends of word lines 1 to 3 are respectively connected to a word line control circuit 32, and both ends of bit lines 4 to 6 are respectively connected to a bit line control circuit 31. For convenience, in some cases, the word lines 1 to 3 are hereafter referred to as "word lines WL1 to WL3," and the bit lines 4 to 6 are referred to as "bit lines BL4 to BL6."

MTJs 8 denoted by resistance symbol and pn junction diodes 7 denoted by diode symbol are disposed at cross points between the word lines 1 to 3 and the bit lines 4 to 6.

For example, if the word line 1 and bit line 4 are selected, a MRAM cell 9a locating at the cross point therebetween is selected.

The selected MRAM cell 9a is written by a coupled magnetic field generated by current $I_B$ passing through the bit line 4 and current IW passing through the word line 1.

A magnetic field that the current IB or IW alone generates within a cell region is smaller than a magnetic field necessary for changing the magnetization direction of the soft ferromagnetic layer 24 in the MTJ 8.

Thereby, no writing is performed to MRAM cells 9b to 9e that are half select cells, over which only current $I_B$ or $I_W$ alone is passing through.

However, a coupled magnetic field induced by the currents $I_B$ and $I_W$ is sufficient to change the magnetization direction of the soft ferromagnetic layer 24 in the selected memory cell 9a.

In order that the soft ferromagnetic layer 24 of the cell 9a has two mutually different magnetization directions, at least one of the currents I.sub.B and I.sub.W is designed to pass in two directions. In FIG. 45, the bit line control circuit 31 and word line control circuit 32 are arranged in pairs, and therefore, both of the currents I.sub.B and I.sub.W can change current direction.

FIG. 46 shows a timing chart of voltages and currents of bit lines 4 to 6 (bit lines BL4 to BL6) and word lines 1 to 3 (word lines WL1 to WL3).

Referring to FIG. 46, the voltages of the bit lines BL4 to BL6 during a write operation is set at voltage $V_b$ for convenience in passing a bidirectional current. The voltages of the word lines WL1 to WL3 are set at a positive voltage $V_w$ larger than the voltage $V_b$.

During a standby period, these voltages are set so that pn junction diodes 7 of all the cells 9 are reverse biased. As the result, the currents $I_B$ and $I_W$ do not pass through any memory cell during the standby period.

Read Operation

The read operation of the MRAM will be further described with reference to FIGS. 45 and 46. Referring to FIG. 46, a forward bias is applied to the pn junction diode 7 of the selected cell 9a by decreasing the word line WL1 voltage from $V_w$ to $V_b$, and increasing the bit line BL4 from voltage $V_b$ to $V_w$.

During a read, unselected bit lines BL5 and BL6 remain at the standby voltage $V_b$, and unselected word lines WL2 and WL3 remain at the standby voltage $V_w$.

Since half select cells 9b to 9e have no voltage drop from word line to bit line (i.e., zero voltage is supplied to the pn junction diode 7), no current pass through any memory cell.

The magnitude of sense current 30 (see FIG. 45) that passes from the bit line BL4 through the cell 9a to the word line WL1 is determined by the magnetic tunnel resistance of the selected cell 9a. In the sense circuit forming part of the bit line control circuit 31, the sense current is compared to a reference current that is a mean value of two expected current values for the two possible states of the cell. Then, the difference therebetween is amplified to read the data stored in the selected cell 9a.

As shown by the waveform of the sense current 30 in FIG. 46, the sense current 30 has two current waveforms corresponding to the two magnetic states of the MTJ 8.

After the data is read, the voltages of the bit line BL4 and word line WL1 are returned to their respective standby values. On the other hand, the magnetic state of the memory cell 9a remains unchanged after the read operation.

Example of MRAM Memory Cell Array Configuration

FIG. 47 shows schematically the configuration of a MRAM memory cell array disclosed in U.S. Pat. No. 6,272,040 entitled "System and Method for Programming a Magnetoresistive Memory Device."

FIG. 47 shows part of the MRAM memory cell array configuration, illustrating four memory cells of magnetic tunnel resistive elements MR91, MR92, MR93, and MR94, respectively.

The magnetic tunnel resistive elements MR91 and MR92 are connected in common at their bit line terminals to a column memory line C1. The column memory line C1 is electrically connected via a N-channel MOS transistor Q91 to a reference power source VR91.

Select line terminals of the magnetic tunnel resistive elements MR91 and MR92 are connected in common to an output line via N-channel MOS transistors Q93 and Q94, respectively. The output line is connected to an output buffer B91.

Digit line terminals of the magnetic tunnel resistive elements MR91 and MR92 are connected in common to a memory line R91 connected to a current source S93.

The magnetic tunnel resistive elements MR93 and MR94 are connected in common at their bit line terminals to a column memory line C2. The column memory line C2 is electrically connected via a N-channel MOS transistor Q92 to a reference power source VR91.

Select line terminals of the magnetic tunnel resistive elements MR93 and MR94 are connected in common to an output line via N-channel MOS transistors Q95 and Q96, respectively. The output line is connected to the output buffer B91. A connection node between the output lines is referred to as a "node N1."

Digit line terminals of the magnetic tunnel resistive elements MR93 and MR94 are connected in common to a memory line R92 that is connected to a current source S94.

The column memory lines C1 and C2 are connected to bidirectional current sources S91 and S92, respectively.

The bidirectional current sources S91 and S92 are respectively disposed between ground (GND) and the column line C1 or C2. These current sources are capable of performing three pattern operations. Taking the bidirectional current source S91 as example, if a control signal C91 is positive "+", current is passed to the column memory line C1 toward the right viewing the drawing, and toward the left when the control signal C91 is negative "−". If the control signal C91 is neither positive "+" nor negative "−", the bidirectional current source S91 does not operate and remains the standby state.

Referring next to FIG. 47, the operation of the MRAM memory cell array will be described.

Based on a signal RR1, the current source 593 passes a medium level current and a threshold level current to the memory line R91. In the memory line R91, current passes in one direction alone.

The term "threshold level current" means the magnitude of current that causes a magnetic field needed in reversing the magnetization direction of a ferromagnetic material. The term "medium level current" means the magnitude of current to such an extent that the magnetization direction of a ferromagnetic material is not reversed.

The MOS transistors Q91 and Q92 receive read/write control signals R/W, and function as a switch supplying a reference voltage $V_{ref}$ to the column bit lines C1 and C2, according to the control signal R/W.

In case of reading information of the magnetic tunnel resistive element MR91, a control signal is first supplied to the MOS transistor Q1, so that the MOS transistor Q91 is on and the reference voltage $V_{ref}$ is supplied to the column bit line C1.

Subsequently, the MOS transistor Q93 is on and current passes through the magnetic tunnel resistive element. Since other MOS transistors are in the off state, the current passing through the magnetic tunnel resistive element MR1 is passed to the node N1. The current value of the magnetic tunnel resistive element MR1 is determined by the information retained in the magnetic tunnel resistive element MR1, that is, the tunnel magnetic resistance value.

The current passing through the node N1 is amplified by a buffer B91 and outputted as an output current $I_{out}$, and then sensed with current or voltage by a sense amplifier (not shown). As the result, it is judged whether the information retained in the magnetic tunnel resistive element MR1 is 0 or 1.

In case of writing data to the magnetic tunnel resistive element MR91, the control signal C91 and signal RR1 are on, and current passes through the column bit line C1 and memory line R91.

Information (0 or 1) to be written on the magnetic tunnel resistive element MR91 is determined by the direction of current Ic1 passing through the column bit line C1. The current Ic1 direction is controlled by the control signal C91 supplied to the bidirectional current source S91.

The current Ic1 supplied from the bidirectional current source S91 and the current IR1 supplied from the current source S93 generate an alternating magnetic field in the vicinity of the magnetic tunnel resistive element MR91, thereby determining the magnetization vector direction of the ferromagnetic material that constitutes the element MR91.

The foregoing read and write operations are also performed in the magnetic tunnel resistive elements MR92 to MR94.

In the above-mentioned conventional MRAM, it is impossible to read concurrently information of memory cells at different addresses that are not connected to the same bit line.

SUMMARY OF THE INVENTION

It is an object of the present invention to solve the above problem by providing a MRAM capable of reading at any timing information of memory cells at different addresses that are connected to the same bit line.

According to the present invention, a magnetic memory device includes a memory cell array made by disposing in a matrix plural memory cells each having at least plural bit lines, plural word lines, and a magnetic tunnel junction element.

The memory cells have a first current path that is electrically connected to a pair of first and second bit lines and functions as at least a current path for information reading to the magnetic tunnel junction element. The first current path has first and second switch elements disposed in the first current path. The first switch element controls electrical connection/non-connection between the first bit line and the magnetic tunnel junction element, and the second switch element controls electrical connection/non-connection between the second bit line and the magnetic tunnel junction element.

In this configuration, the first and second switch elements are disposed in the first current path that is electrically connected to the first and second bit lines and functions as at least a current path for information reading to the magnetic tunnel junction element. Therefore, when reading information of the magnetic tunnel junction element, the information can be read at independent timings from memory cells at different addresses sharing the bit line, by controlling such that the first and second switch elements are selectively on.

These and other objects, features, aspects and advantages of the present invention will become more apparent from the following detailed description of the present invention when taken in conjunction with the accompanying drawings.

BRIEF DESCRIPTION OF THE DRAWINGS

FIG. 39 is a schematic diagram for explaining magnetic tunnel junction;

FIGS. 40 and 41 are conceptual diagrams for explaining tunnel magnetic resistance effect;

DESCRIPTION OF THE PREFERRED EMBODIMENTS

Magnetic Tunnel Resistive Element

Prior to the description of preferred embodiments of the present invention, the structure and operation of a general magnetic tunnel resistive element will be described in more detail with reference to FIGS. 1 to 3. In the following description of the preferred embodiments, instead of the term "magnetic tunnel resistive element," the term "magnetic tunnel junction element" will be used sometimes in the sense of having at least one magnetic tunnel junction.

Figure 1:
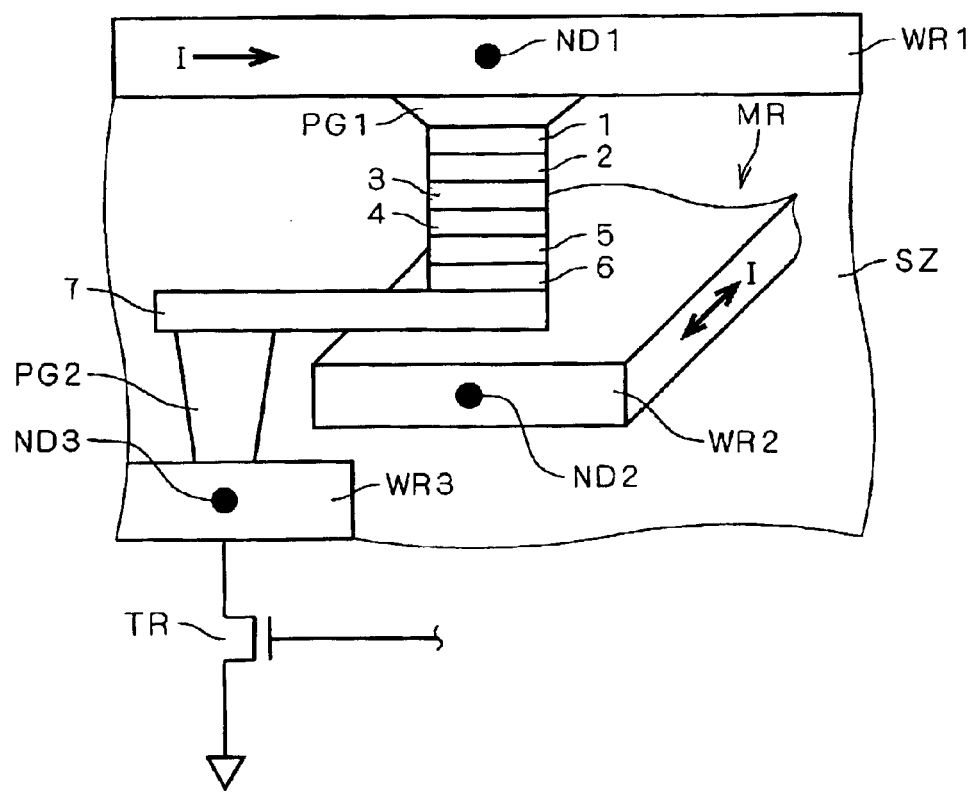
FIG. 1 is a diagram schematically showing a sectional structure of a general magnetic tunnel resistive element.

FIG. 1 is a diagram schematically showing a sectional structure of a magnetic tunnel resistive element disclosed in U.S. Pat. No. 5,940,319 entitled "Magnetic Random Access Memory and Fabricating Method Thereof" and U.S. Pat. No. 5,732,016 entitled "Memory Cell Structure in a Magnetic Random Access Memory and a Method For Fabricating Thereof."

In the magnetic tunnel resistive element MR shown in FIG. 1, a magnetic tunnel junction (MTJ) is made by stacking ferromagnetic layers 2 and 1 in this order on top of an insulator layer 3, and disposing a ferromagnetic layer 4 under the insulator layer 3.

Disposed under the ferromagnetic layer 4 is an antiferromagnetic layer 5 for fixing the magnetization direction of the ferromagnetic layer 4. This structure is called "spin valve magnetic tunnel junction."

Of the ferromagnetic layers 1 and 2, the ferromagnetic layer 1 is made of a material having a smaller coercivity so that the magnetization direction of the layer 1 is liable to rotate by the external magnetic field. As the result, the magnetization direction of the ferromagnetic layer 2 is reversed in response to that of the ferromagnetic layer 1.

The magnetic tunnel resistive element MR is buried in an interlayer insulating film SZ. A wiring plug PG1 is disposed on the ferromagnetic layer 1, and the upper end surface of the wiring plug PG 1 is exposed in a main surface of the interlayer insulating film SZ. A wiring WR1 is disposed on the interlayer insulating film SZ so as to make contact with the upper end surface of the wring plug PG 1.

Disposed under the antiferromagnetic layer 5 is a metal layer 6 that is connected to a metal layer 7. Disposed under the metal layer 7 is a wiring WR2, the extension direction of which is orthogonal to the extension direction of the wiring WR1 when viewed from above. The wiring WR2 is electrically separated from the metal layer 7.

Disposed under the wiring WR2 is a wiring WR3. The metal layer 7 is electrically connected to the wiring WR3 via a wiring plug PG 2 extending vertically within the interlayer insulating film SZ. The wiring WR3 is electrically connected to a N-channel MOS transistor TR.

Referring to FIG. 1, a connection node between the wiring WR1 and wiring plug PG1 is denoted by "node ND1," a connection node between the wiring WR1 and metal layer 7 is denoted by "node ND2," and a connection node between the wiring WR3 and wiring plug PG2 is denoted by "node ND3."

In this configuration, when current is passed from the wiring WR1 to the wiring WR3, the current passing through the insulator layer 3 will vary depending on whether the magnetization directions of the ferromagnetic layers 1 and 2 are the same as or different from that of the ferromagnetic layer 3.

Specifically, resistance is low for the same magnetization direction whereas resistance is high for different magnetization directions. Magnetic tunnel junction has therefore two tunnel magnetic resistances (TMR) depending on the magnetization direction of the ferromagnetic layer. This is called "tunnel magnetic resistance effect."

Tunnel magnetic resistance rate (TMRR) is about 30% to about 50%. The tunnel magnetic resistance value also varies depending on the physical properties and thickness of the interlayer insulator layer sandwiched between the ferromagnetic layers, in addition to the magnetic field direction of the ferromagnetic material. Even when the stacked structure starting at the ferromagnetic layer 1 to the antiferromagnetic layer 5 is made upside down, the same effect is obtainable.

In order to change the tunnel magnetic resistance, for example, the magnetization directions of the ferromagnetic layers 1 and 2 may be changed. For this, current may be passed through the wiring WR2 such that a magnetic field generated therearound is larger than a critical magnetic field necessary for changing the magnetization direction. At this time, the ferromagnetic layer 4 is also affected by the same magnetic field. However, by the presence of the antiferromagnetic layer 5, a magnetic flux ejected from the ferromagnetic layer 4 enters the antiferromagnetic layer 5, and the magnetization direction of the ferromagnetic layer 4 remains unchanged. Although in FIG. 1, the current I passing through the wiring WR2 has bidirections as indicated by the arrows, this means that the current can be passed in either direction.

The layers 1 to 5 are made of the following materials. That is, IrMn containing a 20 to 30 atom. % of iridium is used for the antiferromagnetic layer 5; CoFe having a large coercivity is used for the ferromagnetic layers 4 and 2; $Al_2O_3$ is used for the insulator layer 3 serving as a tunnel barrier layer; and $Ni_{80}Fe_{20}$ (permalloy) that has a small coercivity and small spin polarizability is used for the ferromagnetic layer 1.

Figure 2:
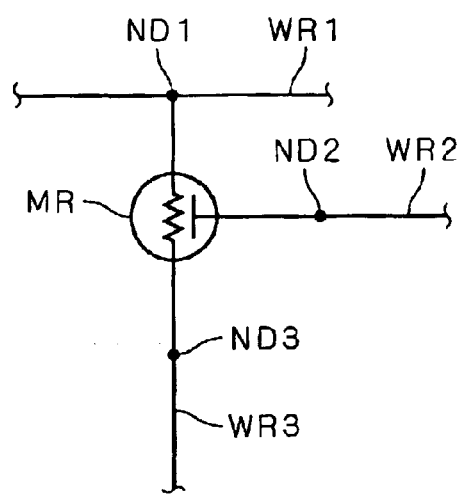
FIG. 2 is a diagram for explaining symbol expression of a magnetic tunnel resistive element.

FIG. 2 shows symbols implying a tunnel magnetic resistive element MR, wherein MR is abbreviation of magnetic resistivity.

The symbols of FIG. 2 denote such a resistive element that the resistance between nodes ND1 and ND3 varies depending on the magnetic field generated when current is passed through the wiring WR2. Accordingly, the symbols of FIG. 2 can cover all the tunnel magnetic resistive elements having this characteristic feature, instead of being restricted to the structure shown in FIG. 1.

Figure 3:
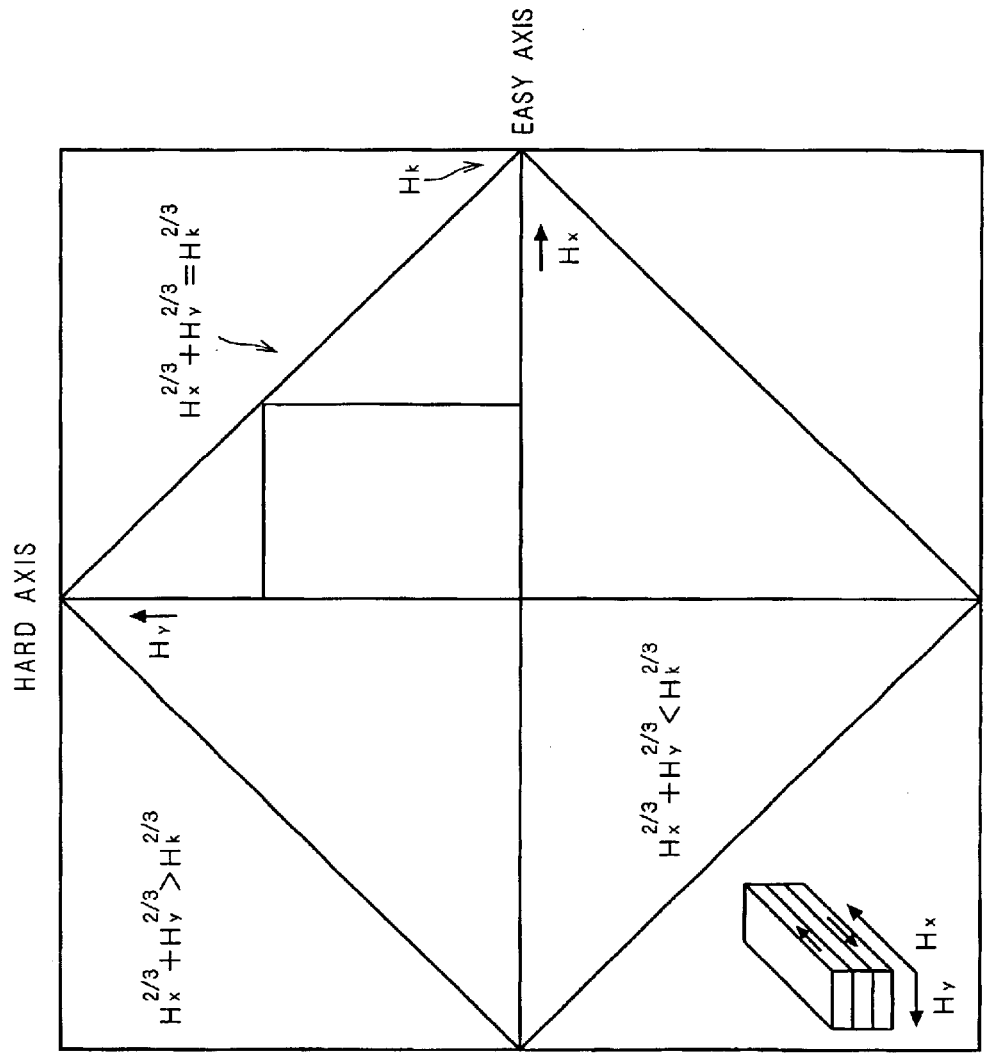
FIG. 3 is a diagram showing the magnitude and direction of a magnetic field necessary for changing the magnetization direction of a ferromagnetic material.

FIG. 3 shows the magnitude and direction of a magnetic field necessary for changing the magnetization direction of a ferromagnetic material. That is, FIG. 3 shows the relationship among three magnetic fields Hk, Hz, and Hy, when the magnetic field necessary for reversing the magnetization direction (critical magnetic field) Hk is generated by a coupled magnetic field of the magnetic fields Hz and Hy.

Hereat, a direction in which it is easy to produce magnetization of a ferromagnetic material is referred to as an "easy axis" whereas a direction in which it is hard to produce magnetization is referred to as an "hard axis." FIG. 3 lies off the easy axis as abscissa and the hard axis as ordinate, wherein "Hx" and "Hy" denote the magnetic field components in the x-axis and y-axis directions, respectively.

Referring to FIG. 3, the magnetization direction remains unchanged in the range of Hx+Hy<Hk. On the other hand, the magnetization direction will change in the range of Hx+Hy>Hk. These magnetic fields are obtained by passing current through an electroconductive wiring.

In the following description, current generating a magnetic field necessary for reversing the magnetic direction of a ferromagnetic material is hereinafter referred to as "threshold level current," and current of such an extent that the magnetization direction of a ferromagnetic material is not reversed is hereinafter referred to as "medium level current."

Concept of Dual Port MRAM

Figure 45:
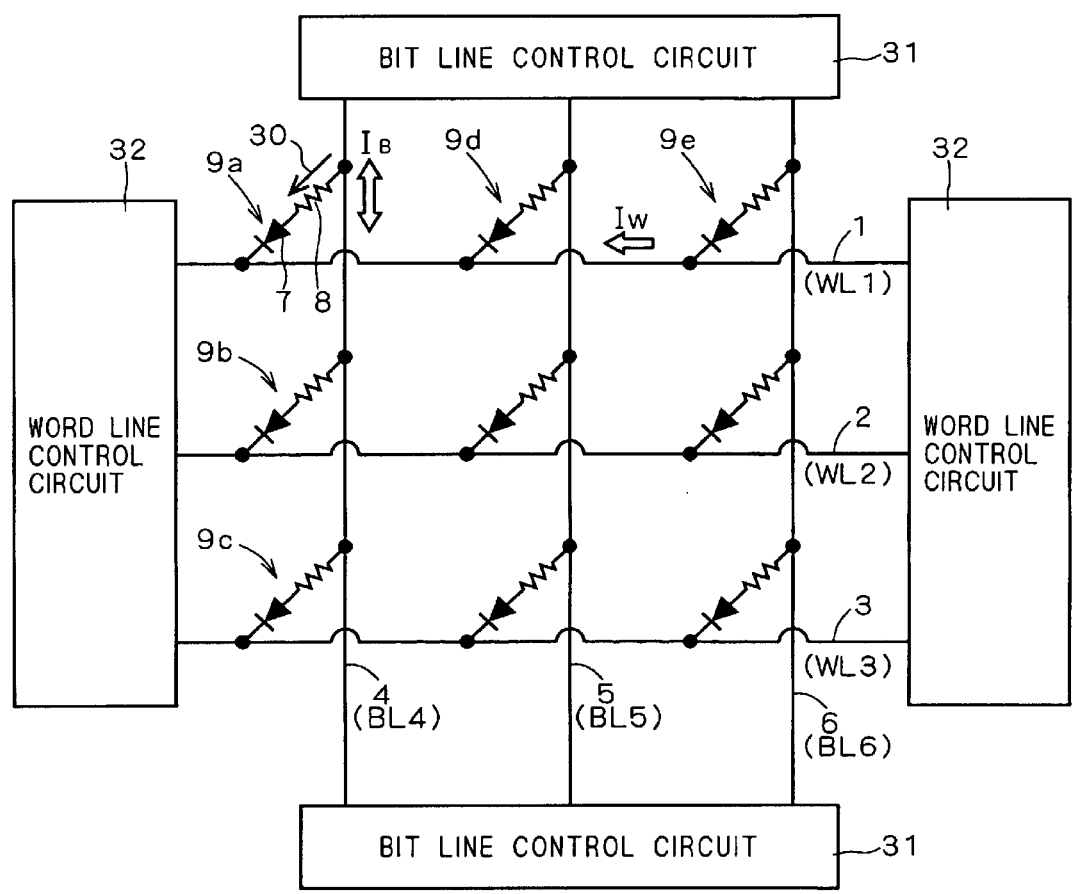
FIG. 45 is an equivalent circuit diagram of the conventional MRAM cell array.
Figure 46:
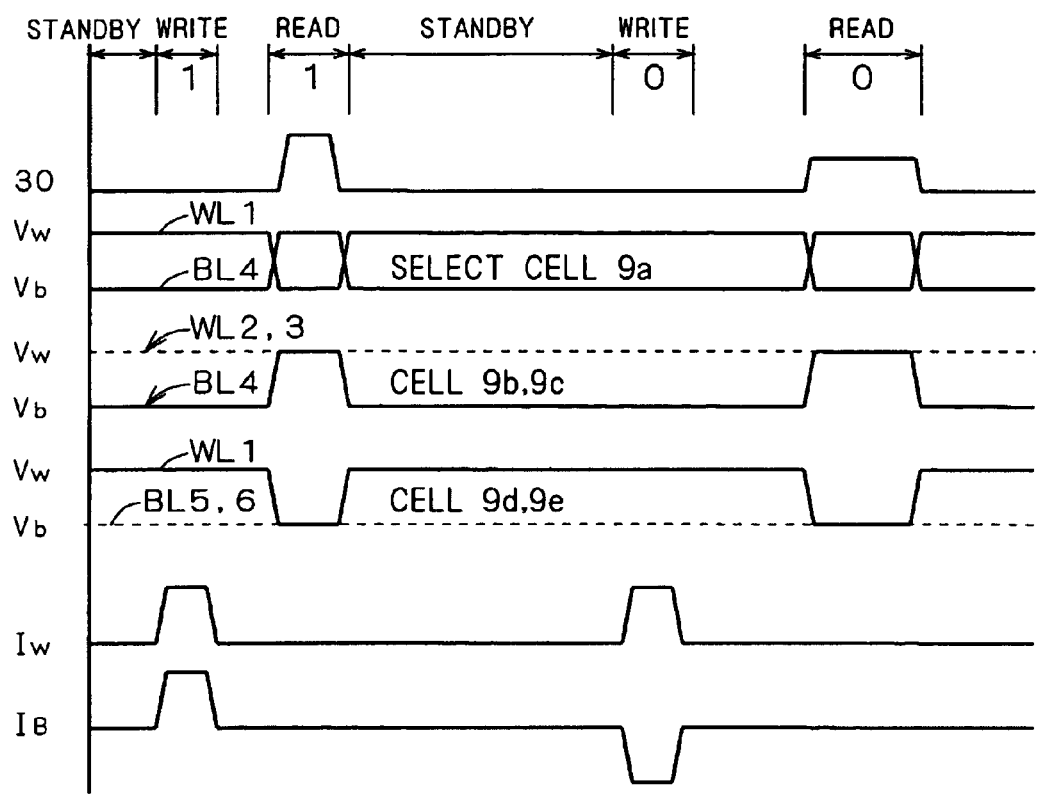
FIG. 46 is a timing chart illustrating the operation of the conventional MRAM cell array.
Figure 47:
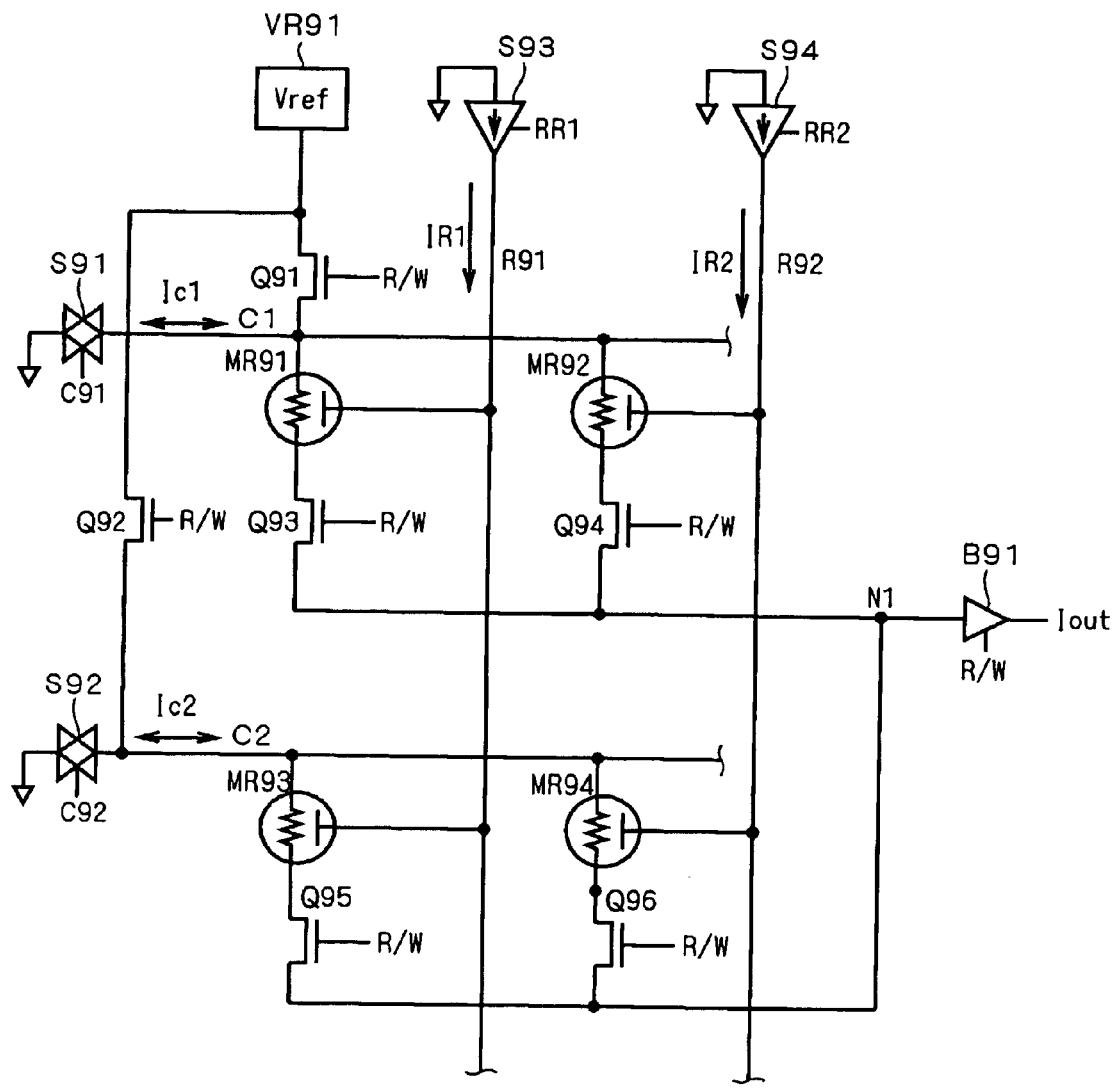
FIG. 47 is a circuit diagram showing the configuration of the conventional MRAM cell array.

The MRAM stores binary information in the memory cells composed of magnetic tunnel resistive elements, as described above. Whereas the MRAM described with reference to FIG. 45 and the MRAM with reference to FIG. 47 are provided with a single path for reading/writing binary information into the memory cells. Therefore, these MRAMs are called "single port MRAM."

On the contrary, in a multi port MRAM that is represented by dual port MRAM, each memory cell has a plurality of paths for reading or writing, and binary information can be read or written independently and asynchronously.

Figure 4:
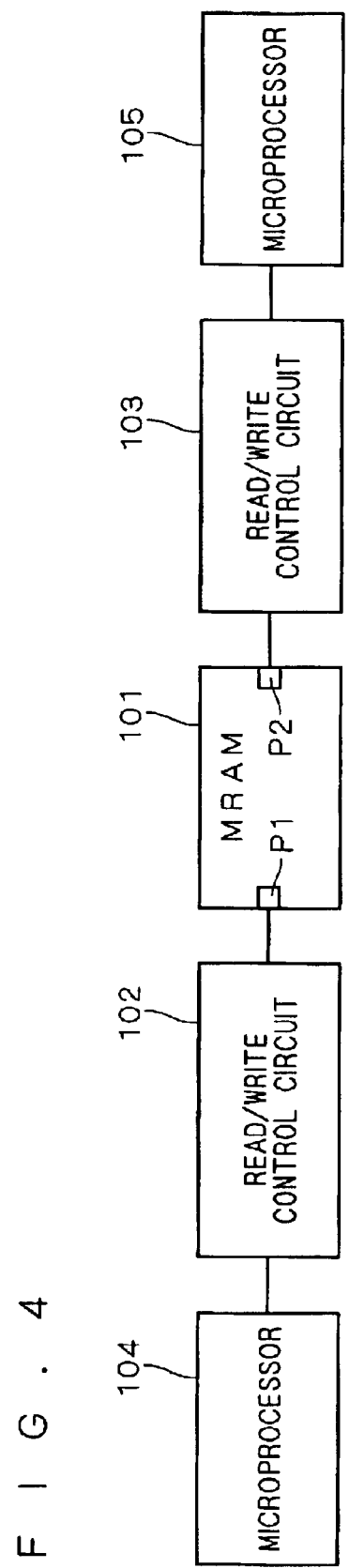
FIG. 4 is a block diagram showing a conceptual configuration of a dual port MRAM.

FIG. 4 is a block diagram showing a conceptual configuration of a dual port MRAM having independent read/write control circuits.

Referring to FIG. 4, a MRAM 101 has two ports P1 and P2. A read/write control circuit 102 is connected to the port P1, and a read/write control circuit 103 is connected to the port P2. Microprocessors 104 and 105 are connected to the read/write control circuits 102 and 103, so as to be accessible to the MRAM 101 via the read/write control circuits 102 and 103, respectively.

The read/write control circuits 102 and 103 operate independently and asynchronously to perform write/read operation of binary information with respect to any one of memory cells constituting the MRAM 101.

In the following preferred embodiments, description will be made taking a dual port MRAM as example.

A. First Preferred Embodiment

A-1. Device Configuration

A-1-1. Plan Configuration

Figure 5:
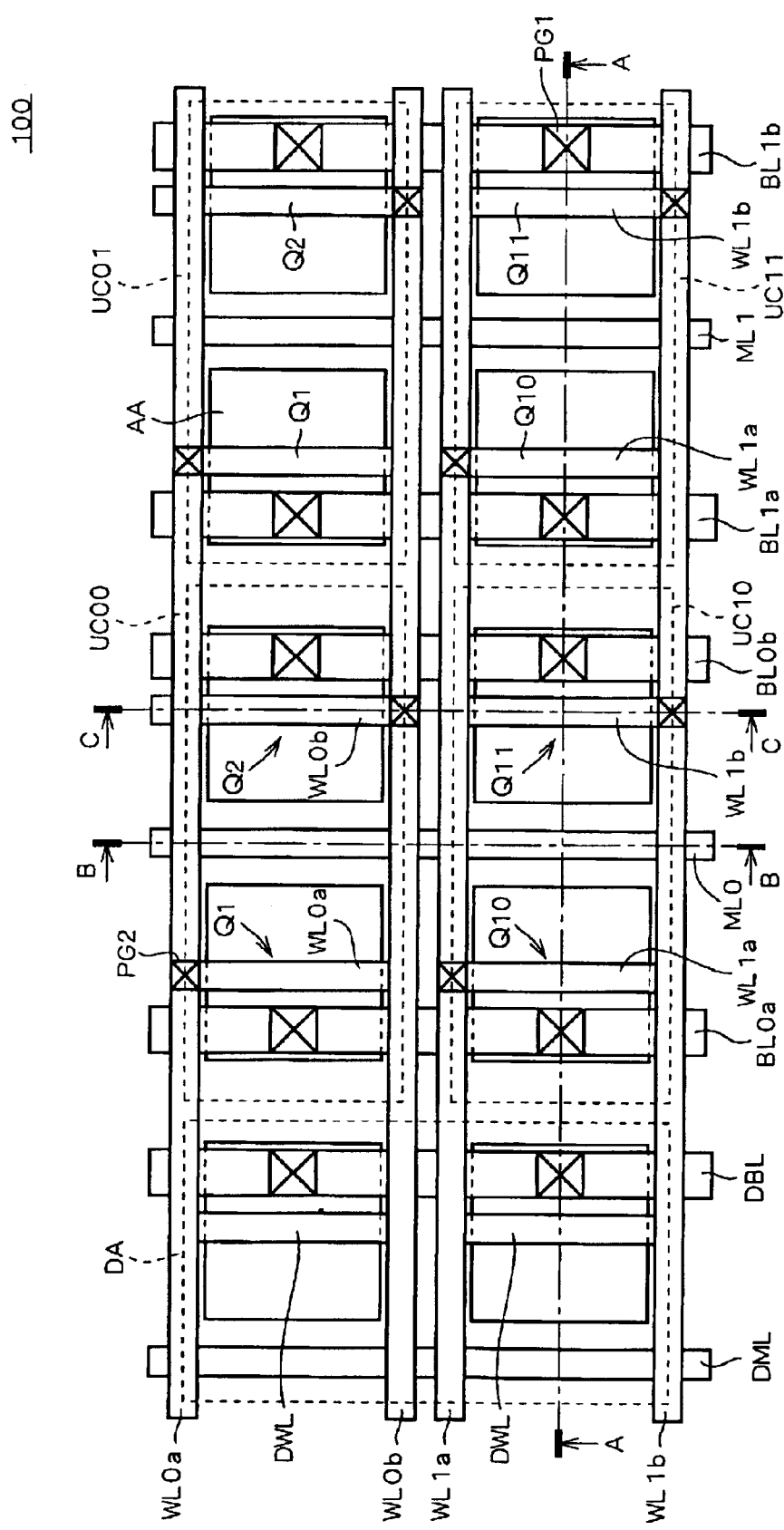
FIG. 5 is a diagram showing a plan layout of a MRAM according to a first preferred embodiment of the present invention.

FIG. 5 shows schematically a plan layout of a memory cell array part of a MRAM 100 according to a first preferred embodiment of the present invention.

In FIG. 5, there is shown four MRAM memory cells of a memory cell array, which are indicated by broken lines as unit cells UC00, UC10, UC01, and UC11, respectively.

Referring to FIG. 5, bit lines BL0a, BL0b, BL1a, BL1b, and a dummy bit line DBL are disposed in parallel, and word lines WL0a, WL0b, WL1a, and WL1b are disposed in parallel so as to be orthogonal to these bit lines when viewed from above.

In the center of a region surrounded by the bit lines BL0a and BL0b (i.e., in the center of the unit cell), a memory line ML0 is disposed parallel to the bit lines. In the center of a region surrounded by the bit lines BL1a and BL1b (i.e., in the center of the unit cell), a memory line ML1 is disposed parallel to the bit lines.

On an active region AA of the unit cells UC00 and UC01, gate electrodes of MOS transistors Q1 and Q2 are disposed parallel to the bit lines. On an active region AA of the unit cells UC10 and UC11, gate electrodes of MOS transistors Q10 and Q11 are disposed parallel to the bit lines.

The bit lines BL0a, BL0b, BL1a, and BL1b are electrically connected at their respective unit cells to the active region AA via contact plugs PG1.

Since the gate electrode of each MOS transistor Q1 is electrically connected to the word line WL0a via a contact plug PG2, this gate electrode may sometimes be referred to as a "word line WL0a." Since the gate electrode of each MOS transistor Q2 is electrically connected to the word line WL0b via the contact plug PG2, this gate electrode may sometimes be referred to as a "word line WL0b."

Since the gate electrode of each MOS transistor Q10 is electrically connected to the word line WL1a via the contact plug PG2, this gate electrode may sometimes be referred to as a "word line WL1a." Since the gate electrode of each MOS transistor Q11 is electrically connected to the word line WL1b via the contact plug PG2, this gate electrode may sometimes be referred to as a "word line WL1b."

A dummy region DA is disposed at the left end part as viewed in FIG. 5. In the dummy region DA, a dummy bit line DBL, dummy word line (dummy gate electrode) DWL, and dummy memory line DML (a dummy magnetic tunnel resistive element DMR is disposed therebelow) are disposed in the same arrangement as the memory cell region. The dummy bit line DBL is electrically connected to the active region AA via the contact plug PG1.

The word lines and bit lines have a pattern by which these lines are disposed repetitively at the same pitch. In the step of resist transfer of such a repeated pattern, an optical standing wave occurs along the pitch of this pattern. However, at the layout end part corresponding to the end of the repeated pattern, the repeatability of the repeated pattern is disturbed to cause a standing wave of different pitch. The resulting resist pattern size at the layout end part might deviate from the designed value.

After the resist is patterned in a transfer step, plasma is generated when trenches for burying the word lines and bit lines are formed in an interlayer insulating film by anisotropic etching using this patterned resist. The plasma density has repeatability along the above-mentioned repeated pattern pitch. Therefore, when the repeatability of the repeated pattern is disturbed at the layout end part, the plasma density will vary over different portions of the layout, so that the trenches to be formed by the etching might have different widths or depths.

The dummy region DA is provided for solving the above problem. This enables to maintain the repeated pattern of the word lines (memory lines), bit lines, and magnetic tunnel resistive elements even at the layout end part, thereby to suppress the finish size from being deviating from the designed value.

A-1-2. Sectional Configuration

Figure 6:
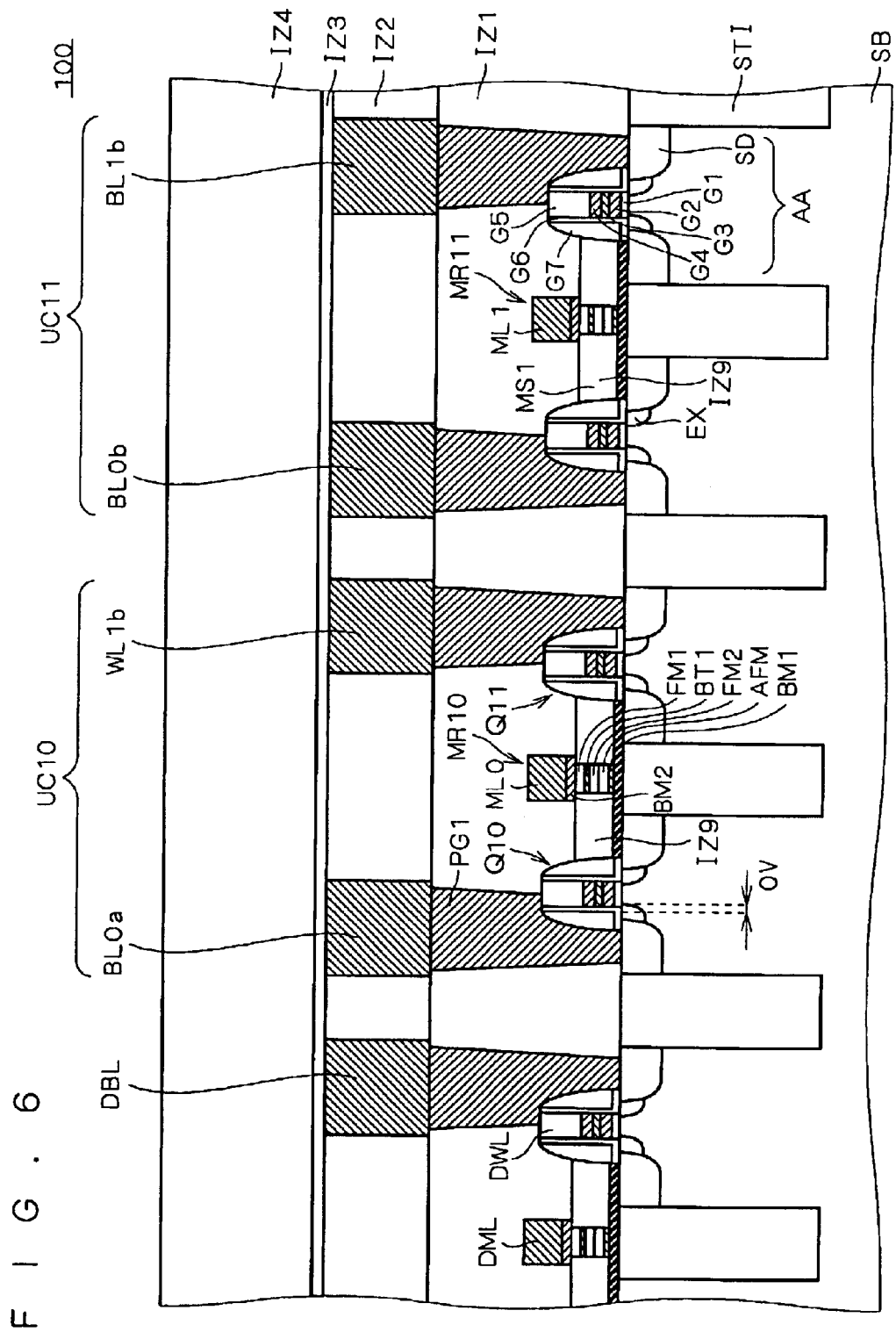
FIG. 6 is a sectional view of the MRAM configuration in the first preferred embodiment.

FIG. 6 shows the configuration of a section taken along line A—A in FIG. 5, looking in the direction of the appended arrows.

In FIG. 6, a MRAM 100 is disposed on a silicon substrate SB, and an active region AA is defined by an element isolation insulating film STI disposed in the surface of the silicon substrate SB. The element isolation insulating film STI is formed by burying an insulator film such as an oxide silicon film in a shallow trench disposed in the surface of the silicon substrate SB. This film STI is called "shallow trench isolation."

Referring to FIG. 6, a unit cell UC10 has two MOS transistors Q10 and Q11, as well as a single magnetic tunnel resistive element MR10 (magnetic tunnel junction element). This is true for other unit cells.

The MOS transistors Q10 and Q11 have the same structure in which a polymetal gate electrode is disposed on a gate insulating film G1 that is selectively formed on the silicon substrate SB. The gate insulating film G1 consists of three layers: a doped polysilicon layer G2 whose resistance is low with impurity content; a barrier metal layer G3; and a metal layer G4. Disposed on the metal layer G4 is a nitride silicon film G5.

With respect to the polysilicon layer G2, phosphorous is doped for a surface channel N-channel MOS transistor whereas boron is doped for a surface P-channel MOS transistor.

An offset insulating film G6 is disposed on the side surfaces of these multiplayer films. As the offset insulating film G6, there is used an insulator film whose dielectric constant is lower than that of a sidewall insulating film G7 to be disposed outside of the offset insulating film G6.

For instance, when a nitride silicon film is used as the sidewall insulating film G7, its relative dielectric constant is 7.4 to 9. On the other hand, an oxide silicon film having a relative dielectric constant of 3.9, or a SiOC film having a relative dielectric constant of 2.8 to 2.9 is used as the offset insulating film G6.

It is noted that SiC (4.8 in relative dielectric constant) or SiOC can be used as the sidewall insulating film G7. Dielectric constant can be obtained by multiplying relative dielectric constant by dielectric constant under vacuum.

In place of the above-mentioned polymetal gate electrode, a metal gate electrode having no doped polysilicon layer G2 may be used. That is, the barrier metal layer G3 can be disposed directly on the gate insulating film G1. The metal gate electrode can provide a lower resistance than the polymetal gate electrode, thereby increasing circuit operating speed.

The purpose of the offset insulating film G6 is to reduce the parasitic capacity between the gate electrode and the contact plug PG1 in contact with the gate electrode, and to reduce the overlap capacity between the gate electrode and a source/drain extension layer EX to be disposed in the surface of an active region AA.

The source/drain extension layer EX is an impurity layer provided for making a shallower junction than a source/drain layer SD. The extension layer EX has the same conductivity type as the source/drain layer SD, and functions as a source/drain layer.

The source/drain extension layer EX is formed by ion implantation etc., after the offset insulting film is formed.

Therefore, an area OV where the source/drain extension layer EX is overlapped with the gate electrode is reduced by the amount of the offset insulating film thickness, thereby reducing the overlap capacity.

Reducing the parasitic capacity between the gate electrode and the contact plug PG1 and reducing the overlap capacity between the gate electrode and source/drain extension layer EX can increase circuit operating speed. The structure of FIG. 6 can increase particularly information read into the bit lines and information write from the bit lines.

A metal silicide layer MS1 is disposed between the MOS transistors Q10 and Q11. The metal silicide layer MS1 is formed so as to cover not only the top of the active region AA but also the top of the element isolation insulating film STI. A magnetic tunnel resistive element MR10 is disposed on top of the metal silicide layer MS1 that corresponds to the top of the element isolation insulating film STI.

The magnetic tunnel resistive element MR10 is surrounded by an interlayer insulating film IZ9 overlying the metal silicide layer MS1. Only the end surface of the uppermost part of the magnetic tunnel resistive element MR10 is exposed on the surface of the interlayer insulating film IZ9. A barrier metal layer BM2 is disposed to cover the exposed part, and a metal wiring memory line ML0 is disposed on the barrier metal layer BM2.

The magnetic tunnel resistive element MR10 is disposed via a barrier metal layer BM1 overlying the metal silicide layer MS1. An antiferromagnetic layer AFM, ferromagnetic layer FM2, insulator layer BT1, and ferromagnetic layer FM1 are stacked in this order on the barrier metal layer BM1. An upper part of the ferromagnetic layer FM1 is covered with the barrier metal BM2 so as to make contact with the memory line ML0.

The easy axis directions of the ferromagnetic layers FM1 and FM2 may be approximately parallel to the memory line ML1, or may be approximately vertical to the memory line ML1. Stacking the antiferromagnetic layer AFM and ferromagnetic layer FM1 fixes the magnetization vector of the ferromagnetic layer FM2.

The metal silicide layer MS1 can be formed by any one of $CoSi_2$, $NiSi_2$, $TiSi_2$, $WSi_2$, $PtSi_2$, and $ZrSi_2$. This layer functions to electrically contact the antiferromagnetic layer AFM and the source/drain layer SD in the surface of the active region AA.

The metal silicide layer MS1 can be formed in the following manner. After a polysilicon layer or amorphous silicon layer is formed at the corresponding region, a metal layer is deposited thereon. Then, a thermal treatment such as RTA (rapid thermal anneal) etc. is performed to undergo silicide reaction between the metal and polysilicon (or amorphous silicon).

For instance, $CoSi_2$ can be formed by the following steps: a thermal treatment at 450 to 600° C. as a first RTA; and a thermal treatment at 700 to 850° C. as a second RTA, thereby to undergo silicide reaction between cobalt and polysilicon (or amorphous silicon).

Meanwhile, a temperature at which a ferromagnetic layer loses magnetization is called "Curie temperature." Since most ferromagnetic layers° Curie temperatures are lower than these RTAs' temperatures, it is desirable that the magnetic tunnel resistive element be formed after the metal silicide layer is formed on the source/drain layer of the transistor.

A side of the source/drain layer opposite the metal silicide layer MS1 in the MOS transistors Q10 and Q11 is electrically connected to the bit lines BL0a and BL0b via the contact plug PG1 made of an electroconductive material.

The contact plug PG1 is formed by filling doped polysilicon or tungsten etc. in a contact hole extending through the interlayer insulating film IZ1.

Although the foregoing description is directed to the unit cell UC10 configuration, other unit cells have the same configuration.

The bit lines BL0a, BL0b, BL1a, and BL1b (a first-layer metal layer) are disposed in the interlayer insulating film IZ1 overlying the interlayer insulating film IZ1. Interlayer insulating films IZ3 and IZ4 stack in this order on the interlayer insulating film IZ2. The configuration of layers above the interlayer insulating film IZ4 is omitted in FIG. 6.

Figure 7:
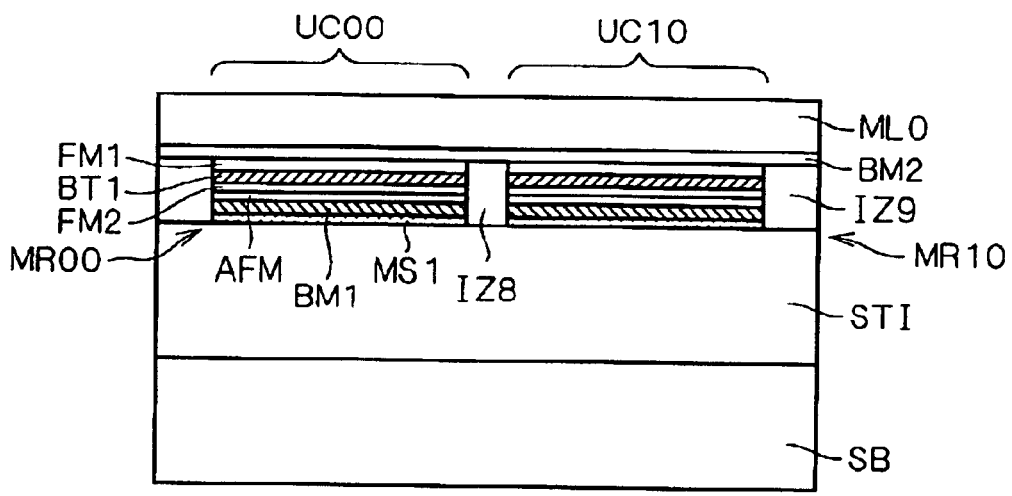
FIG. 7 is a sectional view of the configuration of a magnetic tunnel resistive element of the MRAM in the first preferred embodiment.

FIG. 7 shows the configuration of a section taken along line B—B in FIG. 5, looking in the direction of the appended arrows.

That is, FIG. 7 shows a cross section in the longitudinal direction of the memory line ML0 extending across the unit cells UC10 and UC00 and the underlying magnetic tunnel resistive elements MR10 and MR00. An antiferromagnetic layer AFM, ferromagnetic layer FM2, insulator layer BT1, and ferromagnetic layer FM1 stack in this order on the barrier metal layer BM1 overlying the metal silicide layer MS1, thereby obtaining the magnetic tunnel resistive elements MR10 and MR00.

A barrier metal layer BM2 is disposed on the magnetic tunnel resistive elements MR10 and MR00, and a memory line ML0 is disposed on the barrier metal layer BM2. The reason why the barrier metal layer BM2 is sandwiched between the memory line ML0 and the magnetic tunnel resistive element MR10 or MR00 is to avoid mutual diffusion of atoms constituting the memory line ML0 and magnetic tunnel resistive element MR10 and MR00.

The magnetic tunnel resistive elements MR10 and MR00 are electrically separated by the unit cells UC10 and UC00. An interlayer insulting film IZ8 is disposed between the magnetic tunnel resistive element MR10 of the unit cell UC10 and the magnetic tunnel resistive element MR00 of the unit cell UC00.

Figure 8:
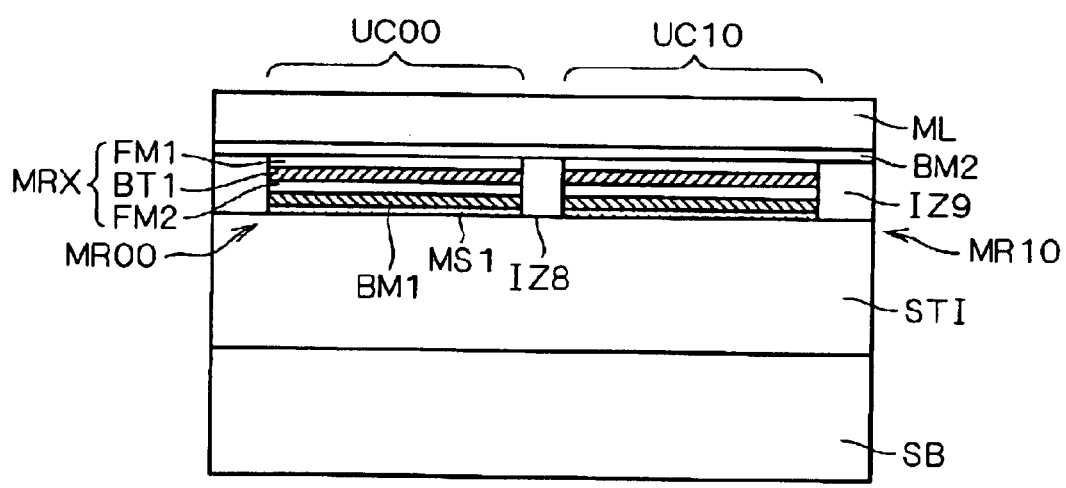
FIG. 8 is a sectional view of the configuration of a modified magnetic tunnel resistive element in the first preferred embodiment.

FIG. 8 shows a sectional configuration of a magnetic tunnel resistive element MRX having no antiferromagnetic layer AFM, as a modification of the magnetic tunnel resistive element.

Referring to FIG. 8, the magnetic tunnel resistive element MRX is formed by stacking a ferromagnetic layer FM2, insulator layer BT1, and ferromagnetic layer FM1 in this order on a barrier metal layer BM1 overlying a metal silicide layer MS1. Omitting an antiferromagnetic layer can reduce the manufacturing cost.

Figure 9:
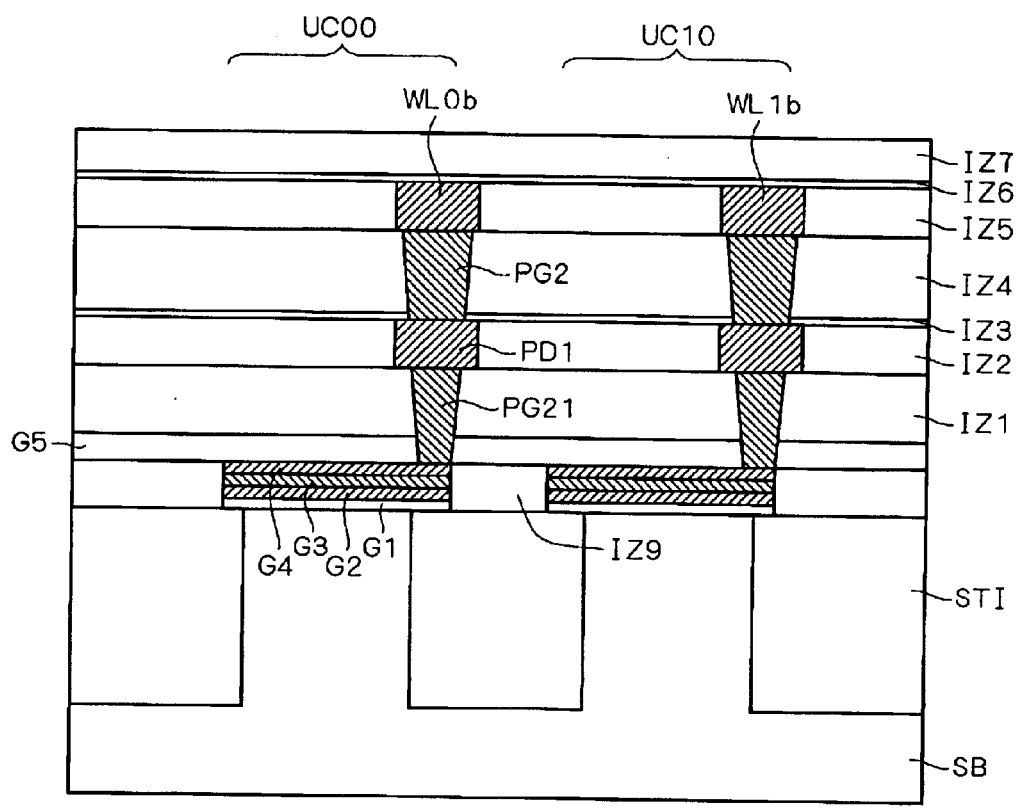
FIG. 9 is another sectional view of the MRAM configuration in the first preferred embodiment.

FIG. 9 shows the configuration of a section taken along line C—C in FIG. 5, looking in the direction of the appended arrows.

That is, FIG. 9 shows a sectional configuration in the longitudinal direction of the gate electrodes of MOS transistors Q11 and Q2 in unit cells UC10 and UC00, respectively (These may sometimes be referred to as "word lines WL1b and WL0b.").

Referring to FIG. 9, the respective gate electrodes are independent electrically per unit cell. An interlayer insulating film IZ9 is disposed between the adjacent gate electrodes.

The respective gate electrodes are brought into contact with the word lines WL0b and WL1b via contact plugs PG21 and PG2, respectively, on an element isolation insulating film STI. More specifically, one end of the contact plug PG21 extends through an interlayer insulating film IZ1 and a nitride silicon film G5 to a metal layer G4 of each gate electrode, and the other end is connected to a pad layer PD1 in an interlayer insulating film IZ2. Like the respective bit lines, the pad layer PD1 is also the first-layer metal layer and disposed in order to ensure an alignment margin.

One end of the contact plug PG2 extends through interlayer insulating films IZ5 and IZ4 to each pad layer PD1, and the other end is connected to the word lines WL0b and WL1b in the interlayer insulating film IZ5. Interlayer insulating films IZ6 and IZ7 are disposed in this order on the interlayer insulating film IZ5.

The surfaces of the contact plugs PG2, PG21, each pad layer PD1, and word lines WL0b, WL1b are covered with a barrier metal. The purpose of this barrier metal is to avoid thermal diffusion of metal atoms constituting the respective layers into the surrounding insulator film.

Following is examples of the material of the interlayer insulating films IZ1 to IZ9. The interlayer insulating films IZ1, IZ2, IZ5, and IZ7 are composed of SiOC that is low in dielectric constant (low-k). The interlayer insulating films IZ3, IZ4, and IZ6 are composed of SiC. The interlayer insulating films IZ8 and IZ9 are composed of NSG (non-doped silicate glass) or TEOS (tetraethyl orthosilicate) etc. The interlayer insulating films IZ8 and IZ9 may be composed of SiOC, SiOF or the like that are low-k material.

The reason why SiC is employed as the interlayer insulating film of the upper part of the metal layer, such as the interlayer insulating films IZ3 and IZ6, is to avoid oxidation of the metal layer. Any insulative material capable of avoiding the metal layer oxidation can be used. However, an insulative material having a smaller dielectric constant is preferable in consideration of the parasitic capacity of the metal wiring.

As the material of the metal wiring layer, pad layer, and contact plug, there can be used copper, aluminum, aluminum silicon, aluminum-silicon-copper alloy, silver, gold, molybdenum, and tungsten etc.

Although the foregoing description is directed to the configuration that the MRAM 100 is disposed on the bulk silicon substrate SB, a SOI (silicon on insulator) substrate or SON (silicon on nothing) substrate may be used instead of the bulk silicon substrate SB. This is true for the following preferred embodiments that will be discussed below.

In the meantime, the term "SON substrate" means such a substrate that cavities are disposed in a silicon layer underlying a region for forming a semiconductor element. In an alternative, the cavities are filled with hydrogen, air, argon, or nitrogen.

A-2. Operation

The operation of the MRAM 100 will be described with reference to FIGS. 10 and 11.

Figure 10:
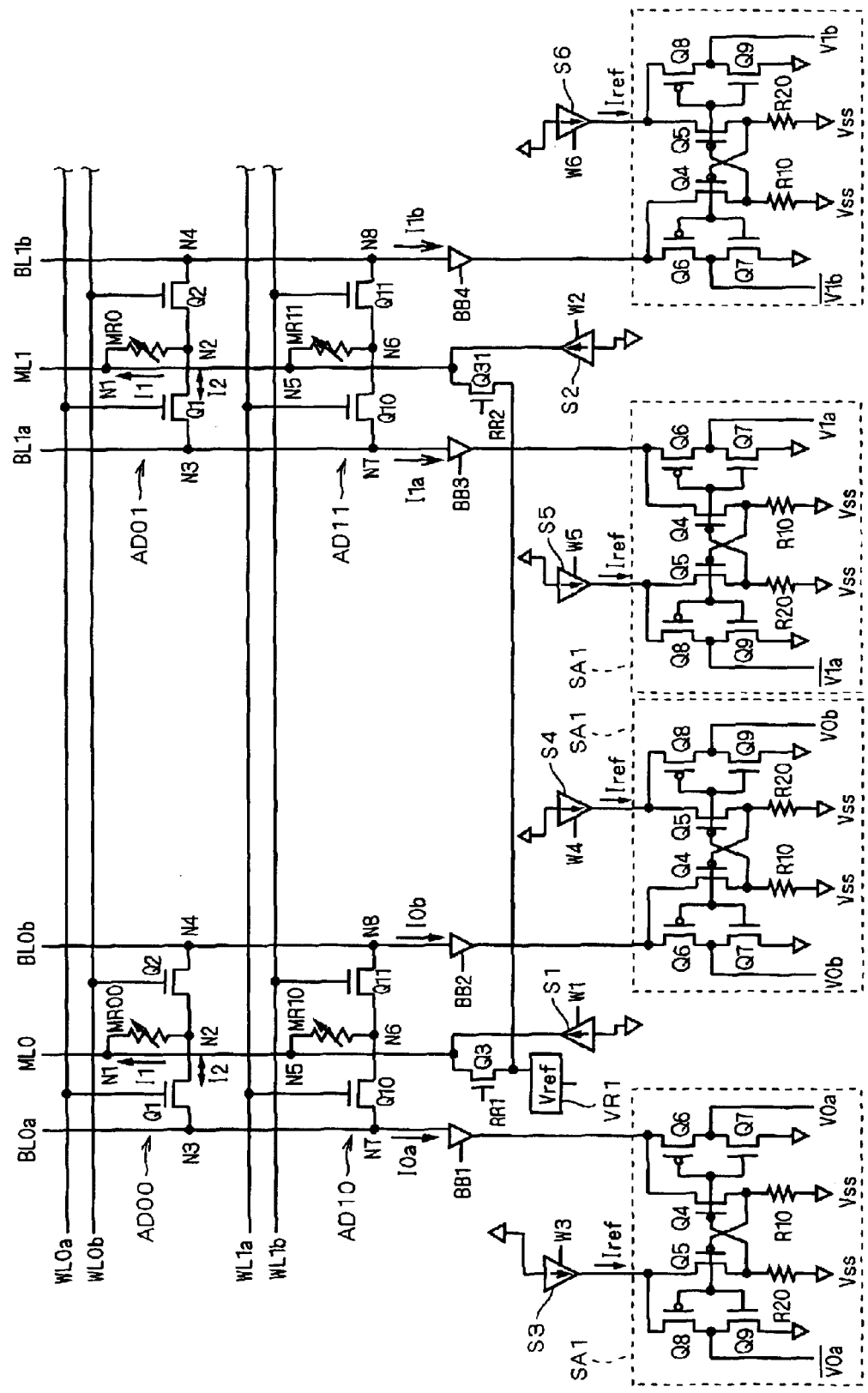
FIG. 10 is a diagram showing a circuit configuration of the MRAM in the first preferred embodiment.

FIG. 10 is a circuit diagram of the MRAM 100, which shows the configuration corresponding to the parts of the unit cells UC00, UC10, UC01, and UC11 of FIG. 5, with other memory cells omitted.

In the following, a configuration corresponding to the unit cells UC00, UC10, UC01, and UC11 are denoted as memory cells of addresses AD00, AD10, AD01, and AD11. In FIG. 10, magnetic resistive elements are indicated by variable resistance symbol.

Referring to FIG. 10, in the memory cell of the address AD00, MOS transistors Q1 and Q2 connected in series and a magnetic tunnel resistive element MR00 are disposed between bit lines BL0a and BL0b. The gate electrodes of the MOS transistors Q1 and Q2 are connected to word lines WL0a and WL0b, respectively.

The magnetic tunnel resistive element MR00 is connected between a memory line ML0 and a connection node of the MOS transistors Q1 and Q2. The connection node between the magnetic tunnel resistive element MR00 and memory line ML0 is called "node N1"; the connection node between the MOS transistors Q1 and Q2 is called "node N2"; the connection node between the MOS transistor Q1 and bit line BL0a is called "node N3"; and the connection node between the MOS transistor Q2 and bit line BL0b is called "node N4."

In the memory cell of the address AD01, MOS transistors Q1 and Q2 connected in series and a magnetic tunnel resistive element MR01 are disposed between bit lines BL1a and BL1b. The gate electrodes of the MOS transistors Q1 and Q2 are connected to word lines WL0a and WL0b, respectively.

The magnetic tunnel resistive element MR01 is connected between a memory line ML1 and a connection node of the MOS transistors Q1 and Q2. The connection node between the magnetic tunnel resistive element MR01 and memory line ML1 is called "node N1"; the connection node between the MOS transistors Q1 and Q2 is called "node N2"; the connection node between the MOS transistor Q1 and bit line BL1a is called "node N3"; and the connection node between the MOS transistor Q2 and bit line BL1b is called "node N4."

In the memory cell of the address AD10, MOS transistors Q10 and Q11 connected in series and a magnetic tunnel resistive element MR10 are disposed between bit lines BL0a and BL0b. The gate electrodes of the MOS transistors Q10 and Q11 are connected to word lines WL1a and WL1b, respectively.

The magnetic tunnel resistive element MR10 is connected between a memory line ML0 and a connection node of the MOS transistors Q10 and Q11. The connection node between the magnetic tunnel resistive element MR10 and memory line ML0 is called "node N5"; the connection node between the MOS transistors Q10 and Q11 is called "node N6"; the connection node between the MOS transistor Q10 and bit line BL0a is called "node N7"; and the connection node between the MOS transistor Q11 and bit line BL0b is called "node N8."

In the memory cell of the address AD11, MOS transistors Q10 and Q11 connected in series and a magnetic tunnel resistive element MR11 are disposed between bit lines BL1a and BL1b. The gate electrodes of the MOS transistors Q10 and Q11 are connected to word lines WL1a and WL1b, respectively.

As the above-mentioned MOS transistors Q1, Q2, Q10, and Q11, any switch element can be used, instead of being restricted to the MOS transistor.

The memory lines ML0 and ML1 are connected in common to a reference voltage source VR1 via N-channel MOS transistors Q3 and Q31, respectively, and also connected to current sources with a switch S1 and S2, respectively.

The bit lines BL0a, BL0b, BL1a, and BL1b are connected to inputs of buffers with a switch B1, B2, B3, and B4, respectively. Currents I0a, I0b, I1a, and I1b are supplied to and amplified by the buffers B1 to B4, respectively, and the resulting outputs are then supplied to the corresponding sense amplifier SA1.

The sense amplifier SA1 has P-channel MOS transistors Q4 and Q5, as well as a current sense circuit on which the gate electrode and source electrode of the MOS transistors Q4 and Q5 are crossed and connected to each other (i.e., a first-stage circuit), and first and second voltage amplifiers receiving the output of the current sense circuit (i.e., a second-stage circuit).

The first voltage amplifier has a P-channel MOS transistor Q6 and a N-channel MOS transistor Q7 that are connected in series and constitute an inverter circuit. The gate electrodes of MOS transistors Q6 and Q7 are connected in common to the gate electrode of a MOS transistor Q4, and the connection node between the MOS transistors Q6 and Q7 is an output node.

The second voltage amplifier has a P-channel MOS transistor Q8 and a N-channel MOS transistor Q9 that are connected in series and constitute an inverter circuit. The gate electrodes of MOS transistors Q8 and Q9 are connected in common to the gate electrode of a MOS transistor Q5, and the connection node between the MOS transistors Q8 and Q9 is an output node.

In the current sense circuit, the source electrodes of MOS transistors Q4 and Q5 are connected to a potential Vss (ground potential) via resistances R10 and R20, respectively.

The following example is directed to the sense amplifier SA1 connected to the buffer with a switch B1.

The output of the buffer B1 is supplied to the drain electrodes of the MOS transistors Q4 and Q6. The current sense circuit receives an output current amplified by the buffer B1 and performs current-voltage conversion to obtain its output voltage (gate voltage). Then, the current sense circuit supplies this output voltage to the first voltage amplifier, by which this output voltage is amplified and outputted as an output voltage V0a.

A current source with a switch S3 supplies a reference current Iref to the drain electrodes of the MOS transistors Q5 and Q8. The current sense circuit performs current-voltage conversion of the reference current Iref to obtain its output voltage (gate voltage) and supplies it to the second voltage amplifier, by which this output voltage is amplified and outputted as an output voltage $\overline{V0a}$.

A signal voltage generated by current outputted from the buffer B1 changes dynamically logical threshold voltages of the MOS transistors Q6 and Q7, so that the threshold voltages change in reverse direction to the gate potential variations. That is, when the gate potential increases, the logical threshold value voltage of the inverter circuit decreases. As the result, a large operation margin can be obtained with respect to an operating point mismatch between the current sense circuit and the first voltage amplifier. This is true for the relationship between the current sense circuit and the second voltage amplifier.

Although the sense amplifier SA1 amplifies the output of the current sense circuit at the first and second voltage amplifiers, such a two-stage configuration is not always required and a single current sense circuit may be replaced with the two-stage configuration.

It is also possible to use any current sense circuit having a configuration other than that of FIG. 10, or any voltage sense circuit. However, any current sense circuit is preferred because it has high operating speed and is operable even at a low voltage.

If the amplification gain of the sense amplifier is enough, the buffers B1 to B4 may be omitted.

In place of the buffers B1 to B4, MOS transistors using switches BB1 to BB4 as a gate electrode may be used.

These are true for the sense amplifier SA1 receiving the outputs of the buffers with a switch B2 to B4. Instead of the current source with a switch S3, the current sources with a switch S4, S5, and S6 supply a reference current Iref to the corresponding sense amplifier SA1, so that voltages V0b and $\overline{V0b}$; voltages V1a and $\overline{V1a}$; and voltages V1b and $\overline{V1b}$, are outputted as a pair.

The operation of the MRAM 100 will be described using the timing chart of FIG. 11, while by referring to FIG. 10. The following example is directed to the write/read operation of data to the address AD00.

A-2-1. Write Operation

Figure 11:
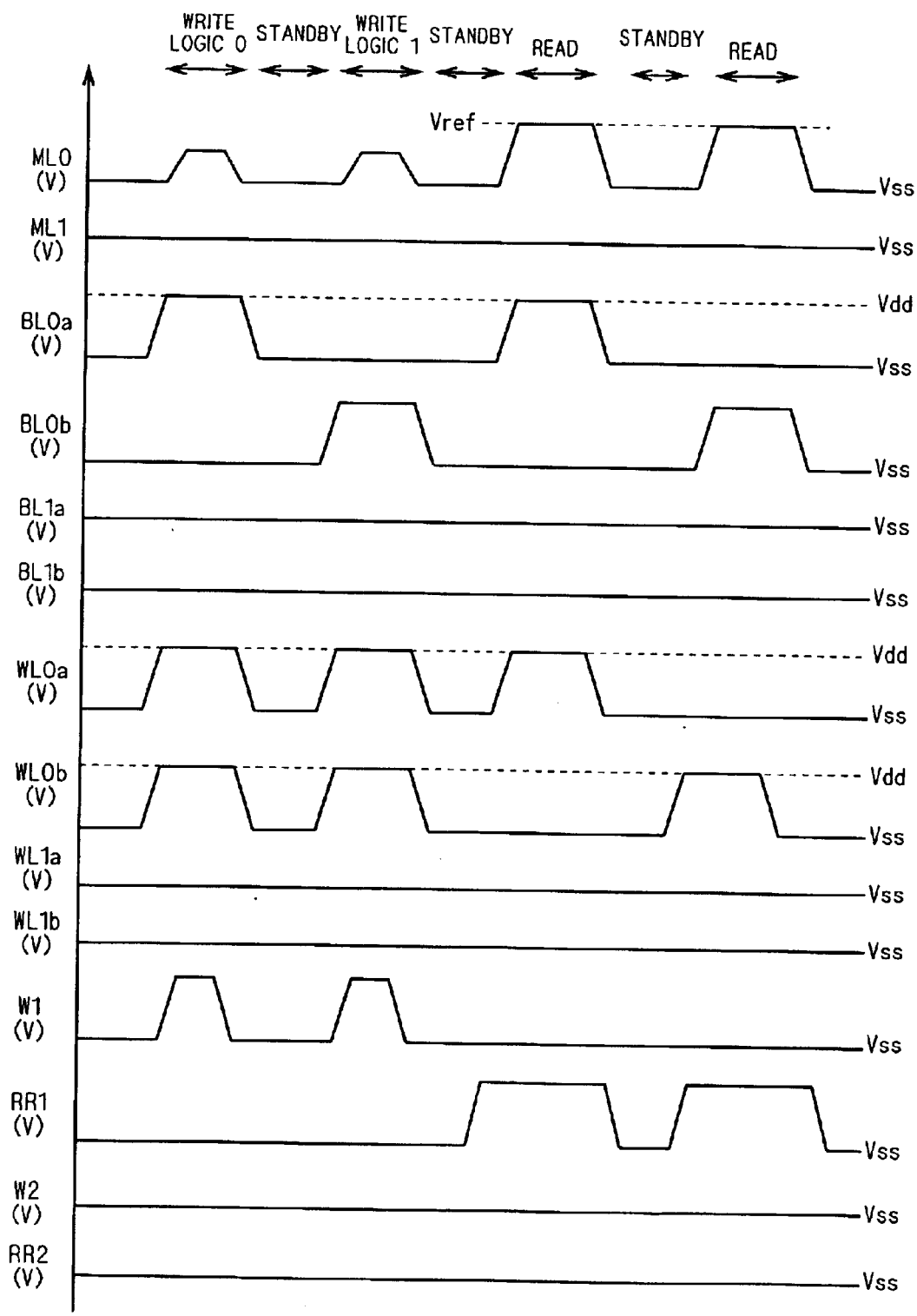
FIG. 11 is a timing chart illustrating the operation of the MRAM in the first preferred embodiment.

FIG. 11 is a timing chart of various voltages and currents at the time of data write/read operation to the address AD00 in the MRAM 100.

In the case of writing data onto the address AD00, a predetermined voltage is supplied to a switch W1 of a current source with a switch S1 such that the switch W1 is on, and current I1 is passed through a memory line ML0. By the current passing therethrough, the potential of the memory line ML0 changes in such a direction as to be higher than voltage Vss, as shown in FIG. 11. Voltage Vdd is supplied to the bit line BL0a for a predetermined period necessary for writing, whereas voltage Vss is supplied to the bit line BL0b for that period. Since the bit lines BL1a and BL1b and the word lines WL1a and W1b are independent of the write/read operation of data to the address AD00, the state of voltage Vss is retained.

Both of the word lines WL0a and WL0b supply the voltage Vdd for a predetermined period such that the N-channel MOS transistors Q1 and Q2 enter the on state. Thereby, current I2 passes from the node N3 to node N4.

As the result, by an alternating magnetic field that the currents I1 and I2 generate, the magnetization vector of the ferromagnetic layer FM1 of the magnetic tunnel resistive element MR00 is determined to perform writing. The magnetization vector of the ferromagnetic layer FM2 is fixed and remains unchanged.

Through the above-mentioned sequence of operations, information is written on the magnetic tunnel resistive element MR00 (i.e., the address AD00). This written information is taken as "logic 0".

Subsequently, when the switch W1 of the current source with a switch S1 is off, no current I1 passes through the memory line ML0. Thereafter, the potential of the memory line ML0 is precharged up to voltage Vss.

The voltages of the word lines WL0a and WL0b are both set at voltage Vss such that the MOS transistors Q1 and Q2 enter the off state. The voltage Vss is also supplied to the bit lines BL0a and BL0b. This period is referred to as a "standby period."

Meanwhile, if "logic 1" opposite the above-mentioned logic is written on the magnetic tunnel resistive element MR00, voltage Vdd is supplied to the bit line BL0b for a predetermined period necessary for writing, whereas voltage Vss is supplied to the bit line BL0a for that period.

A predetermined voltage is supplied to the switch W1 of the current source with a switch S1 such that the switch W1 is on, and current I1 is passed through the memory line ML0. By the current passing therethrough, the potential of the memory line ML0 changes in such a direction as to be higher than voltage Vss, as shown in FIG. 11. For a predetermined period, voltage Vdd is supplied to the word lines WL0a and WL0b such that the N-channel MOS transistors Q1 and Q2 enter the on state. Thereby, current I2 passes from the node N4 to node N3.

As the result, by an alternating magnetic field (coupled magnetic field) that the currents I1 and I2 generate, the magnetization vector of the ferromagnetic layer FM1 of the magnetic tunnel resistive element MR00 is determined to perform writing. Since the current I2 passes from the node N4 to N3, the magnetization vector direction is different from that in the writing of "logic 0," so that "logic 1" opposite "logic 0" is written. At this time, the magnetization vector of the ferromagnetic layer FM2 remains unchanged.

A-2-2. Read Operation

When reading data from the address AD00, a predetermined voltage as a gate control signal RR1 is first supplied to a MOS transistor Q3 serving as an output switch of a reference voltage source VR1 such that the MOS transistor Q3 enter the on state. The period of supplying the predetermined voltage is set so as to be more than a predetermined period necessary for reading.

By this operation, the reference voltage Vref is supplied to the memory line ML0. Although the reference voltage Vref may be or may not be the same as the voltage Vdd, the reference voltage Vref must be set so that the tunnel magnetic resistive rate (TMRR) is large enough.

Specifically, the relationship between the TMRR and the voltage (the reference voltage Vref in this instance) supplied to the memory line is generally such that the TMRR decreases as the reference voltage Vref increases. Hence, the reference voltage Vref value is set at a value at which it is possible to obtain a TMRR of a certain value or more.

Before the MOS transistor Q1 is on, little or no current passes through the magnetic tunnel resistive element MR00, thus causing no voltage drop due to the magnetic tunnel resistive element MR00. Therefore, the both of the nodes N1 and N2 are set at voltage Vref.

In case of reading information into the bit line BL0a, by supplying voltage Vdd to the word line WL0a and voltage Vss to the word line WL0b, the MOS transistor Q1 enters the on state and the MOS transistor Q2 retains the off state.

When the MOS transistor Q1 enters the on state, current passes through the magnetic tunnel resistive element MR00 thereby to cause a voltage drop (Vmr) corresponding to the resistance value of the magnetic tunnel resistive element MR00 (This is determined by the magnetization direction of a ferromagnetic material.). As the result, a voltage, (reference voltage Vref)–(voltage drop Vmr), is supplied to the node N2.

This voltage drop Vmr is determined so that current passing through the MOS transistor Q1 is approximately identical with current I0a passing through the magnetic tunnel resistive element MR00.

Since the MOS transistor Q2 is in the off state, almost all the current passing through the magnetic tunnel resistive element MR00 passes via the MOS transistor Q1 to the bit line BL0a, as the current I0a.

When a predetermined voltage is supplied to a switch BB1 of a buffer with a switch B1 such that the buffer B1 is on, the current I0a is amplified and supplied to the sense amplifier SA1. In the sense amplifier SA1, the amplified current I0a and the reference current Iref outputted from the current source S3 are compared to sense the magnitude relationship therebetween, thereby reading information.

After the information is read to the bit line BL0a, a predetermined voltage is supplied to the switch BB1 of the buffer with a switch B1 such that the buffer B1 enters the off state.

Further, voltage Vss is supplied to the word lines WL0a and WL0b, so that the MOS transistors Q1 and Q2 enter the off state.

Thereafter, voltage Vss is supplied to the gate control signal RR1 of the MOS transistor Q3 that is the output switch of the reference voltage source VR1 such that the MOS transistor Q3 enters the off state. The potential of the memory line ML0 is precharged up to voltage Vss.

As the result, the voltage Vss is supplied to the word lines WL0a and WL0b, and to the bit lines BL0a and BL0b, and the potential of the memory line ML0 is precharged up to voltage Vss, thereby initiating the standby period.

Since a MOS transistor 31, which serves as the output switch of the current source with a switch S2 and reference voltage source VR, is independent of the write/read operation of data to the address AD00, the voltage supplied to the switch W2 of the current source with a switch S2, and the gate control signal RR2 of the MOS transistor Q31 retains the state of voltage Vss. The memory line ML1 also retains the state of voltage Vss.

In order to read information into the bit line BL0b, voltage Vss may be supplied to the word line WL0a and voltage Vdd to the word line WL0b, so that the MOS transistor Q2 enters the on state and the MOS transitor Q1 retains the off state.

As described above, the MOS transistors connected in series between bit lines, such as the MOS transistors Q1 and Q2, pass the current supplied to a magnetic tunnel resistive element to the bit line and also constitute a current path for writing information into the magnetic tunnel resistive element. Hence, these MOS transistors are called "path transistor" or "port" in some cases. Wiring to connect the MOS transistors Q1 and Q2 is generally called "wiring serving as a current path for writing/reading information into the magnetic tunnel junction element" in some cases.

A-2-3. Asynchronous Read

A description will be given of the operation of reading information from memory cells at different addresses sharing a bit line, at independent timings (i.e., asynchronously). The following is the operation of reading information of the magnetic tunnel resistive elements MR00 and MR10.

A predetermined voltage is first supplied as a gate control signal RR1 such that the MOS transistor Q3 serving as an output switch of the reference voltage source VR1 enters the on state. By this operation, a reference voltage Vref is supplied to the memory line ML0.

Then, by supplying voltage Vdd to the word lines WL0a and WL1b, and voltage Vss to the word lines WL0b and WL1a, the MOS transistors Q1 and Q11 enter the on state and the MOS transistors Q2 and Q10 retain the off state.

When the MOS transistors Q1 and Q11 enter the on state, current passes through the magnetic tunnel resistive element MR00 and MR10 thereby to cause a voltage drop Vmr that corresponds to the resistance values of the magnetic tunnel resistive elements MR00 and MR10 (These are determined by the magnetization direction of the ferromagnetic material). As the result, a voltage, (reference voltage Vref)–(drop voltage Vmr), is supplied to the nodes N2 and N6.

This voltage drop Vmr is determined so that current passing through the MOS transistors Q1 and Q11 is approximately identical with currents I0a and I0b passing through the magnetic tunnel resistive elements MR00 and MR10, respectively.

Since the MOS transistor Q2 is in the off state, almost all the current passing through the magnetic tunnel resistive element MR00 passes via the MOS transistor Q1 to the bit line BL0a, as the current I0a.

Since the MOS transistor Q10 is in the off state, almost all the current passing through the magnetic tunnel resistive element MR10 passes via the MOS transistor Q11 to the bit line BL0b, as the current I0b.

When a predetermined voltage is supplied to the switches BB1 and BB2 of the buffers with a switch B1 and B2 such that the buffers B1 and B2 are on, the currents I0a and I0b are amplified and supplied to the respective sense amplifiers SA1, by which these currents are sensed and amplified to read information. After that, the MRAM 100 retains the standby state until the next read or write operation.

A-3. Operation Effect

In the MRAM 100, a pair of bit lines are provided to a single memory cell, and a switch element is interposed between the magnetic tunnel resistive element and each of two bit lines, as previously described. Therefore, by controlling such that the switch elements are selectively on when reading information of the magnetic tunnel resistive element, it is possible to read information from memory cells at different addresses sharing the bit line, at independent timings (asynchronously).

If two addresses are candidates in memory cells at different addresses sharing a bit line, it is of course possible to read concurrently information at the two addresses. In this instance, a timing at which a predetermined voltage is supplied to the paired word lines respectively connected to memory cells at the two different addresses must be synchronized with a timing at which the buffer connected to each bit line is on.

A-4. First Modification

In the above-mentioned MRAM 100, the magnetic resistive elements MR00, MR10, MR01, and MR11 are disposed at the same layer as the gate electrode of the MOS transistors, as described with reference to FIG. 6. It is also possible to take such a configuration as a MRAM 100A shown in FIG. 12.

Figure 12:
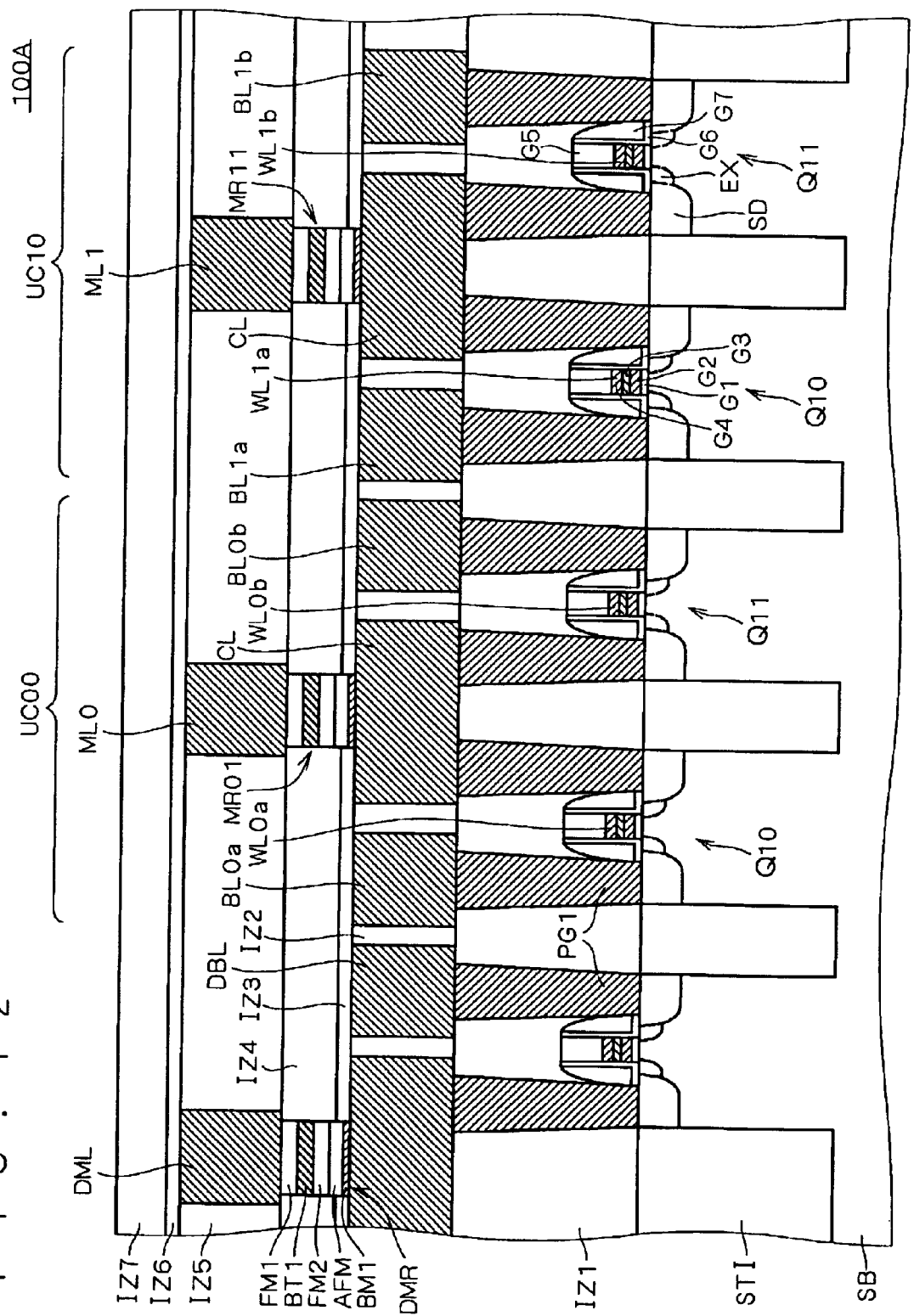
FIG. 12 is a sectional view of the configuration of a modified MRAM in the first preferred embodiment.

FIG. 12 is a diagram corresponding to FIG. 6, wherein like parts are identified by the same reference numerals as in FIG. 6. A description of the like parts will be omitted in the following.

Referring to FIG. 12, in the MRAM 100A, the magnetic resistive elements MR00, MR10, MR01, and MR11 (only the elements MR10 and MR11 are shown in FIG. 12) are disposed on top of a layer where bit lines BL0a, BL0b, BL1a, and BL1b are to be formed.

Specifically, each source/drain layer SD of the MOS transistors Q10 and Q11 is connected to a contact plug PG1 made of an electroconductive material. Two contact plugs PG1 connected to the adjacent source/drain layers SD with an element isolation insulating film STI sandwiched therebetween are connected to a common wiring CL.

The common wiring CL is made of the same material as the respective bit lines and disposed at the same layer as these bit lines, in order to electrically connect the above-mentioned two contact plugs PG1.

The contact plug PG1 not being connected to the common wiring CL is connected to the bit lines BL0a and BL0b in a unit cell UC10, and to the bit lines BL1a and BL1b in a unit cell UC11.

Magnetic tunnel resistive elements MR10 and MR11 are disposed on the common wiring CL with a barrier metal layer BM1 interposed therebetween. The magnetic tunnel resistive elements MR10 and MR11 are made by stacking an antiferromagnetic layer AFM, ferromagnetic layer FM2, insulating film BT1, and ferromagnetic layer FM1 in this order.

The ferromagnetic layers FM1 of the magnetic tunnel resistive elements MR10 and MR11 are connected to the memory lines ML0 and ML1, respectively.

The magnetic tunnel resistive elements MR10 and MR11 are disposed in interlayer insulating films IZ3 and IZ4. The memory lines ML0 and ML1 are disposed in an interlayer insulating film IZ5, and interlayer insulating films IZ6 and IZ7 are stacked in this order on the interlayer insulating film IZ5.

Although the foregoing description is directed to the configuration of the unit cells UC10 and UC11, other unit cells have the same configuration, and this is true for a dummy region. The operation of the MRAM 100A is the same as that of the MRAM 100.

In the MRAM 100A, the magnetic tunnel resistive elements are disposed above the layer for forming bit lines, and therefore, these elements are to be formed after the bit lines are formed.

If the magnetic tunnel resistive element is subject to a temperature higher than Curie temperature, the magnetic material will lose magnetic properties. However, even if it does not reach Curie temperature, a long thermal treatment and frequent thermal treatment might gradually degrade the magnetization strength of the ferromagnetic material and deteriorate the characteristic features of the magnetic tunnel resistive element. Since the magnetic tunnel resistive element is preferably formed in a later step in the MRAM manufacture, the configuration of the MRAM 100A is effective in this point.

B. Second Preferred Embodiment

In the MRAM 100 described in the first preferred embodiment, the magnetic tunnel resistive element is disposed between the memory line and the wiring through which the bit line current is passed. The magnetic tunnel resistive element may have a wiring for changing the magnetization direction of a ferromagnetic layer, as in the magnetic tunnel resistive element MR described with reference to FIG. 1.

A second preferred embodiment of the present invention is directed to the configuration and operation of a MRAM 200 using the magnetic tunnel resistive element MR described with reference to FIG. 1.

B-1. Device Configuration

Figure 13:
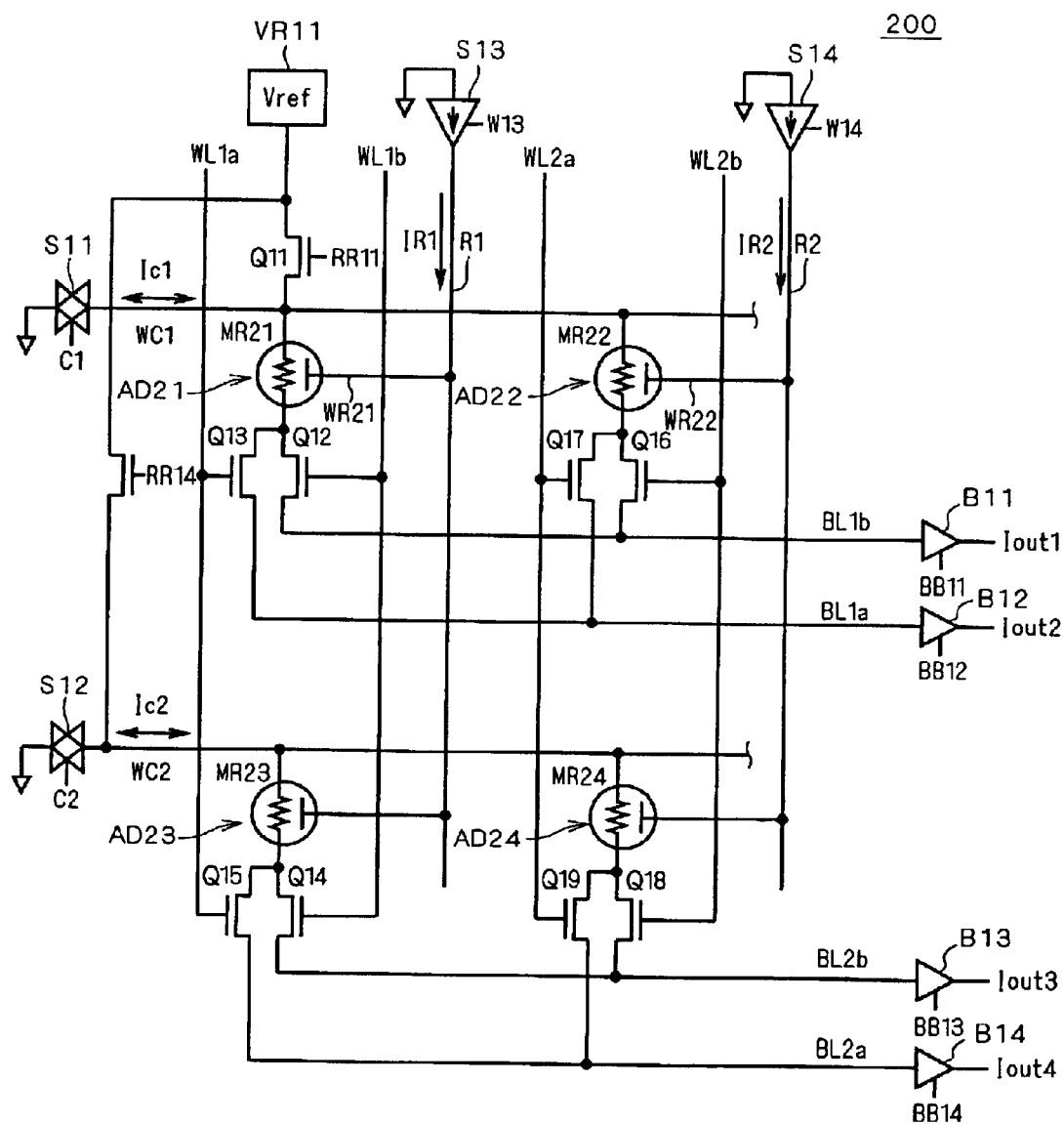
FIG. 13 is a diagram showing a circuit configuration of a MRAM according to a second preferred embodiment of the present invention.

Referring to FIG. 13, the MRAM 200 has magnetic tunnel resistive elements MR21, MR22, MR23, and MR24 at memory cells of addresses AD21, AD22, AD23, and AD24, respectively.

The magnetic tunnel resistive elements MR21, MR22, MR23, and MR24 have control wirings WR21, WR22, WR23, and WR24 to control the magnetization directions of a ferromagnetic layer, respectively. These elements are resistive elements whose resistance value varies depending on the magnetic field generated when current is passed through these control wirings WR21 to WR24.

In the memory cell of the address AD21, one end of the magnetic tunnel resistive element MR21 is electrically connected to a reference voltage source VR11 via a N-channel MOS transistor Q11, and the other end is electrically connected to bit lines BL1b and BL1a via N-channel MOS transistors Q12 and Q13, respectively. The bit lines BL1b and BL1a are connected to buffers with a switch B11 and B12, respectively. The buffers B11 and B12 output currents Iout1 and Iout2, respectively.

The gate electrodes of the MOS transistors Q12 and Q13 are connected to word lines WL1b and WL1a, respectively.

One end of the magnetic tunnel resistive element MR21 is also connected to a bidirectional current source S11, and the control wiring WR21 of the element MR21 is connected to a wiring R1 to which current is supplied from the current source with a switch S13.

In the memory cell of the address AD22, one end of the magnetic tunnel resistive element MR22 is electrically connected to the reference voltage source VR11 via the N-channel MOS transistor Q11, and the other end is electrically connected to the bit lines BL1b and BL1a via N-channel MOS transistors Q16 and Q17, respectively.

The gate electrodes of the MOS transistors Q16 and Q17 are connected to word lines WL2b and WL2a, respectively.

One end of the magnetic tunnel resistive element MR22 is also connected to the bidirectional current source S11, and the control wiring WR22 of the resistive element MR21 is connected to a wiring R2 to which current is supplied from the current source with a switch S14.

In the memory cell of the address AD23, one end of the magnetic tunnel resistive element MR23 is electrically connected to the reference voltage source VR11 via a N-channel MOS transistor Q14, and the other end is electrically connected to bit lines BL2b and BL2a via N-channel MOS transistors Q14 and Q15, respectively. The bit lines BL2b and BL2a are connected to buffers with a switch B13 and B14, respectively. The buffers B13 and B14 output currents Iout3 and Iout4, respectively.

The gate electrodes of the MOS transistors Q14 and Q15 are connected to word lines WL1b and WL1a, respectively.

One end of the magnetic tunnel resistive element MR23 is also connected to a bidirectional current source S12, and the control wiring WR23 of the element MR23 is connected to the wiring R1 to which current is supplied from the current source with a switch S13.

In the memory cell of the address AD24, one end of the magnetic tunnel resistive element MR24 is electrically connected to the reference voltage source VR11 via the N-channel MOS transistor Q14, and the other end is electrically connected to the bit lines BL2b and BL2a via N-channel MOS transistors Q18 and Q19, respectively.

The gate electrodes of the MOS transistors Q18 and Q19 are connected to the word lines WL2b and WL2a, respectively.

One end of the magnetic tunnel resistive element MR24 is also connected to the bidirectional current source S12, and the control wiring WR24 of the element MR24 is connected to the wiring R2 to which current is supplied from the current source with a switch S14.

The bidirectional current sources S11 and S12 are current sources capable of performing three-pattern operation. Say for example in the bidirectional current source S11, current is passed to the right as seen in FIG. 13 when a control signal C1 is positive "+", and to the left when the control signal C1 is negative "−". When the control signal C1 is neither "+" nor "−", the bidirectional current source S11 does not operate and retains the standby state. This is true for the bidirectional current source S12.

The operation of the MRAM 100 will be described using a timing chart shown in FIG. 14, while by referring to FIG. 13. The following example is directed to data write/read operation to the address AD21.

B-2. Operation

Figure 14:
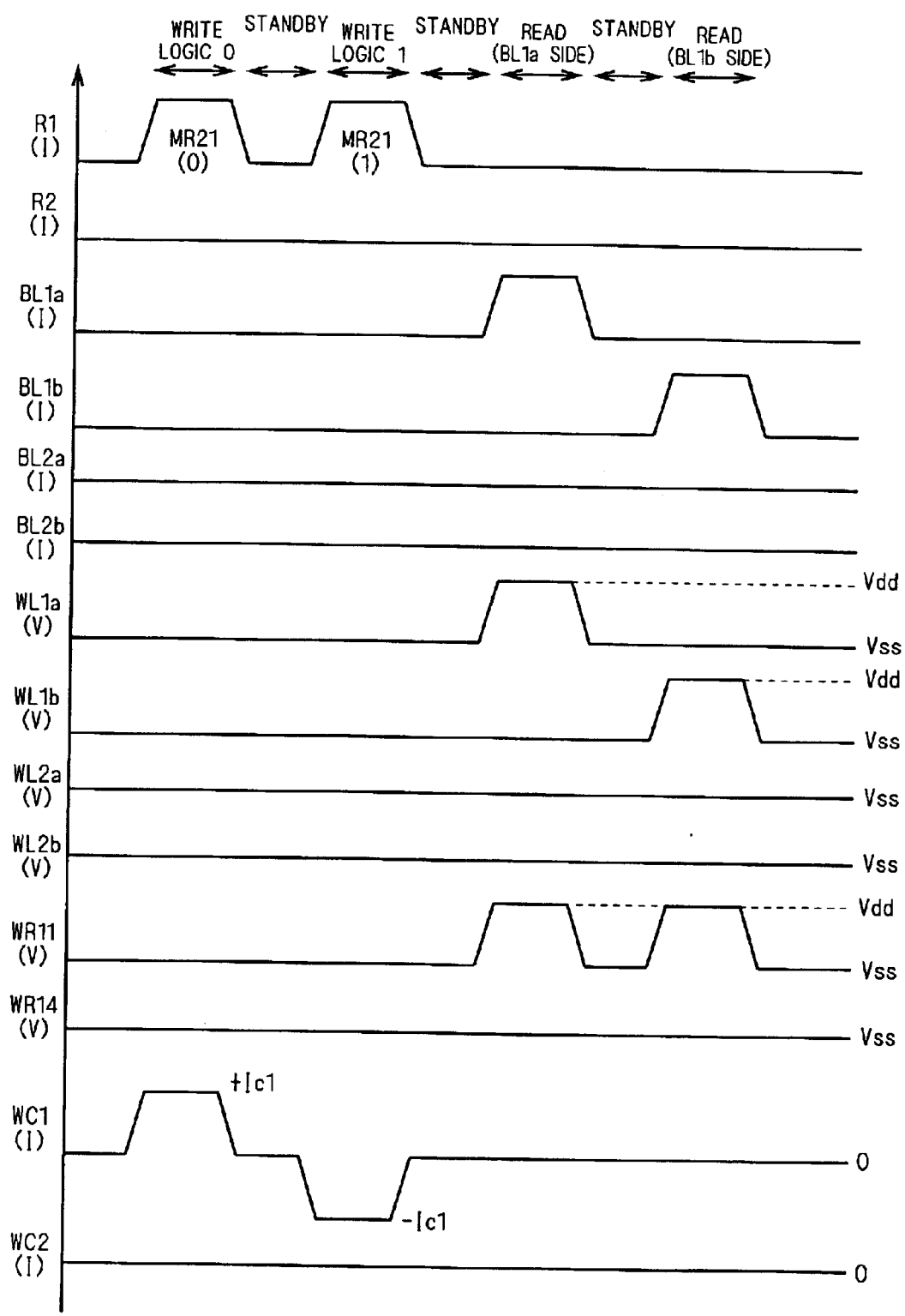
FIG. 14 is a timing chart illustrating the operation of the MRAM of the second preferred embodiment.

FIG. 14 is a timing chart of various voltages and currents in the data read/write operation to the address AD21 in the MRAM 200.

B-2-1. Write Operation

In the case of writing data to the address AD21, as a control signal C1 of the bidirectional current source S11, a positive "+" signal is supplied to the current source S11 for a predetermined period necessary for writing, so that current Ici (+Ic1), toward the right as seen in FIG. 14, is passed to wiring WC1.

An on signal is supplied to a switch W13 such that the current source with a switch S13 enters the on state, and current IR1 is passed from the current source S13 to the wiring IR1.

By an alternating magnetic field that the current Ic1 ("+Ic1" in this instance) and the current IR1 generate, the magnetization vector of a ferromagnetic layer of the magnetic tunnel resistive element MR21 is determined to perform writing. The MRAM 200 retains the standby state until the next write or read operation.

Through the above-mentioned sequence of operations, information is written on the magnetic tunnel resistive element MR21 (i.e., the address AD21). This written information is taken as "logic 0."

Meanwhile, if "logic 1" opposite the above-mentioned logic is written on the magnetic tunnel resistive element MR21, a negative "−" signal as a control signal C1 of the bidirectional current source S11 is supplied for a predetermined period necessary for writing, so that current Ici (−Ic1), toward the left as seen in FIG. 14, is passed to the wiring WC1.

An on signal is supplied to the switch W13 such that the current source with a switch S13 enters the on state, and current IR1 is passed from the current source S13 to the wiring IR1.

By an alternating magnetic field that the current Ic1 ("−Ic1" in this instance) and the current IR1 generate, the magnetization vector of the ferromagnetic layer of the magnetic tunnel resistive element MR21 is determined to perform writing.

Through the above-mentioned sequence of operations, information of "logic 1" is written on the magnetic tunnel resistive element MR21. The MRAM 200 retains the standby state until the next write or read operation.

Since the bit lines BL2a and BL2b, and word lines WL2a and W2b are independent of the data write/read operation to the address AD21, they retain the state of voltage Vss.

Although the magnetic tunnel resistive element MR22 of the address AD22 is affected by the magnetic field caused by the current Ic1 passing through the wiring WC1, no information is written on the magnetic tunnel resistive element MR22 because no current passes through a wiring R2.

Although the current Ic1 passes through the wiring R1, no information is written on the magnetic tunnel resistive element MR23 of the address AD23 because no current passes through a wiring WC2. Magnetic tunnel resistive elements to which only one of two currents for controlling magnetization direction is being supplied, such as the magnetic tunnel resistive elements MR22 and MR23, are hereinafter referred to as a "half-select magnetic tunnel resistive element."

B-2-2. Read Operation

In the case of reading data from the address AD21, as a gate control signal RR11, voltage Vdd is supplied such that a MOS transistor Q11 serving as an output switch of a reference voltage source VR11 enters the on state.

By this operation, a reference voltage Vref is supplied to one end of the magnetic tunnel resistive element MR21. Although the reference voltage Vref may be or may not be the same as the voltage Vdd, the reference voltage Vref must be set so that the tunnel magnetic resistive rate (TMRR) is large enough.

In the case of reading information into the bit line BL1a, by supplying voltage Vdd to a word line WL1a and voltage Vss to a word line WL1b, a MOS transistor Q13 enters the on state, and a MOS transistor Q12 retains the off state.

When the MOS transistor Q13 enters the on state, current corresponding to the resistance value of the magnetic tunnel resistive element MR21 (The magnitude of the current is determined by the magnetization direction of the ferromagnetic material) passes from the magnetic tunnel resistive element MR21. However, since the MOS transistor Q12 is in the off state, almost all the current passing through the magnetic tunnel resistive element MR21 passes through the MOS transistor Q13 to the bit line BL1a.

By supplying voltage Vdd to a switch BB12 of a buffer with a switch B12, the buffer B12 is on so that the current passing through the bit line BL1a is amplified and outputted as current Iout2.

The current Iout2 is supplied to a sense amplifier (not shown), for example, the sense amplifier SA1 in FIG. 10, by which this current is sensed and amplified to read information. Thereafter, the MRAM 200 retains the standby state until the next write or read operation.

In the case of reading information into the bit line BL1b, by supplying voltage Vdd to the word line WL1b and voltage Vss to the word line WL1a, the MOS transistor Q12 enters the on state whereas the MOS transistor Q13 retains the off state.

When the MOS transistor Q12 enters the on state, current corresponding to the resistance value of the magnetic tunnel resistive element MR21 (The magnitude of the current is determined by the magnetization direction of the ferromagnetic material.) passes from the element MR21. However, since the MOS transistor Q13 is in the off state, almost all the current passing through the magnetic tunnel resistive element MR21 passes through the MOS transistor Q12 to the bit line BL1b.

By supplying voltage Vdd to a switch BB11 of a buffer with a switch B11, the buffer B11 is on, so that the current passing through the bit line BL1b is amplified and outputted as current Iout1.

The current Iout1 is supplied to a sense amplifier (not shown), for example, the sense amplifier SA1 in FIG. 10, by which this current is sensed and amplified to read information. Thereafter, the MRAM 200 retains the standby state until the next write or read operation.

Meanwhile, MOS transistors connected in series between the bit lines, such as the MOS transistors Q12 and Q13, pass the current passing through the magnetic tunnel resistive element to the bit line and also constitute a current path for writing information into the magnetic tunnel resistive element. These MOS transistors are therefore called "port" in some cases. The wiring to connect the MOS transistors Q12 and Q13 is generally called "wiring serving as a current path for information writing/reading to the magnetic tunnel junction element" in some cases.

B-2-3. Asynchronous Read

A description will be given of the operation of reading information from memory cells at different addresses sharing a bit line, at independent timings (i.e., asynchronously). The following example is the operation of reading information of the magnetic tunnel resistive elements MR21 and MR22.

Voltage Vdd is first supplied as a gate control signal RR11, so that the MOS transistor Q11 serving as an output switch of the reference voltage source VR11 enters the on state.

By this operation, a reference voltage Vref is supplied to each one end of the magnetic tunnel resistive element MR21 and MR22.

Then, by supplying voltage Vdd to the word lines WL1a and WL2b, and supplying voltage Vss to the word lines WL1b and WL2a, the MOS transistors Q13 and Q16 enter the on state whereas the MOS transistors Q12 and 017 retain the off state.

When the MOS transistors Q13 enters the on state, current corresponding to the resistance value of the magnetic tunnel resistive element MR21 (The magnitude of the current is determined by the magnetization direction of the ferromagnetic material.) passes from the element MR21. However, since the MOS transistor Q12 is in the off state, almost all the current passing through the magnetic tunnel resistive element MR21 passes from the MOS transistor Q13 to the bit line BL1a.

When the MOS transistors Q16 enters the on state, current corresponding to the resistance value of the magnetic tunnel resistive element MR22 (The magnitude of the current is determined by the magnetization direction of the ferromagnetic material.) passes from the element MR22. However, since the MOS transistor Q17 is in the off state, almost all the current passing through the magnetic tunnel resistive element MR22 passes through the MOS transistor Q16 to the bit line BL1b.

By supplying voltage Vdd to the switches BB11 and BB12 of the buffers with a switch B11 and B12, the buffers B11 and B12 are on, so that the current passing through the bit lines Bl1b and BL1a are amplified and outputted as currents Iout1 and Iout2, respectively.

B-3. Operation Effect

In the MRAM 200, a pair of bit lines are provided to a single memory cell, and a switch element is interposed between a magnetic tunnel resistive element and each bit line, as described above. Therefore, when information is read into the magnetic tunnel resistive element, it is possible, to read the information at independent timings (asynchronously) from memory cells different addresses sharing a bit line, by controlling such that the switch elements are selectively on.

If two addresses are candidates in memory cells at different addresses sharing a bit line, it is of course possible to read concurrently information at the two addresses. In this instance, a timing at which a predetermined voltage is supplied to the paired word lines connected to the respective memory cells at the two addresses must be synchronized with a timing at which the buffers connected to the corresponding bit line are on.

C. Third Preferred Embodiment

C-1. Device Configuration

C-1-1. Circuit Configuration

Figure 15:
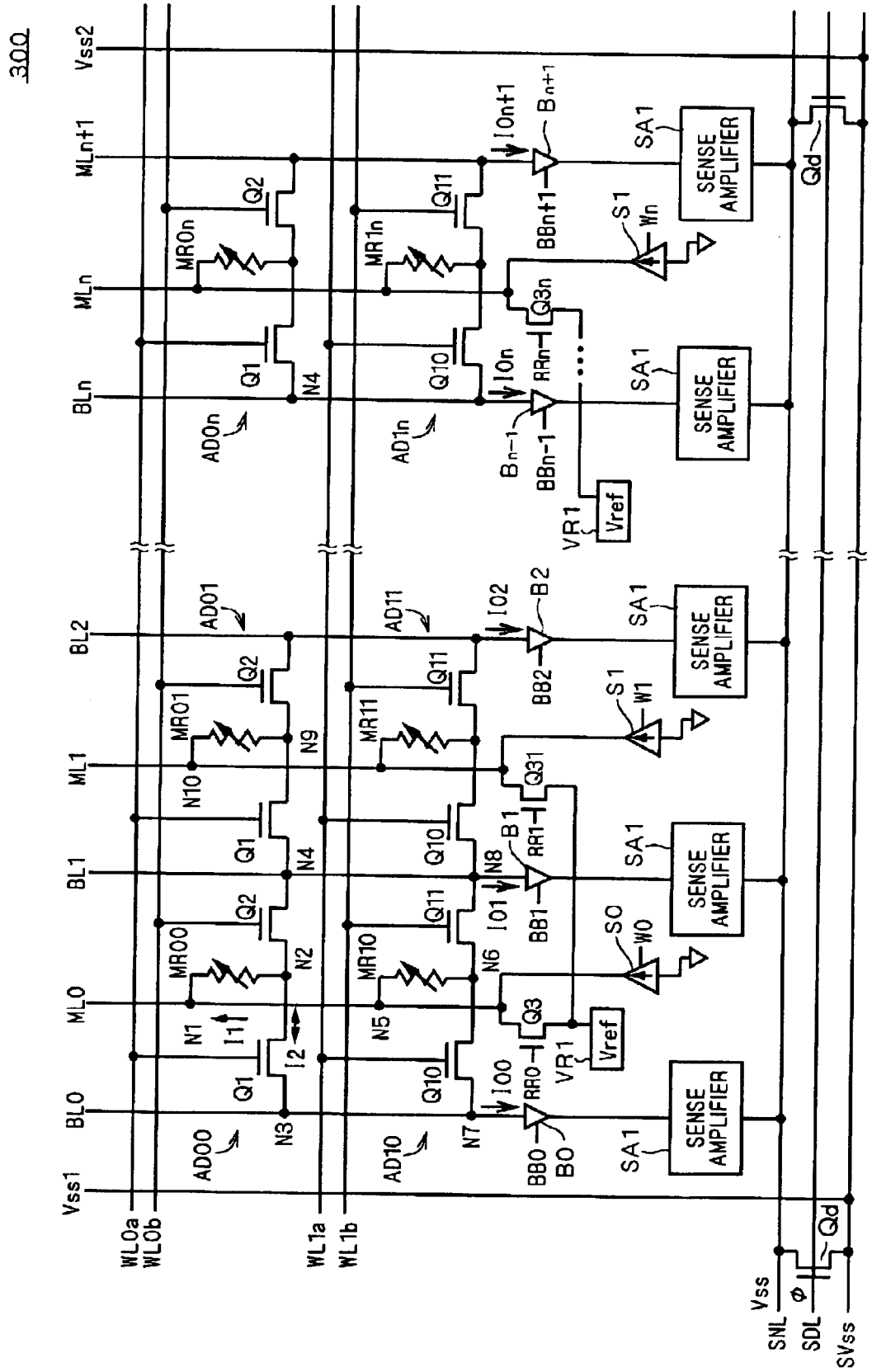
FIG. 15 is a diagram showing a circuit configuration of a MRAM according to a third preferred embodiment of the present invention.

FIG. 15 shows a circuit diagram of a MRAM 300 according to a third preferred embodiment of the present invention.

In FIG. 15, memory cells of addresses AD00, AD10, AD01, AD11, AD0n, and AD1n are shown whereas a memory cell between the addresses AD01 and AD0n, and a memory cell between the addresses AD11 and AD1n are omitted. In the configuration shown in FIG. 15, a magnetic tunnel resistive element is disposed between a memory line and bit line, and denoted by the variable resistance symbol, as in the case with the MRAM 100 described in the first preferred embodiment.

Referring to FIG. 15, in the memory cell of the address AD00, MOS transistors Q1 and Q2 connected in series and a magnetic tunnel resistive element MR00 are disposed between bit lines BL0 and BL1. The gate electrodes of the MOS transistors Q1 and Q2 are connected to word lines WL0a and WL0b, respectively.

The magnetic tunnel resistive element MR00 is connected between a memory line ML0 and a connection node of the MOS transistors Q1 and Q2. Hereinafter, the connection node between the magnetic tunnel resistive element MR00 and memory line ML0 is called "node N1," that between the MOS transistors Q1 and Q2 is called "node N2," that between the MOS transistor Q1 and bit line BL0 is called "node N3," and that between the MOS transistor Q2 and bit line BL1 is called "node N4."

In the memory cell of the address AD01, MOS transistors Q1 and Q2 connected in series and a magnetic tunnel resistive element MR01 are disposed between bit lines BL1 and BL2. The gate electrodes of the MOS transistors Q1 and Q2 are connected to the word lines WL0a and WL0b, respectively. The magnetic tunnel resistive element MR01 is connected between a memory line ML1 and a connection node of the MOS transistors Q1 and Q2.

It is noted that in the address AD01, the connection node between the magnetic tunnel resistive element MR01 and memory line ML1 is called "node N10," that between the MOS transistors Q1 and Q2 is called "node N9," and that between the MOS transistors Q1 and bit line BL1 is called "node N4," for convenience in illustrating the operation to be described later.

In the memory cell of the address AD10, MOS transistors Q10 and Q11 connected in series and a magnetic tunnel resistive element MR10 are disposed between bit lines BL0 and BL1. The gate electrodes of the MOS transistors Q10 and Q11 are connected to word lines WL1a and WL1b, respectively.

The magnetic tunnel resistive element MR10 is connected between the memory line ML0 and a connection node of the MOS transistors Q10 and Q11. Hereinafter, the connection node between the magnetic tunnel resistive element MR10 and memory line ML0 is called "node N5," that between the MOS transistors Q10 and Q11 is called "node N6," that between the MOS transistor Q10 and bit line BL0 is called "node N7," and that between the MOS transistor Q11 and bit line BL1 is called "node N8."

In the memory cell of the address AD11, MOS transistors Q10 and Q11 connected in series and a magnetic tunnel resistive element MR11 are disposed between bit lines BL11 and BL2. The gate electrodes of the MOS transistors Q10 and Q11 are connected to the word lines WL1a and WL1b, respectively.

The magnetic tunnel resistive element MR11 is connected between the memory line ML0 and a connection node of the MOS transistors Q10 and Q11.

The MOS transistor Q10 of the address AD11 and the MOS transistor Q11 of the address AD10 are connected in common to the bit line BL1, and its connection node is called "node N8."

In this manner, the adjacent memory cells share the bit line disposed therebetween, and this configuration is repeated up to between the address AD0n and AD1n.

The memory lines ML0, ML1, and MLn are connected in common to a reference voltage source VR1 via N-channel MOS transistors Q3, Q31, and Q3n, respectively, and also connected to current sources with a switch S0, S1, and Sn, respectively.

The bit lines BL0, BL1, BL2, BLn, and BLn+1 are respectively connected to inputs of buffers with a switch B0, B1, B2, Bn, and Bn+1, and currents I00, I01, I02, I0n, and I0n+1 are respectively amplified by buffers with a switch B0 to Bn+1 and then supplied to the corresponding sense amplifier SA1.

The configuration of the sense amplifier SA1 is omitted here because it has already been described with reference to FIG. 10.

Although voltage Vss (ground voltage) is required in the operation of the sense amplifiers SA1, in the MRAM 300, lines supplying voltage Vss to the sense amplifiers SA1 are connected in common to a wiring SNL. The wiring SNL is electrically connected via a N-channel MOS transistor Qd to a sub-power line SVss.

In the MRAM 300, power lines such as bit lines, word lines, supply lines of voltage Vss etc. have their respective hierarchical structures (which are referred to as "hierarchical bit line structure," "hierarchical word line structure," "hierarchical power line" in some cases). The sub-power line SVss is connected to main power lines Vss1 and Vss2.

As used herein, the term "hierarchical structure" means such a structure that branch lines are branched from a main wiring. Disposed between the main wiring and branch lines is a supply control means that controls the supply and stop of current or voltage to the branch lines.

Hence, in the event that the memory cell array scale is increased, a memory region is divided into plural blocks, and current or voltage is supplied from the branch lines to each block. With this configuration, the current or voltage supply to unused blocks can be stopped thereby to reduce the load capacity of the main wiring.

The bit lines BL0 to BLn and word lines WL0a, WL0b, WL1a, and WL1b are also connected to a main bit line and main word line (not shown). Thereby, even if the memory cell array scale is increased, a delay in signal transmission is avoidable.

Returning to the operation of the sense amplifier SA1, only at the operation time of the sense amplifier SA1, an on signal as a control signal ø of the MOS transistor Qd is supplied to the control signal line SDL connected to the gate electrode of the MOS transistor Qd, so that voltage Vss is supplied via the MOS transistor Qd to the wiring SDL.

When the sense amplifier SA does not operate, an off signal as a control signal ø is supplied such that the wiring SNL enters the floating state. It is therefore capable of reducing power consumption during the non-operation state of the sense amplifier SA1.

The sense speed of the sense amplifier SA1 is determined by a speed at which the wiring SNL supplies the voltage Vss to each sense amplifier SA1. Therefore, if all the sense amplifiers SA1 operate and the current supply to the wiring SNL is insufficient, the potential of the sub-power line SVss and wiring SNL might vary and the operation speed of the sense amplifiers SA1 might be lowered, thereby increasing information read time. For example, the potential can be fixed by supplying the voltage Vss from the power lines Vss1 and Vss2 in the units of 8 to 16 bits. This ensures the operation speed of the sense amplifiers SA1.

Of course, in the MRAM 100 of the first preferred embodiment with reference to FIG. 10, the above-mentioned hierarchical structure is applicable to the bit lines, word lines, and power lines.

C-1-2. Plan Configuration

Figure 16:
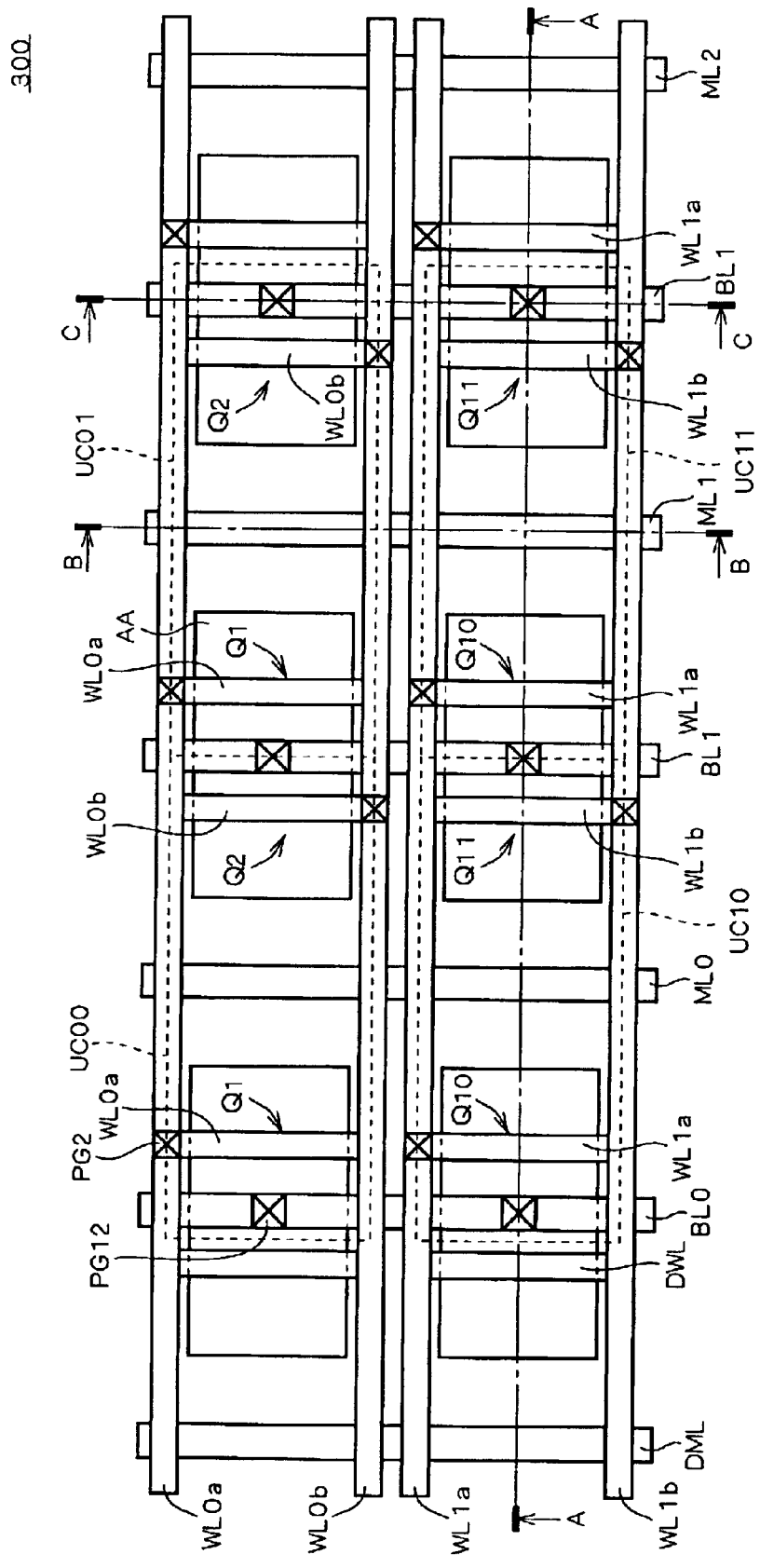
FIG. 16 is a diagram showing a plan layout of the MRAM in the third preferred embodiment.

FIG. 16 shows schematically a plan layout of a memory cell array part of the MRAM 300.

In FIG. 16, there are shown MRAM memory cells corresponding to four addresses AD00, AD10, AD01, and AD11 in a memory cell array, which are indicated by broken lines as unit cells UC00, UC10, UC01, and UC11, respectively.

Referring to FIG. 16, bit lines BL0, BL1, and BL2 are disposed in parallel, and word lines WL0a, WL0b, WL1a, and WL1b are disposed in parallel so as to be orthogonal to these bit lines when viewed from above.

In the center of a region surrounded by the bit lines BL0 and BL1 (i.e., in the center of the unit cell), a memory line ML0 is disposed parallel to the bit lines. In the center of a region surrounded by the bit lines BL1 and BL2 (i.e., in the center of the unit cell), a memory line ML1 is disposed parallel to the bit lines.

On an active region AA of the unit cells UC00 and UC01, the gate electrodes of MOS transistors Q1 and Q2 are disposed parallel to the bit lines. On an active region AA of the unit cells UC10 and UC11, the gate electrodes of MOS transistors Q10 and Q11 are disposed parallel to the bit lines.

The bit lines BL0, BL1, and BL2 in their respective unit cells are electrically connected to the active region AA via contact plugs PG12 (which form a two-stage structure with PG11 (not shown)).

Since the gate electrode of each MOS transistor Q1 is electrically connected via a contact plug PG2 to the word line WL0*a*, this gate electrode may sometimes be referred to as a "word line WL0*a*." Since the gate electrode of each MOS transistor Q2 is electrically connected via the contact plug PG2 to the word line WL0*b*, this gate electrode may sometimes be referred to as a "word line WL0*b*."

Since the gate electrode of each MOS transistor Q10 is electrically connected via a contact plug PG2 to the word line WL1*a*, this gate electrode may sometimes be referred to as a "word line WL1*a*." Since the gate electrode of each MOS transistor Q11 is electrically connected via the contact plug PG2 to the word line WL1*b*, this gate electrode may sometimes be referred to as a "word line WL1*b*."

A dummy region DA is disposed at the left end part as viewed in FIG. 16. In the dummy region DA, a dummy word line (dummy gate electrode) DWL and dummy memory line DML are disposed in the same arrangement as in the memory cell region.

C-1-3. Sectional Configuration

Figure 17:
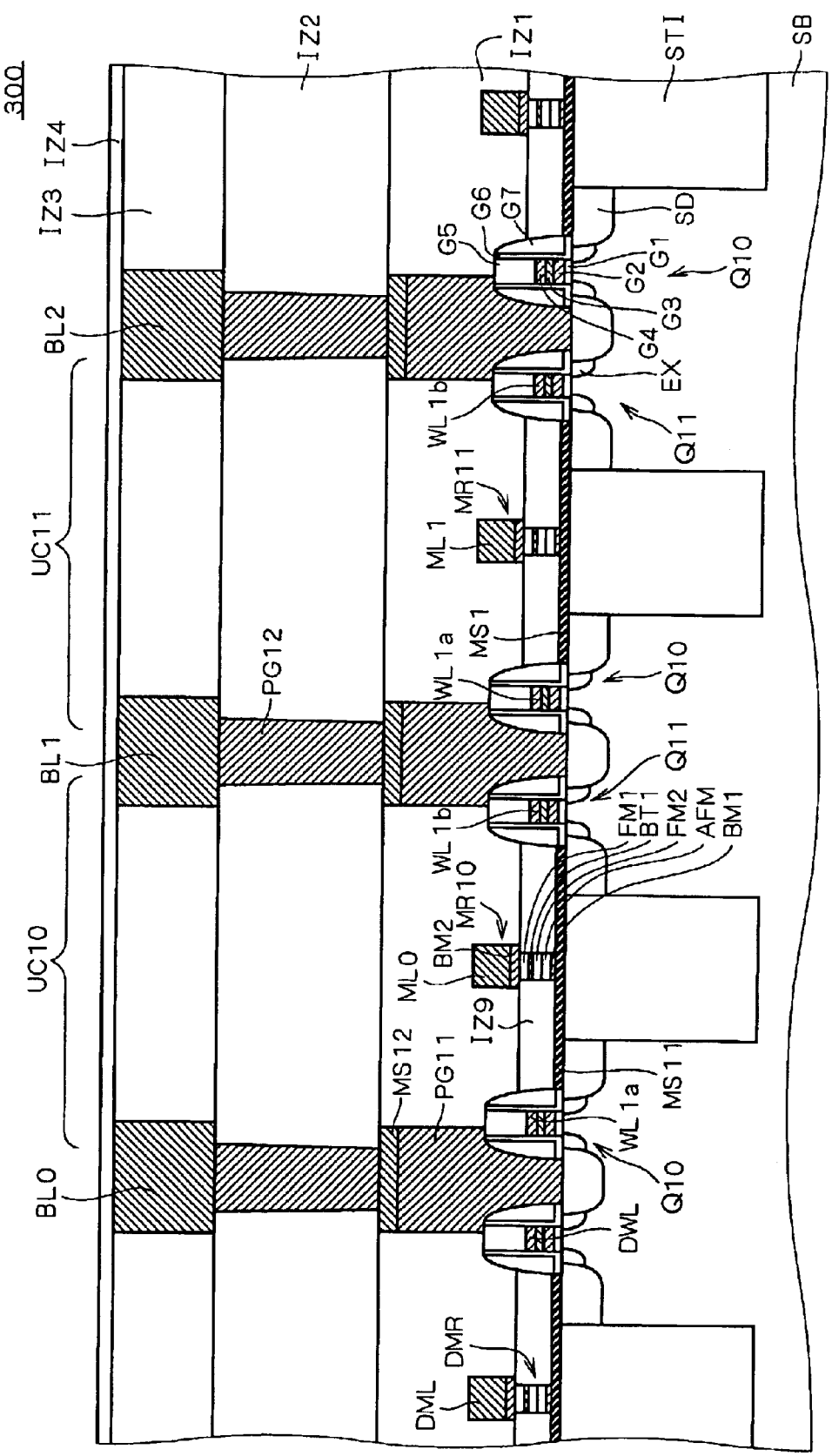
FIG. 17 is a sectional view of the MRAM configuration in the third preferred embodiment.

FIG. 17 shows the configuration of a section taken along line A—A in FIG. 16, looking in the direction of the appended arrows. Like parts are identified by the same reference numerals as in the MRAM 100 shown in FIG. 6, and a description of the like parts will be omitted.

Referring to FIG. 17, the MRAM 300 is disposed on a silicon substrate SB, and an active region AA is defined by an element isolation insulating film STI disposed in the surface of the silicon substrate SB.

In FIG. 17, a unit cell UC10 has two MOS transistors Q10 and Q11, and a single magnetic tunnel resistive element MR10. This is true for other unit cells.

A metal silicide layer MS11 is disposed between the MOS transistors Q10 and Q11. The metal silicide layer MS11 is disposed not only on the active region AA but also on the element isolation insulting film STI. A magnetic tunnel resistive element MR10 is disposed above the metal silicide layer MS11 overlying the top of the element isolation insulating film STI.

The magnetic tunnel resistive element MR10 is surrounded by an interlayer insulating film IZ9 disposed on the metal silicide layer MS11. Only the uppermost end surface of the element MR10 is exposed on the surface of the interlayer insulating film IZ9. A barrier metal BM2 is disposed to cover this exposed part. A memory line ML0 that is a metal wiring is disposed on the barrier metal layer BM2.

A side of a source/drain layer SD opposite the metal silicide layer MS11 in the MOS transistors Q10 and Q11 is electrically connected to the bit lines BL0 and BL1 via the contact plug PG11 and PG12 made of an electroconductive material.

The contact plug PG11 is made by filling doped polysilicon or tungsten etc. in a contact hole extending through the interlayer insulating film IZ1. The contact plug PG12 is made by filling doped polysilicon or tungsten etc. in a contact hole extending through the interlayer insulating film IZ2. A metal silicide layer MS12 is disposed on the upper end part of the contact plug PG11. The contact plugs PG11 and PG12 are electrically connected via the metal silicide layer MS12.

The MOS transistor Q11 of the unit cell UC10 and the MOS transistor Q10 of the unit cell UC11 are disposed on a common active region AA and have a common source/drain layer SD. The contact plug PG11 is connected to the source/drain layer SD.

Although the foregoing description is directed to the configuration of the unit cell UC10, other unit cells have the same configuration.

The bit lines BL0, BL1, and BL2 (a first-layer metal layer) are disposed in an interlayer insulating film IZ3 disposed above the interlayer insulating film IZ1. The upper end part of the respective contact plugs PG12 is connected to the bit lines BL0, BL1, and BL2.

An interlayer insulating film IZ4 is disposed above the interlayer insulating film IZ3. The configuration of layers above the interlayer insulating film IZ4 is omitted in FIG. 17.

The configurations of a section taken along line B—B and a section taken along line C—C in FIG. 16, looking in the direction of the appended arrows, are the same as described with reference to FIGS. 7 and 8.

C-2. Operation

The operation of the MRAM 300 will be described using timing charts of FIGS. 18 and 19, while by referring to FIG. 15. The following example is directed to the data write/read operation to the address AD00.

C-2-1. Write Operation

Figure 18:
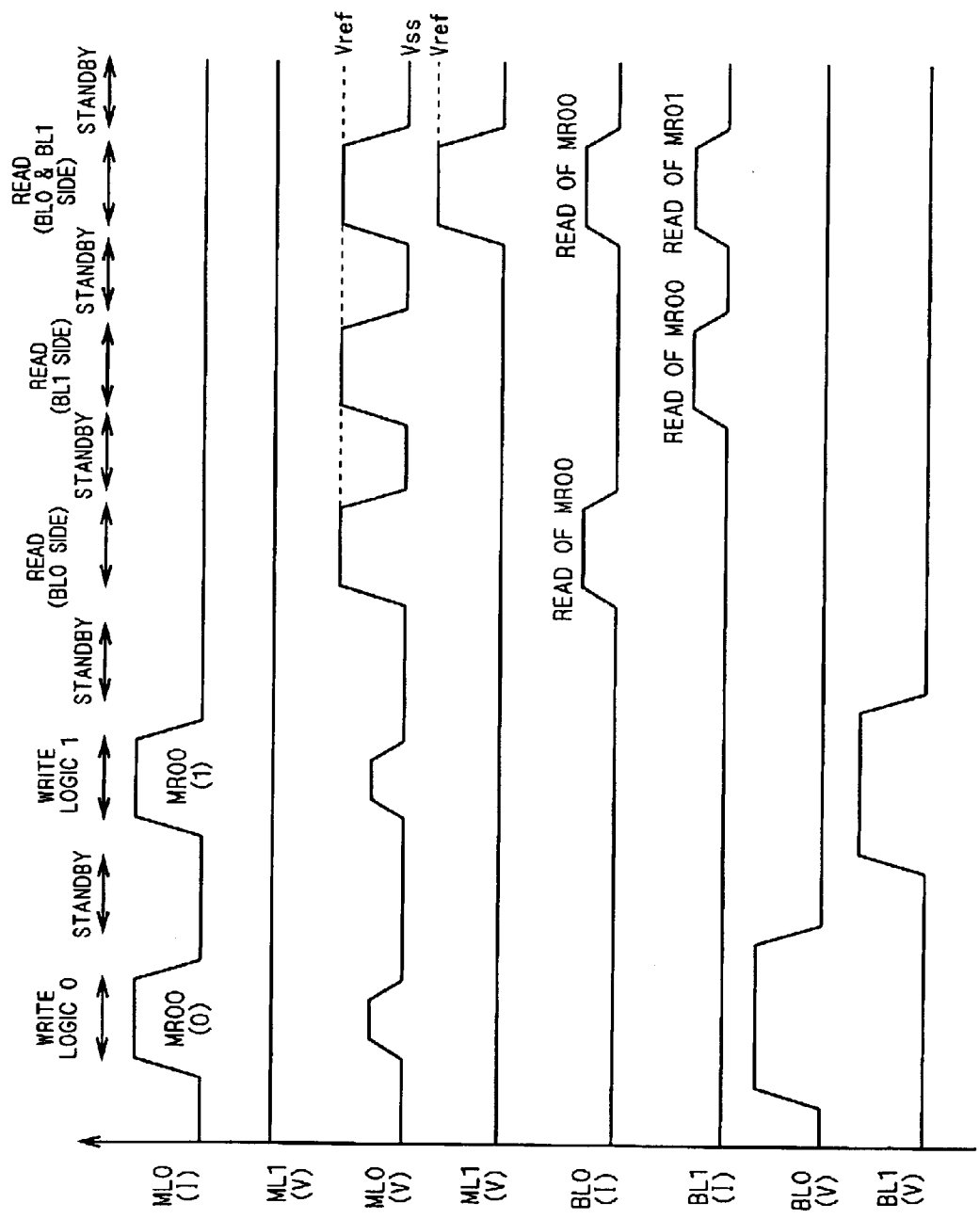
FIGS. 18 and 19 are timing charts illustrating the operation of the MRAM in the third preferred embodiment.
Figure 19:
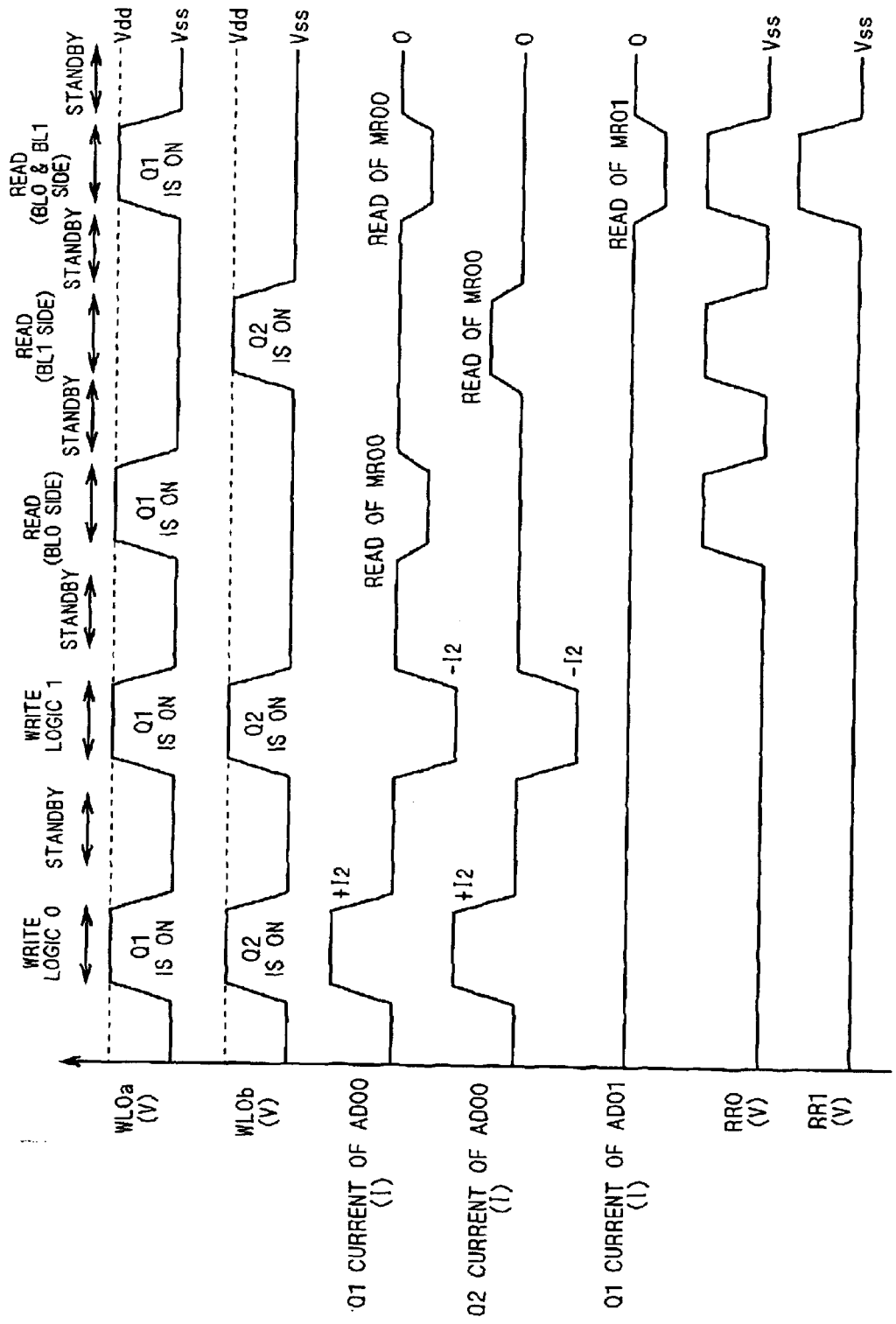

FIGS. 18 and 19 are timing charts of various voltages and currents at the time of data write/read operation to the address AD00 in the MRAM 300.

In the case of writing data at the address AD00, a predetermined voltage is supplied to a switch W0 of a current source with a switch S0 such that the switch W0 is on, and current I1 is passed to the memory line ML0. Voltage Vdd is supplied to the bit line BL0 for a predetermined period necessary for writing, whereas voltage Vss is supplied to the bit line BL1 for that period.

The voltage Vdd is supplied to both of the word lines WL0*a* and WL0*b* for a predetermined period such that the N-channel MOS transistors Q1 and Q2 enter the on state. Thereby, current I2 passes from the node N3 to the node N4. The direction of the current 12 is taken as a positive "+" direction, and hereinafter referred to as a "current +I2."

FIG. 19 shows a timing chart of current passing through the MOS transistors Q1 and Q2, and indicates that the current +I2 passes at the above-mentioned timing. In FIG. 19, a positive symbol "+" is appended when the current passing through the MOS transistor Q1 is directed from the node N3 to N2, and a negative symbol "−" is appended when directed to the opposite direction. A positive symbol "+" is appended when the current passing through the MOS transistor Q2 is directed from the node N2 to N4, and a negative symbol "−" is appended when directed to the opposite direction.

As the result, by an alternating magnetic field that the currents I1 and I2 generate, the magnetization vector of the ferromagnetic layer FM1 of the magnetic tunnel resistive element MR00 is determined to perform writing. The magnetization vector of the ferromagnetic layer FM2 is fixed and remains unchanged.

Through the above-mentioned sequence of operations, information is written on the magnetic tunnel resistive element MR00 (i.e., the address AD00). This written information is taken as "logic 0".

Subsequently, when the switch W0 of the current source with a switch S0 is off, no current I1 passes through the memory line ML0. Thereafter, the potential of the memory line ML0 is precharged up to voltage Vss.

The voltages of the word lines WL0*a* and WL0*b* are both set at voltage Vss such that the MOS transistors Q1 and Q2 enter the off state. Voltage Vss is also supplied to the bit lines BL0*a* and BL0*b*. This period is referred to as a "standby period."

Meanwhile, in order that "logic 1" opposite the above-mentioned logic is written on the magnetic tunnel resistive element MR00, a predetermined voltage is supplied to the switch W0 of the current source with a switch S0, so that the switch W0 is on and the current I1 is passed through the memory line ML0. By the current passing therethrough, the potential of the memory line ML0 changes in such a direction as to be higher than the voltage Vss, as shown in FIG. 18. Then, voltage Vdd is supplied to the bit line BL1 for a predetermined period necessary for writing, whereas voltage Vss is supplied to the bit line BL0 for that period.

Voltage Vdd is supplied to the word lines WL0*a* and WL0*b* for a predetermined period such that the N-channel MOS transistors Q1 and Q2 enter the on state. Thereby, current I2 passes from the node N4 to the node N3. The direction of this current I2 is taken as a negative "−" direction, and referred to as a "current −I2."

The timing chart of current passing through the MOS transistors Q1 and Q2 in FIG. 19 indicates that the current −I2 passes at the above-mentioned timing.

As the result, by an alternating magnetic field that the currents I1 and I2 generate, the magnetization vector of the ferromagnetic layer FM1 of the magnetic tunnel resistive element MR00 is determined to perform writing. Since the current I2 passes from the node N4 to N3, the magnetization vector is different from that in the writing of "logic 0," and "logic 1" opposite "logic 0" is written. At this time, the magnetization vector of the ferromagnetic layer FM2 remains unchanged.

C-2-2. Read Operation

In the case of reading data from the address AD00, as a gate control signal RR0, a predetermined voltage is first supplied such that a MOS transistor Q3 serving as an output switch of a reference voltage source VR1 enters the on state. The period of supplying the predetermined voltage is set so as to be more than the predetermined period necessary for reading.

By this operation, a reference voltage Vref is supplied to the memory line ML0.

It is noted that, before the MOS transistor Q1 is on, little or no current passes through the magnetic tunnel resistive element MR00, thus causing no voltage drop due to the magnetic tunnel resistive element MR00. Therefore, the both of the nodes N1 and N2 are set at voltage Vref.

In the case of reading information into the bit line BL0, by supplying voltage Vdd to the word line WL0*a* and voltage Vss to the word line WL0*b*, the MOS transistor Q1 enters the on state whereas the MOS transistor Q2 retains the off state.

When the MOS transistor Q1 enters the on state, current passes through the magnetic tunnel resistive element MR00, and the current passes from the node N1 via the node N2 to the node N3. The magnitude of this current is determined by the resistance value of the magnetic tunnel resistive element MR00 (i.e., the magnetization direction of the ferromagnetic material).

The current passing through the MOS transistor Q1 by this read operation is indicated as a negative "−" current in FIG. 19.

Since the MOS transistor Q2 is in the off state, almost all the current passing through the magnetic tunnel resistive element MR00 pass via the MOS transistor Q1 to the bit line BL0, as current I00.

By supplying voltage Vdd to a switch BB0 of a buffer with a switch B0, the buffer B0 is on, so that the current I00 is amplified and supplied to the sense amplifier SA1. In the sense amplifier SA1, the amplified current I00 is sensed and amplified to read information.

After the information is read into the bit line BL0, voltage Vss is supplied to the switch BB0 of the buffer with a switch B0, and the buffer B0 enters the off state.

In addition, voltage Vss is also supplied to the word lines WL0*a* and WL0*b*, the MOS transistors Q1 and Q2 enter the off state.

Thereafter, voltage Vss is supplied to the gate control signal RR1 of the MOS transistor Q3 that is the output switch of the reference voltage source VR1, and the MOS transistor Q3 enters the off state. The potential of the memory line ML0 is precharged up to voltage Vss.

As the result, the voltage Vss is supplied to the word lines WL0*a* and WL0*b*, and to the bit lines BL0 and BL1, and the potential of the memory line ML0 is precharged up to voltage Vss, thereby initiating the standby period.

Since the current source with a switch S1 and a MOS transistor Q31 serving as the output switch of the reference voltage source VR are independent of the data write/read operation to the address AD00, the voltage supplied to the switch W1 of the current source with a switch S1, as well as the gate control signal RR1 of the MOS transistor Q31, retain the state of voltage Vss. The memory line ML1 also retains the state of voltage Vss.

In order to read information into the bit line BL1, voltage Vss is supplied to the word line WL0*a* and the voltage Vdd to the word line WL0*b*, so that the MOS transistor Q2 enters the on state, and current passes through the magnetic tunnel resistive element MR00, and the current passes from the node N1 via the node N2 to the node N4. The magnitude of this current is determined by the resistance value of the magnetic tunnel resistive element MR00 (i.e., the magnetization direction of the ferromagnetic material).

The current passing through the MOS transistor $Q_2$ by this read operation is indicated as a positive "+" current in FIG. 19.

C-2-3. Asynchronous Read

A description will be given of the operation of reading information from memory cells at different addresses sharing a bit line, at independent timings (i.e., asynchronously). The following example is the operation of reading information of the magnetic tunnel resistive elements MR00 and MR01.

A predetermined voltage is first supplied as gate control signals RR0 and RR1, so that the MOS transistors Q3 and Q31, each serving as an output switch of the reference voltage source VR1, enter the on state. By this operation, a reference voltage Vref is supplied to the memory lines ML0 and ML1.

Then, voltage Vdd is supplied to the word line WL0*a*, and voltage Vss is supplied to the word line WL0*b*, so that the MOS transistors Q1 of the addresses AD00 and AD01 enter the on state whereas the MOS transistors Q2 of the addresses AD00 and AD01 retain the off state.

When the MOS transistors Q1 enter the on state, current passes through the magnetic tunnel resistive elements MR00 and MR01. In the address AD00, the current passes from the node N1 via the node N2 to the node N3 whereas in the address AD01, the current passes from the node N10 via the node N9 to the node N4. In the address AD01, the direction of current passing from the node N4 to the node N9 is taken as a "positive"+"direction."

In FIG. 19, a positive symbol "+" is appended when the current passing through the MOS transistor Q1 of the address AD01 is directed from the node N4 to the node N9, and a negative symbol "−" is appended when directed to the opposite direction.

As the result, the information on the magnetic resistive element MR00 is read into the bit line BL0, and the information on the magnetic resistive element MR01 is read into the bit line BL1.

The current passing through the MOS transistors Q1 of the addresses AD00 and AD01 by this read operation is denoted by a negative "−" current in FIG. 19.

Then, by supplying voltage Vdd to the switches BB0 and BB1 of the buffers with a switch B0 and B1, the buffers B0 and B1 are on, so that currents I00 and I01 are amplified and supplied to the respective sense amplifiers SA1, by which these currents are sensed and amplified to read information. Thereafter, the MRAM 300 retains the standby state until the next write or read operation.

In the foregoing, the operation of reading asynchronously the information of the magnetic tunnel resistive elements MR00 and MR01 has been described. It is of course possible to read asynchronously information on the magnetic tunnel resistive elements MR00 and MR10, as previously stated in the first preferred embodiment. Its operation is the same as that described with reference to FIG. 11.

C-3. Operation Effect

As described above, in the MRAM 300, the paired bit lines are provided to a single memory cell, and the switch element is interposed between the magnetic tunnel resistive element and each of two bit lines. Therefore, when information on the magnetic tunnel resistive element is read, it is possible to read information at independent timings (asynchronously) from memory cells at different addresses sharing the bit line, by controlling such that the switch elements are selectively on.

Further, adjacent memory cells disposed in different bit string share the bit line disposed therebetween. This configuration enables to reduce the number of bit lines and reduce the area occupied by the memory region. Even in the adjacent memory cells in different bit strings, it is possible to read information at independent timings (asynchronously).

C-4. Modification

In the above-mentioned MRAM 300, the magnetic resistive elements MR00, MR10, MR01, and MR11 are disposed at the same layer as the gate electrodes of the MOS transistors, as described with reference to FIG. 17. In an alternative, it is possible to employ such a configuration as in a MRAM 300A shown in FIG. 20.

Figure 20:
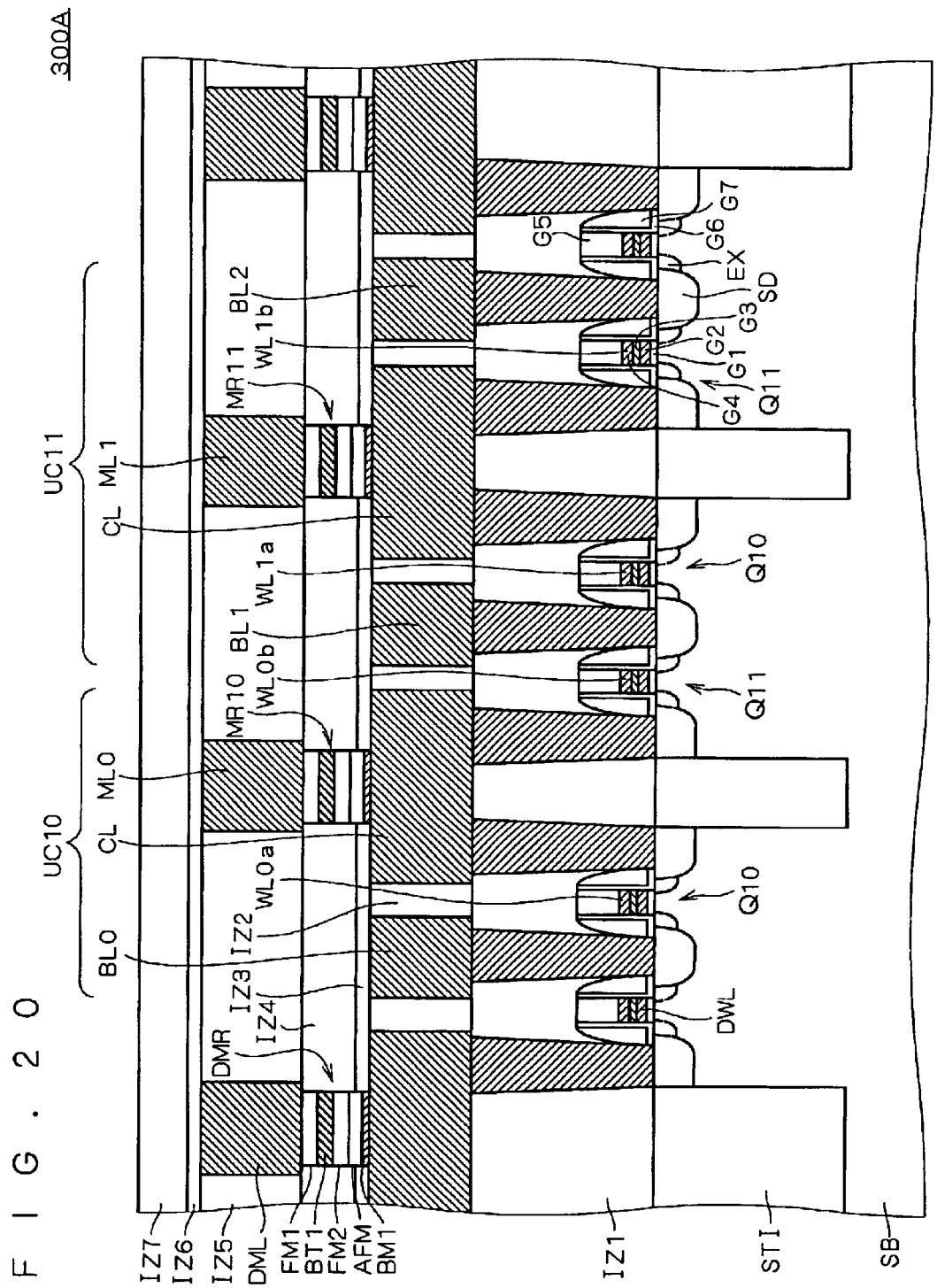
FIG. 20 is a sectional view of the configuration of a modified MRAM in the third preferred embodiment.

FIG. 20 is a diagram corresponding to FIG. 17, wherein like parts are identified by the same reference numerals as in FIG. 17. A description of the like parts will be omitted in the following.

Referring to FIG. 20, in the MRAM 300A, the magnetic resistive elements MR00, MR10, MR01, and MR11 (only MR10 and MR11 are shown in FIG. 17) are disposed on top of a layer where bit lines BL0, BL1, and BL2 are formed.

Specifically, the respective source/drain layers SD of the MOS transistors Q10 and Q11 are connected to contact plugs PG1 made of an electroconductive material. Two contact plugs PG1 connected to the adjacent source/drain layers SD with an element isolation insulating film STI sandwiched therebetween are connected to a common wiring CL.

The common wiring CL is disposed in the same layer and made of the same material as the bit lines, in order to electrically connect the above two contact plugs PG1.

The contact plugs PG1 not being connected to the common wiring CL are connected to bit lines BL0 and BL1 in a unit cell UC10, and to bit lines BL1 and BL2 in a unit cell UC11.

Magnetic tunnel resistive elements MR10 and MR11 are disposed above the common wiring CL with a barrier metal layer BM1 interposed therebetween. The magnetic tunnel resistive elements MR10 and MR11 can be made by stacking an antiferromagnetic layer AFM, ferromagnetic layer FM2, insulating film BT1, and ferromagnetic layer FM1 in this order named.

The ferromagnetic layers FM1 of the magnetic tunnel resistive elements MR10 and MR11 are connected to memory lines ML0 and ML1, respectively.

The magnetic tunnel resistive elements MR10 and MR11 are disposed in interlayer insulating films IZ3 and IZ4. The memory lines ML0 and ML1 are disposed in an interlayer insulating film IZ5. Interlayer insulating films IZ6 and IZ7 are stacked in this order on the interlayer insulating film IZ5.

Although the foregoing description is directed to the configuration of the unit cells UC10 and UC11, other unit cells have the same configuration, and this is true for a dummy region. The operation of the MRAM 300A is the same as that of the MRAM 300.

In the MRAM 300A, the magnetic tunnel resistive elements are disposed above the layer of bit lines, and therefore, they are to be formed after forming the bit lines.

If the magnetic tunnel resistive element is subject to a temperature higher than Curie temperature, the magnetic material will lose magnetic properties. However, even if it does not reach Curie temperature, a longer thermal treatment and frequent thermal treatment might gradually degrade the magnetization strength of the magnetic material and deteriorate the characteristic features of the magnetic tunnel resistive element. In the MRAM manufacturing steps, the magnetic tunnel resistive element is preferably formed in a later step. The configuration of the MRAM 300A is effective in this point.

D. Fourth Preferred Embodiment

D-1. Device Configuration

Figure 21:
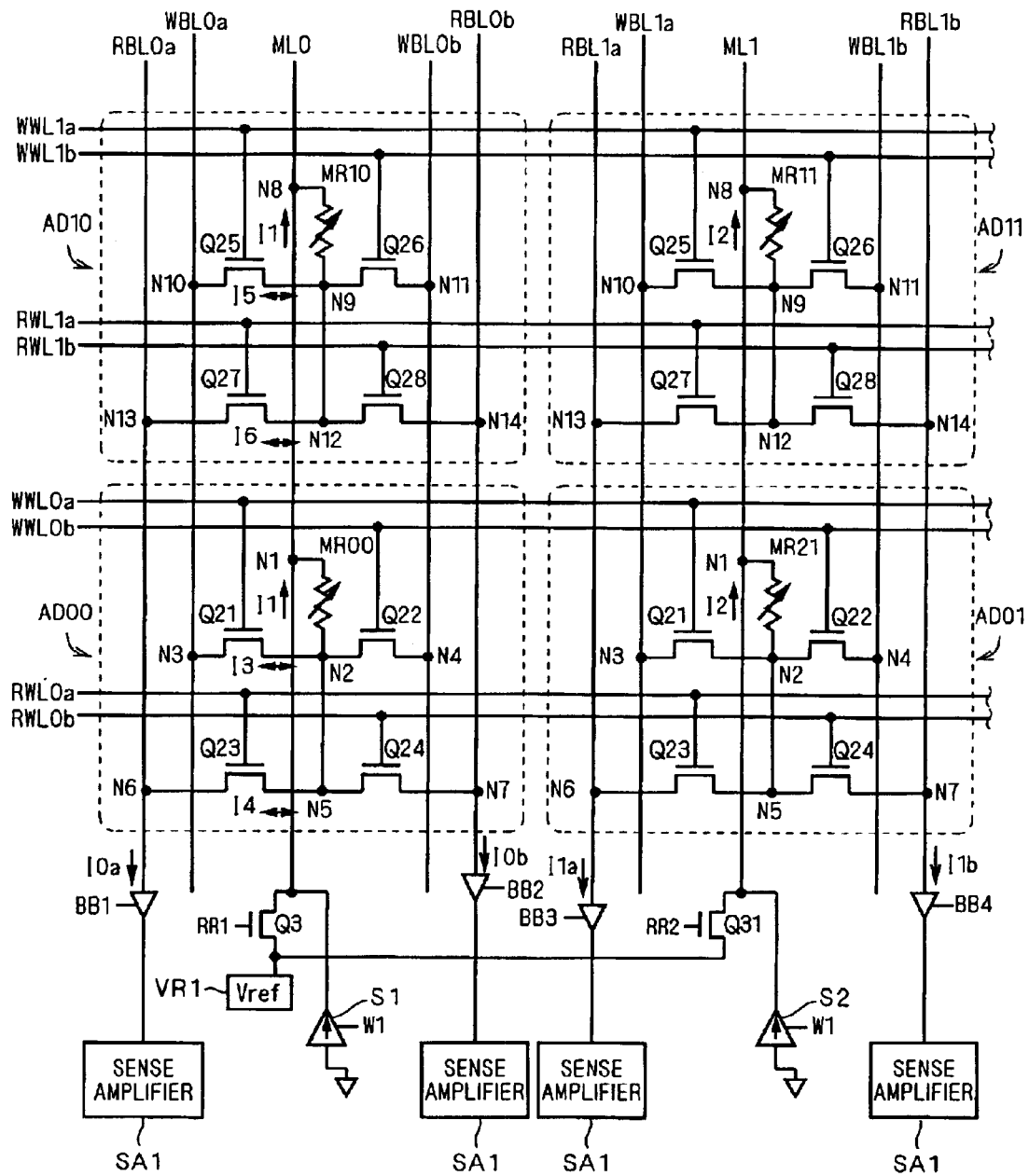
FIG. 21 is a diagram showing a circuit configuration of a MRAM according to a fourth preferred embodiment of the present invention.

FIG. 21 shows a circuit diagram of a MRAM 400 according to a fourth preferred embodiment of the present invention.

In FIG. 21, four memory cells of addresses AD00, AD10, AD01, and AD11 are shown, in which a magnetic resistive element is disposed between a memory line and bit line, and denoted by the variable resistance symbol, as in the case with the MRAM 100 described in the first preferred embodiment. The configuration of the magnetic resistive element is the same as that of the MRAM 100 described with reference to FIG. 6.

Referring to FIG. 21, the memory cell of the address AD00 has N-channel MOS transistors Q21 and Q22 connected in series that are disposed between bit lines WBL0a and WBL0b; and N-channel MOS transistors Q23 and Q24 connected in series and a magnetic tunnel resistive element MR00 that are disposed between bit lines RBL0a and RBL0b. The gate electrodes of the MOS transistors Q21 and Q22 are connected to word lines WWL0a and WWL0b, respectively. The gate electrodes of the MOS transistors Q23 and Q24 are connected to word lines RWL0a and RWL0b, respectively.

The magnetic tunnel resistive element MR00 is connected between a memory line ML0 and a connection node of the MOS transistors Q21 and Q22. Hereinafter, the connection node between the magnetic tunnel resistive element MR00 and memory line ML0 is called "node N1," that between the MOS transistors Q21 and Q22 is called "node N2," that between the MOS transistor Q21 and bit line WBL0a is called "node N3," that between the MOS transistor Q22 and bit line WBL0b is called "node N4," that between the MOS transistors Q23 and Q24 is called "node N5," that between the MOS transistor Q23 and bit line RBL0a is called "node N6," and that between the MOS transistor Q24 and bit line RBL0b is called "node N7." It is noted that the node N2 is electrically connected to the node N5.

The memory cell of the address AD01 has N-channel MOS transistors Q21 and Q22 connected in series that are disposed between bit lines WBL1a and WBL1b; and N-channel MOS transistors Q23 and Q24 connected in series and a magnetic tunnel resistive element MR01 that are disposed between bit lines RBL1a and RBL1b. The gate electrodes of the MOS transistors Q21 and Q22 are connected to the word lines WWL0a and WWL0b, respectively. The gate electrodes of the MOS transistors Q23 and Q24 are connected to the word lines RWL0a and RWL0b, respectively.

The magnetic tunnel resistive element MR01 is connected between a memory line ML1 and a connection node of the MOS transistors Q21 and Q22. Hereinafter, the connection node between the magnetic tunnel resistive element MR01 and memory line ML1 is called "node N1," that between the MOS transistors Q21 and Q22 is called "node N2," that between the MOS transistor Q21 and bit line WBL1a is called "node N3," that between the MOS transistor Q22 and bit line WBL1b is called "node N4," that between the MOS transistors Q23 and Q24 is called "node N5," that between the MOS transistor Q23 and bit line RBL1a is called "node N6," and that between the MOS transistor Q24 and bit line RBL1b is called "node N7." It is noted that the node N2 is electrically connected to the node N5.

The memory cell of the address AD10 has N-channel MOS transistors Q25 and Q26 connected in series that are disposed between the bit lines WBL0a and WBL0b; and N-channel MOS transistors Q27 and Q28 connected in series and a magnetic tunnel resistive element MR10 that re disposed between the bit lines RBL0a and RBL0b. The gate electrodes of the MOS transistors Q25 and Q26 are connected to the word lines WWL1a and WWL1b, respectively. The gate electrodes of the MOS transistors Q27 and Q28 are connected to the word lines RWL1a and RWL1b, respectively.

The magnetic tunnel resistive element MR10 is connected between the memory line ML0 and a connection node of the MOS transistors Q25 and Q26. Hereinafter, the connection node between the magnetic tunnel resistive element MR10 and memory line ML0 is called "node N8," that between the MOS transistors Q25 and Q26 is called "node N9," that between the MOS transistor Q25 and bit line WBL0a is called "node N10," that between the MOS transistor Q26 and bit line WBL0b is called "node N11," that between the MOS transistors Q27 and Q28 is called "node N12," that between the MOS transistor Q27 and bit line RBL0a is called "node N13," and that between the MOS transistor Q28 and bit line RBL0b is called "node N14." It is noted that the node N9 is electrically connected to the node N12.

The memory cell of the address AD11 has N-channel MOS transistors Q25 and Q26 connected in series that are disposed between the bit lines WBL1a and WBL1b; and N-channel MOS transistors Q27 and Q28 connected in series and a magnetic tunnel resistive element MR11 that are disposed between bit lines RBL1a and RBL1b. The gate electrodes of the MOS transistors Q25 and Q26 are connected to the word lines WWL1a and WWL1b, respectively. The gate electrodes of the MOS transistors Q27 and Q28 are connected to the word lines RWL1a and RWL1b, respectively.

The magnetic tunnel resistive element MR11 is connected between the memory line ML1 and a connection node of the MOS transistors Q25 and Q26. Hereinafter, the connection node between the magnetic tunnel resistive element MR11 and memory line ML0 is called "node N8," that between the MOS transistors Q25 and Q26 is called "node N9," that between the MOS transistor Q25 and bit line WBL1a is called "node N10," that between the MOS transistor Q26 and bit line WBL1b is called "node N11," that between the MOS transistors Q27 and Q28 is called "node N12," that between the MOS transistor Q27 and bit line RBL1a is called "node N13," and that between the MOS transistor Q28 and bit line RBL1b is called "node N14." It is noted that the node N9 is electrically connected to the node N12.

The memory lines ML0 and ML1 are connected in common to a reference voltage source VR1 via the N-channel MOS transistors Q3 and Q31, respectively, and also connected to current sources with a switch S1 and S2, respectively.

The bit lines RBL0a, RBL0b, RBL1a, and RBL1b are bit lines for reading information and connected to inputs of buffers with a switch B1, B2, B3, and B4, respectively. Currents I0a, I0b, I1a, and I1b are supplied to and amplified by the buffers B1 to B4, respectively, and the resulting outputs are then supplied to the corresponding sense amplifier SA1.

The bit lines WBL0a, WBL0b, WBL1a, and WBL1b are bit lines for writing information.

The word lines RWL0a, RWL0b, RWL1a, and RWL1b are word lines for reading information. The word lines WWL0a, WWL0b, WWL1a, and WWL1b are word lines for writing information D-2. Operation The operation of the MRAM 400 will be described using timing charts of FIGS. 22 and 23, while by referring to FIG. 21. The following example is directed to the data write/read operation to the address AD00.

D-2-1. Write Operation

Figure 22:
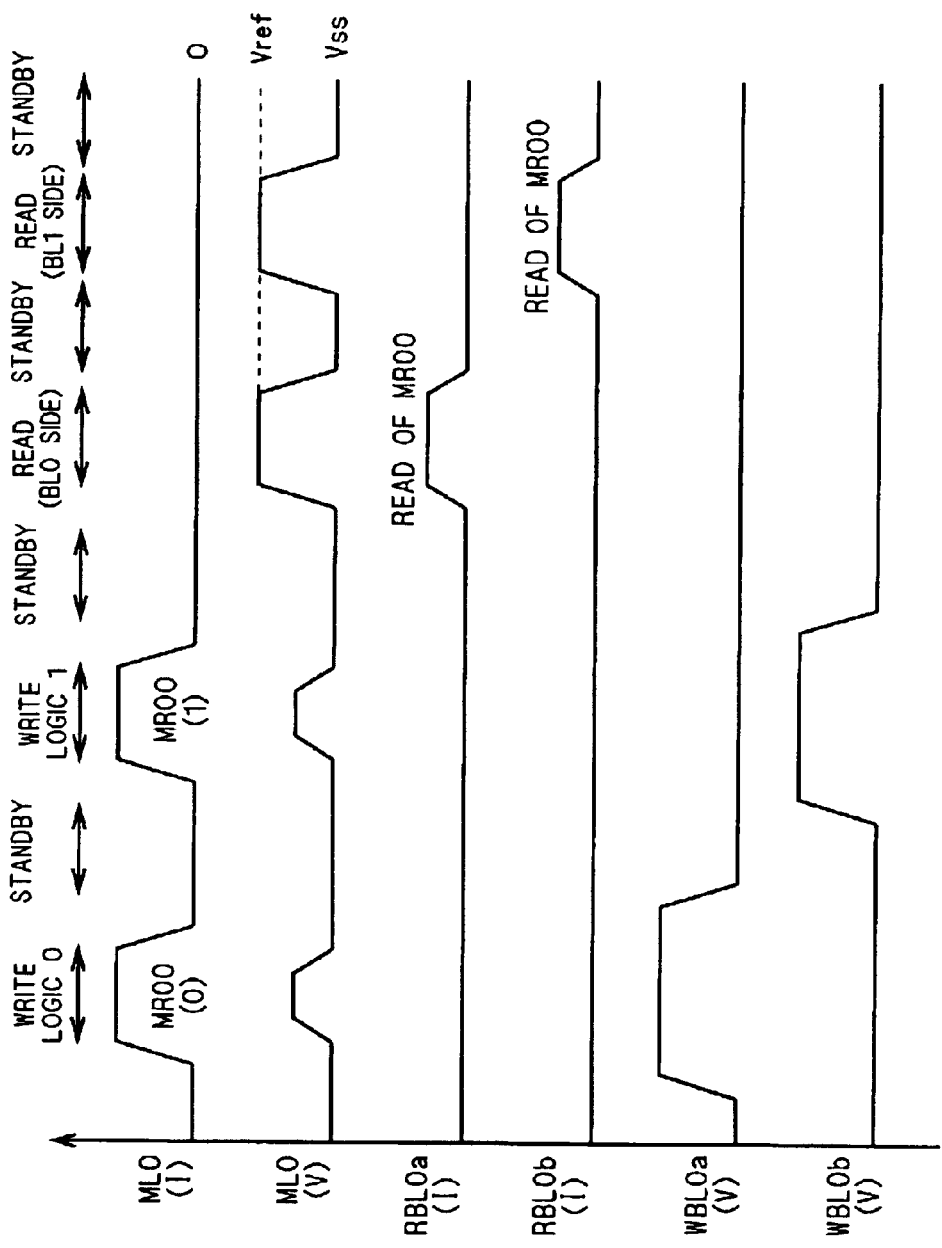
FIGS. 22 and 23 are timing charts illustrating the operation of the MRAM in the fourth preferred embodiment.
Figure 23:
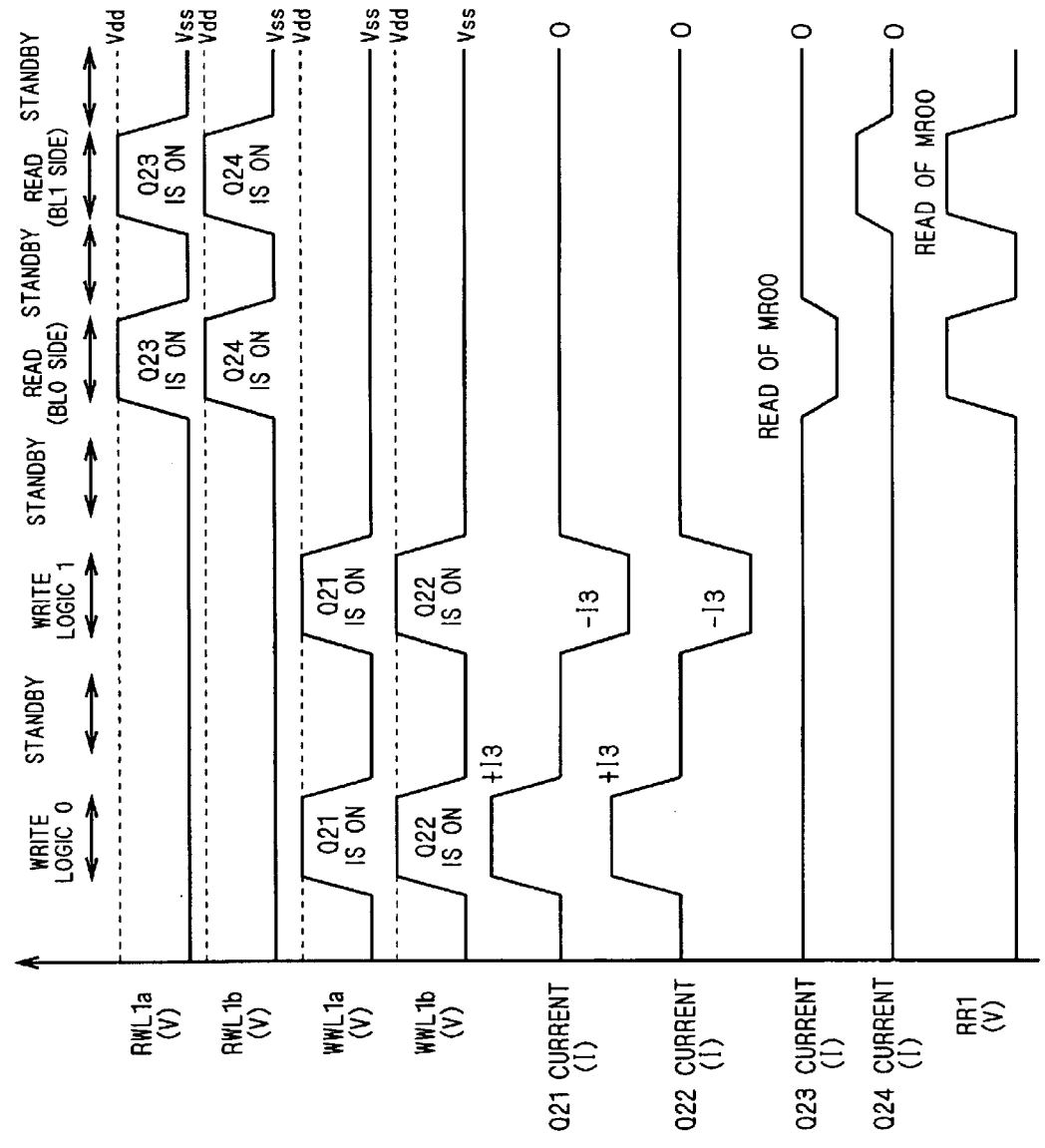

FIGS. 22 and 23 are timing charts of various voltages and currents at the time of data write/read operation to the address AD00 in the MRAM 400.

In the case of writing data to the address AD0, a predetermined voltage is supplied to a switch W1 of a current source with a switch S1 such that the switch W1 is on, and current I1 is passed to the memory line ML0. By the current passing therethrough, the potential of the memory line ML0 changes in such a direction as to be higher than voltage Vss, as shown in FIG. 22. Voltage Vdd is supplied to the bit line WBL0a for a predetermined period necessary for writing, whereas voltage Vss is supplied to the bit line WBL1b for that period.

Subsequently, voltage Vdd is supplied to both of the word lines WWL0a and WWL0b for a predetermined period such that MOS transistors Q21 and Q22 enter the on state. Thereby, current I3 passes from the node N3 to node N4. The direction of the current I3 is taken as a positive "+" direction, and referred to as a "current +I3."

FIG. 23 shows a timing chart of current passing through the MOS transistors Q21 and Q22, and indicates that the current +I3 passes at the above-mentioned timing. In FIG. 23, a positive symbol "+" is appended when the current passing through the MOS transistor Q21 is directed from the node N3 to N2, and a negative symbol "−" is appended when directed to the opposite direction; and a positive symbol "+" is appended when the current passing through the MOS transistor Q22 is directed from the node N2 to N4, and the negative symbol "−" is appended when directed to the opposite direction.

As the result, by an alternating magnetic field that the currents I1 and I3 generate, the magnetization vector of the ferromagnetic layer FM1 of the magnetic tunnel resistive element MR00 is determined to perform writing. The magnetization vector of the ferromagnetic layer FM2 is fixed and remains unchanged.

Through the above-mentioned sequence of operations, information is written on the magnetic tunnel resistive element MR (i.e., the address AD00). This written information is taken as "logic 0".

Subsequently, when the switch W1 of the current source with a switch S1 is off, no current I1 passes through the memory line ML0. Thereafter, the potential of the memory line ML0 is precharged up to voltage Vss.

The voltages of the word lines WWL0a and WWL0b are both set at voltage Vss such that the MOS transistors Q21 and Q22 enter the off state. Voltage Vss is also supplied to the bit lines WBL0a and WBL0b. This period is referred to as a "standby period."

Meanwhile, when "logic 1" opposite the above-mentioned logic is written on the magnetic tunnel resistive element MR00, a predetermined voltage is supplied to the switch W1 of the current source with a switch S1 so that the switch W1 is on, and the current I1 is passed through the memory line ML0. By the current passing therethrough, the potential of the memory line ML0 changes in such a direction as to be higher than the voltage Vss, as shown in FIG. 22. Then, voltage Vdd is supplied to the bit line WBL0b for a predetermined period necessary for writing, whereas voltage Vss is supplied to the bit line WBL0a for that period.

Subsequently, voltage Vdd is supplied to the word lines WWL0a and WWL0b for a predetermined period so that the N-channel MOS transistors Q21 and Q22 enter the on state. Thereby, current I3 passes from the node N4 to the node N3. The direction of this current I3 is taken as a negative "−" direction, and referred to as a "current −I3."

The timing chart of current passing through the MOS transistors Q21 and Q22, as shown in FIG. 23, indicates that the current −I3 passes at the above-mentioned timing.

As the result, by an alternating magnetic field that the currents I1 and I3 generate, the magnetization vector of the ferromagnetic layer FM1 of the magnetic tunnel resistive element MR00 is determined to perform writing. Since the current I3 passes from the node N4 to N3, the magnetization vector is different from that in the writing of "logic 0," thereby to write "logic 1" opposite "logic 0." At this time, the magnetization vector of the ferromagnetic layer FM2 remains unchanged.

D-2-2. Read Operation

In the case of reading data from the address AD00, as a gate control signal RR1, a predetermined voltage is first supplied to the MOS transistor Q3 serving as an output switch of a reference voltage source VR1 so that the MOS transistor Q3 enters the on state. The period of supplying the predetermined voltage is set so as to be more than the predetermined period necessary for reading, as shown in FIG. 23.

By this operation, the reference voltage Vref is supplied to the memory line ML0.

In the case of reading information into the bit line RBL0a, by supplying voltage Vdd to the word line RWL0a and the voltage Vss to the word line RWL0b, the MOS transistor Q23 enters the on state whereas the MOS transistor Q24 retains the off state.

When the MOS transistor Q23 enters the on state, current passes through the magnetic tunnel resistive element MR00 and the current is passed from the node N1 via the nodes N2 and N5 to the node N6. The magnitude of this current is determined by the resistance value of the magnetic tunnel resistive element MR00 (i.e., the magnetization direction of the ferromagnetic material).

Referring to FIG. 23, the current that is passed through the MOS transistor Q23 by this read operation is indicated as a negative "−" current.

Since the MOS transistor Q24 is in the off state, almost all the current passing through the magnetic tunnel resistive element MR00 pass via the MOS transistor Q23 to the bit line RBL0a, as current I0a.

By supplying voltage Vdd to a switch BB1 of a buffer with a switch B1, the buffer B1 is on so that the current I0a is amplified and supplied to the sense amplifier SA1. In the sense amplifier SA1, the amplified current I0a is sensed and amplified to read information.

After the information is read into the bit line RBL0a, voltage Vss is supplied to the switch BB1 of the buffer with a switch B1, and the buffer B1 enters the off state.

In addition, voltage Vss is supplied to the word lines RWL0a and RWL0b, so that the MOS transistors Q23 and Q24 enter the off state.

Thereafter, voltage Vss is supplied to the gate control signal RR1 of the MOS transistor Q3 that is the output switch of the reference voltage source VR1, and the MOS transistor Q3 enters the off state. The potential of the memory line ML0 is precharged up to voltage Vss.

As the result, voltage Vss is supplied to the word lines RWL0a and RWL0b, and to the bit lines RBL0a and RBL0b, so that the potential of the memory line ML0 is precharged up to voltage Vss, thereby initiating the standby period.

In order to read information into the bit line RB0b, voltage Vss is supplied to the word line RWL0a and voltage Vdd to the word line WL0b, so that the MOS transistor Q24 enters the on state. Thereby, current passes through the magnetic tunnel resistive element MR00 and the current passes from the node N1 via the nodes N2 and N5 to the node N7. The magnitude of this current is determined by the resistance value of the magnetic tunnel resistive element MR00 (i.e., the magnetization direction of the ferromagnetic material).

Referring to FIG. 23, the current passing through the MOS transistor Q24 by this read operation is indicated as a positive "+" current.

In addition, in the MRAM 400, a pair of bit lines for writing information, a pair of bit lines for reading information, a pair of word lines for writing information, and a pair of word lines for reading information are provided per magnetic tunnel resistive element. This configuration enables to concurrently write different information onto the magnetic tunnel resistive elements MR00 and MR10, for example.

Specifically, in the state that current I1 is passed from the current source S1 to the memory line ML0, voltage Vdd is supplied to the bit lines WBL0a and RBL0b, Vss is supplied to the bit lines WBL0b and RBL0a, and voltage Vdd is supplied to the word lines RWL1a and RWL1b, as well as voltage Vdd to the word lines WWL0a and WWL0b. Thereby, the MOS transistors Q27 and Q28 of the address AD10 enter the on state, and the MOS transistors Q21 and Q22 of the address AD00 enter the on state.

At this moment, the direction of current I5 passing through the MOS transistors Q27 and Q28, and current I3 passing through the MOS transistors Q21 and 22 is reversed from right to left. It is therefore possible to write different information at the same time.

In the above case, the bit lines RBL0a, RBL0b, RBL1a, and RBL1b for reading information function as bit lines for writing information.

Furthermore, in the MRAM 400, four path transistors (the MOS transistors Q21 to Q24 in the address AD00) are provided per magnetic tunnel resistive element. Therefore, in information read operation, information can be read concurrently from plural path transistors in the same bit string.

In the above case, the bit lines WBL0*a*, WBL0*b*, WBL1*a*, and WBL1*b* for writing information function as bit lines for reading information.

It is of course possible that information can be read asynchronously from different memory cells at different addresses in the same bit string.

D-3. Plan Configuration

Figure 24:
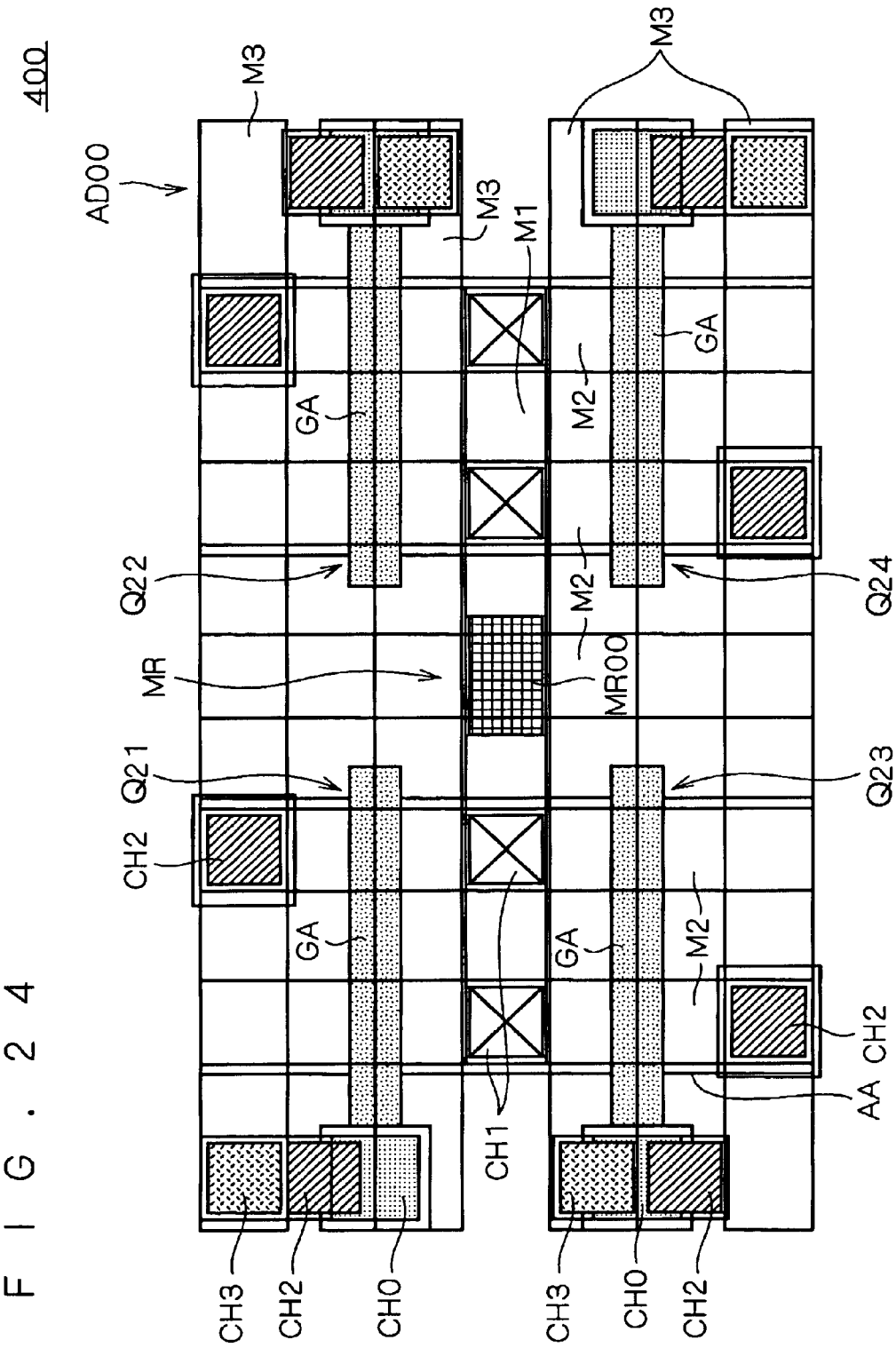
FIG. 24 is a diagram showing a plan layout of one memory cell of the MRAM in the fourth preferred embodiment.

FIG. 24 shows schematically a plan layout of one memory cell constituting the MRAM 400.

Specifically, FIG. 24 shows the state that plan layouts of the respective layers of the memory cell in the address AD00 are overlapped with each other, wherein gate electrodes GA of MOS transistors Q21 to Q24 are disposed in parallel with 2 rows and 2 columns, around a magnetic tunnel resistive element MR00.

That is, the gate electrodes GA of the MOS transistor Q21 and Q23 are disposed in parallel widthwise, and the gate electrodes GA of the MOS transistor Q22 and Q24 are disposed in parallel widthwise. The gate electrodes GA of the MOS transistor Q21 and Q22 are disposed in a row lengthwise, and the gate electrodes GA of the MOS transistor Q23 and Q24 are disposed in a row lengthwise.

Each gate electrode GA is connected via a contact part CH0 to an upper-layer first metal layer M1, the first metal layer M1 is connected via a contact part CH2 to an upper-layer second metal layer M2, and the second metal layer M2 is connected via a contact part CH3 to an upper-layer third metal layer M3.

The magnetic tunnel resistive element MR00 is disposed between the first metal layer M1 and second metal layer M2, and the first metal layer M1 is electrically connected via a contact part CH1 to an active region AA.

Figure 25:
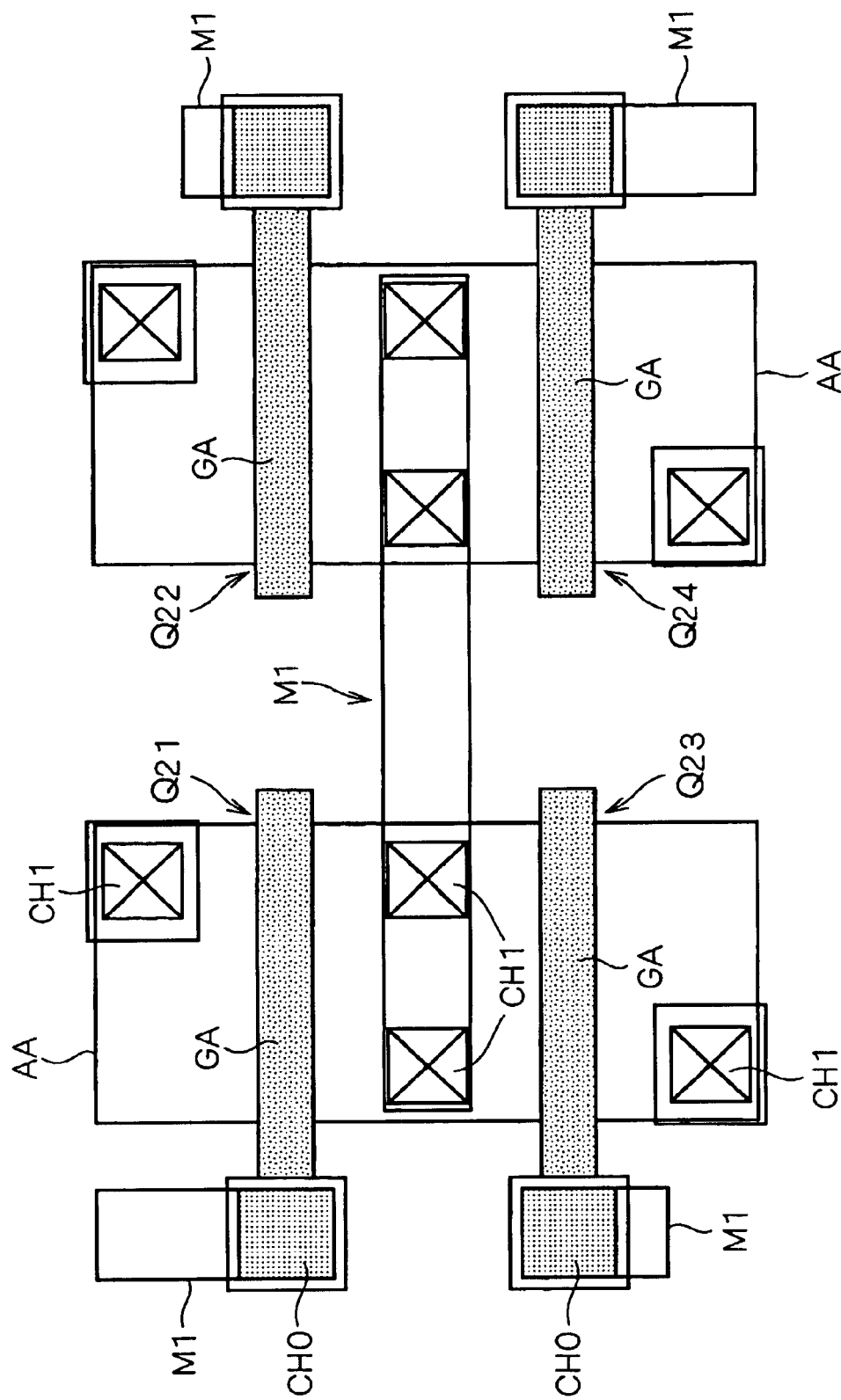
FIG. 25 is a diagram showing a plan layout of the lowermost layer of one memory cell of the MRAM in the fourth preferred embodiment.

FIG. 25 is a plan layout showing the configuration of the first metal layer M1 and the underlying layers, wherein each first metal layer M1 is connected via the contact part CH1 to the active region AA.

Figure 26:
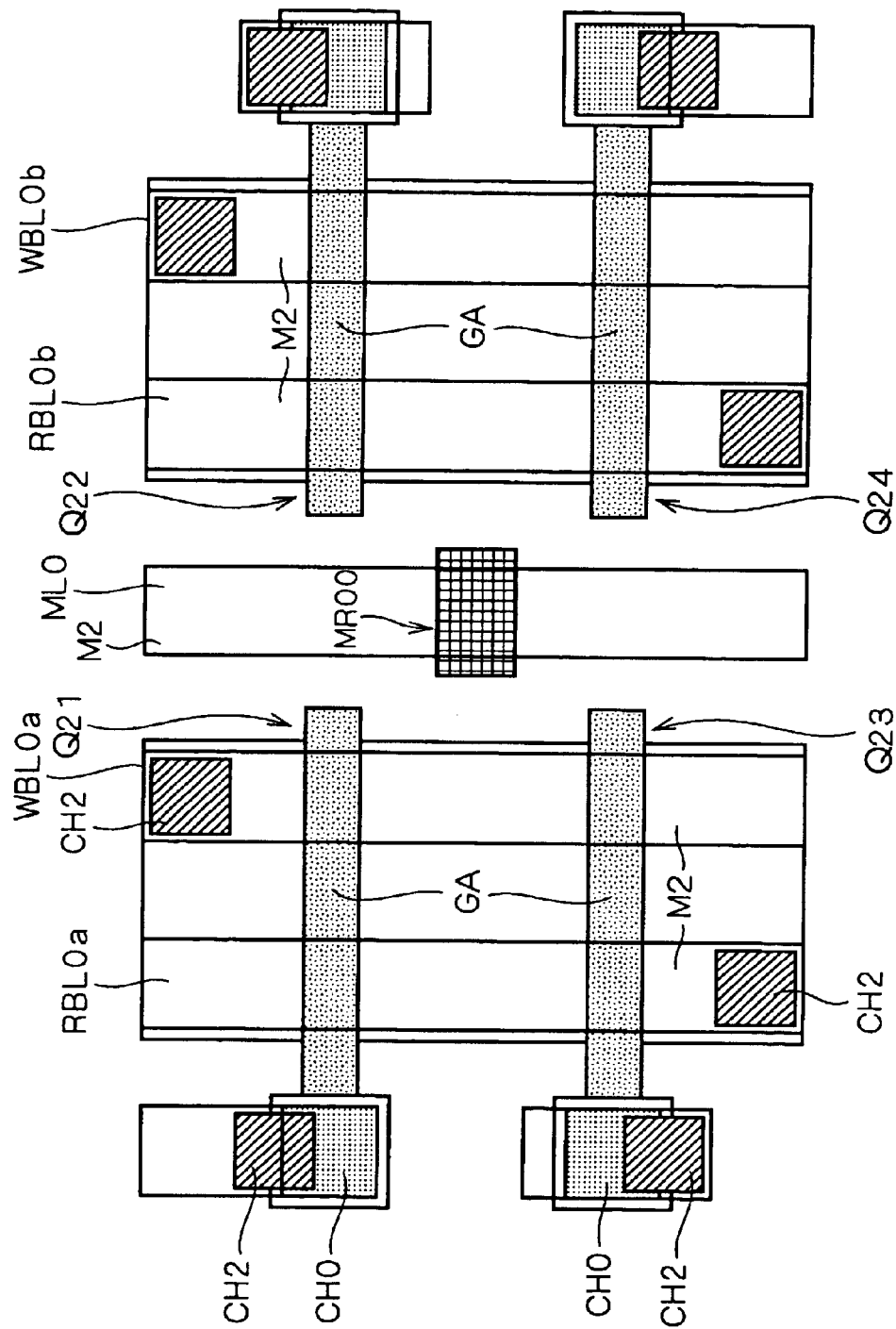
FIG. 26 is a diagram showing a plan layout of bit lines and the underlying layers of one memory cell of the MRAM in the fourth preferred embodiment.

FIG. 26 is a plan layout mainly showing the second metal layer M2. That is, the second metal layer M2 corresponding to a memory line ML0 is disposed above the magnetic tunnel resistive element MR00. Above two active regions AA, a plurality of the second metal layers M2 corresponding to bit lines RBL0*a*, WBL0*a*, RBL0*b*, and WBL0*b* are disposed in this order from the left side as seen in FIG. 26.

The plural second metal layers M2 are disposed in parallel so as to be orthogonal, when viewed from above, to the lengthwise direction of each gate electrode GA.

Figure 27:
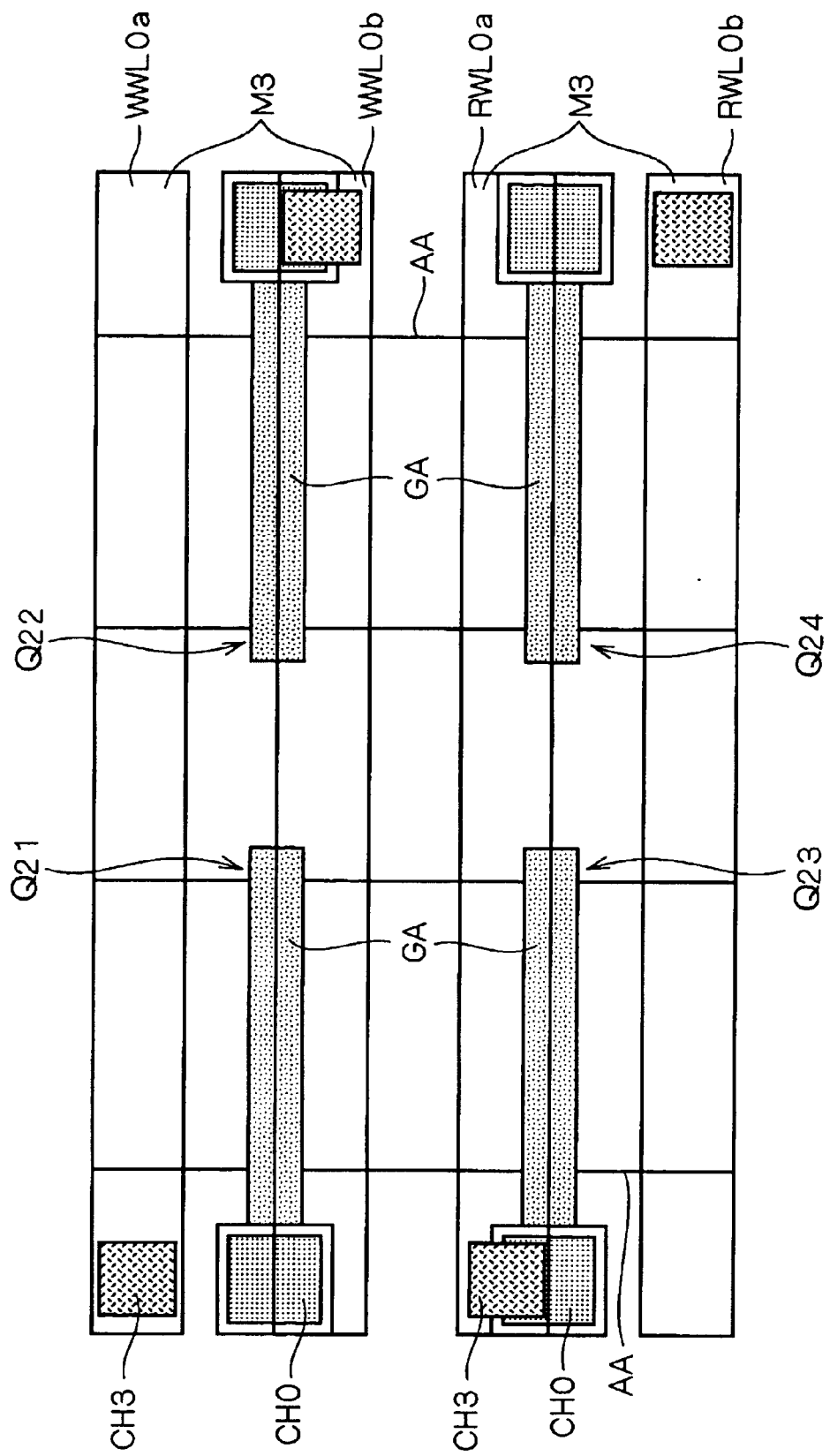
FIG. 27 is a diagram showing a plan layout of word lines and the underlying layers of one memory cell of the MRAM in the fourth preferred embodiment.

FIG. 27 is a plan layout showing mainly the third metal layer M3, wherein a plurality of the third metal layers M3 corresponding to word lines WWL0*a*, WWL0*b*, RWL0*a*, and RWL0*b* are disposed in the order named from the upper side as seen in FIG. 27, so that these lines cross over the two active regions AA. The plural third metal layers M3 are disposed in parallel so as to be parallel, when viewed from above, to the lengthwise direction of each gate electrode GA.

As described above, on the plan layout of the MRAM 400, all the gate electrodes of the MOS transistors in a single memory cell are disposed in parallel with 2 rows and 2 columns around the magnetic tunnel resistive element. It is therefore possible to reduce CD (critical dimension) shift when performing patterning of gate electrodes (including the transfer step and etching step) in the manufacturing steps.

The term "CD shift" is a generic name of the followings: "CD loss" meaning that a finish size is smaller than a designed value; and "CD gain" meaning that a finish size is larger than a designed value.

The reason why the above-mentioned layout configuration reduces the CD shift is that in the memory array as a whole, the gate electrode array pattern is constant thereby to prevent optical standing wave turbulence in a resist transfer step and plasma density deviation in an etching step. These mechanisms are already described as the reason for placing the dummy region in the first preferred embodiment.

D-4. Operation Effect As described above, in the MRAM 400, the two pairs of bit lines are provided per magnetic tunnel resistive element, and the switch element is interposed between the magnetic tunnel resistive element and each of the four bit lines. Therefore, in the case of reading information from the magnetic tunnel resistive element, the information can be read at independent timings (asynchronously) from memory cells at different addresses sharing the bit line, by controlling such that the switch elements are selectively on.

Further, since the two paired word lines are provided to a single magnetic tunnel resistive element, different information can be written concurrently onto two memory cells at two different addresses in the same bit string.

Furthermore, the plan layout is configured such that all the gate electrodes of the MOS transistors in a single memory cell are disposed in parallel with 2 rows and 2 columns around the magnetic tunnel resistive element. This enables to reduce the CD shift when performing patterning of the gate electrodes in the manufacturing steps.

D-5. First Modification

In the configuration of the MRAM 400 shown in FIG. 21, the word lines RWL0*a*, RWL0*b*, RWL10*a*, and RWL1*b* are provided as word lines for reading information, and the word lines WWL0*a*, WWL0*b*, WWL10*a*, and WWL1*b* are provided as word lines for writing information. The MRAM 400 may be configured such that a single word line for writing information is provided per memory cell, as in a MRAM 400A shown in FIG. 28.

Figure 28:
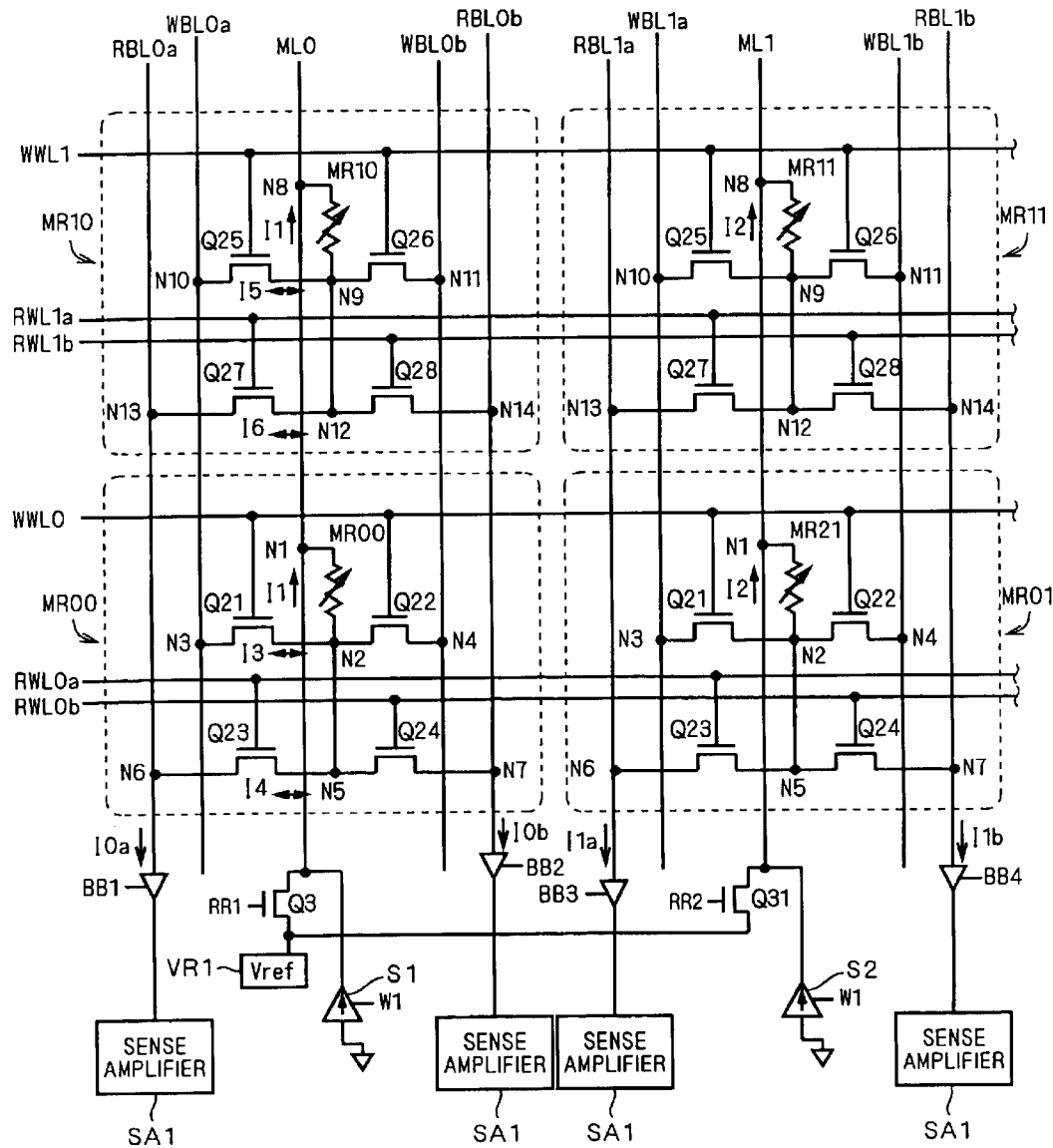
FIG. 28 is a diagram showing a circuit configuration of a first modification of the MRAM in the fourth preferred embodiment.

Specifically, as shown in FIG. 28, in the memory cells of the addresses AD00 and AD01, the gate electrodes of MOS transistors Q21 and Q22 may be connected to a word line WWL0, whereas in the memory cells of the addresses AD10 and AD11, the gate electrodes of MOS transistors Q25 and Q26 may be connected to a word line WWL1. Otherwise, the configuration is the same as that of the MRAM 400 shown in FIG. 21.

With the above configuration, it is impossible to write information concurrently onto memory cells at different addresses in the same bit string. However, it is possible to read information concurrently from memory cells at different addresses in the same bit string. Therefore, the area occupied by the memory area can be reduced by decrement of the number of word lines.

Figure 29:
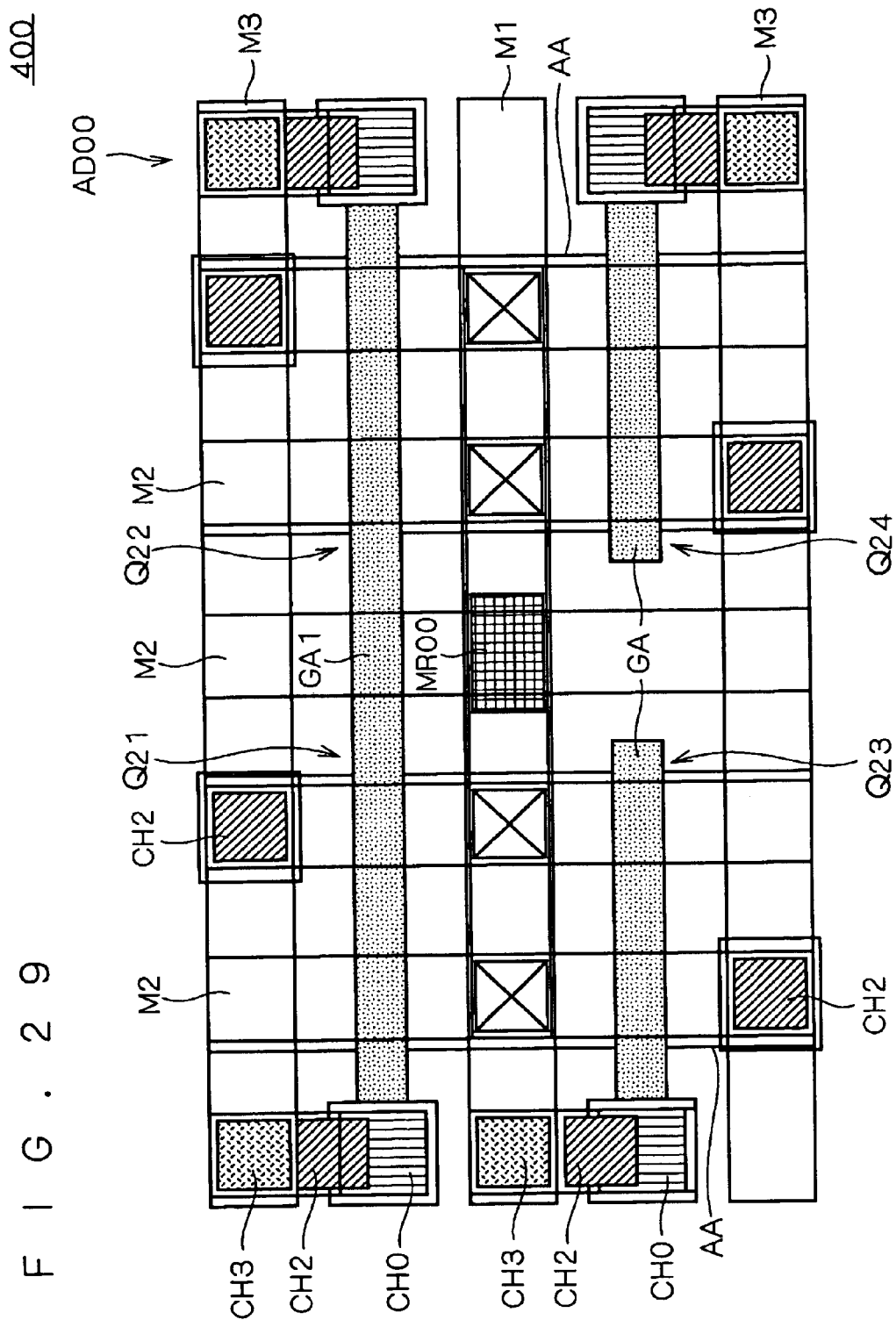
FIG. 29 is a diagram showing a plan layout of one memory cell of the first modification of the MRAM in the fourth preferred embodiment.

FIG. 29 shows schematically a plan layout of one memory cell constituting the MRAM 400A.

Specifically, FIG. 29 shows the state that plan layouts of the respective layers of the memory cell of the address AD00 are overlapped with each other. The respective gate electrodes GA of MOS transistor Q23 and Q24 are disposed widthwise in parallel to a common gate electrode GA1 of MOS transistors Q21 and Q22. The gate electrodes GA of the MOS transistors Q23 and Q24 are disposed in a row lengthwise. A magnetic tunnel resistive element MR00 is disposed centrally in an area surrounded by the gate electrode GA1 and the array of the gate electrodes GA. In other words, the gate electrode GA1 and gate electrodes GA are disposed in bilateral symmetry.

The gate electrode GA1 and each gate electrode GA are connected via a contact part CH0 to an upper-layer first metal layer M1. The first metal layer M1 is connected via a contact part CH2 to an upper-layer second metal layer M2. The second metal layer M2 is connected via a contact part CH3 to an upper-layer third metal layer M3.

The magnetic tunnel resistive element MR00 is disposed between the first metal layer M1 and second metal layer M2, and the first metal layer M1 is electrically connected via a contact part CH1 to an active region AA.

Figure 30:
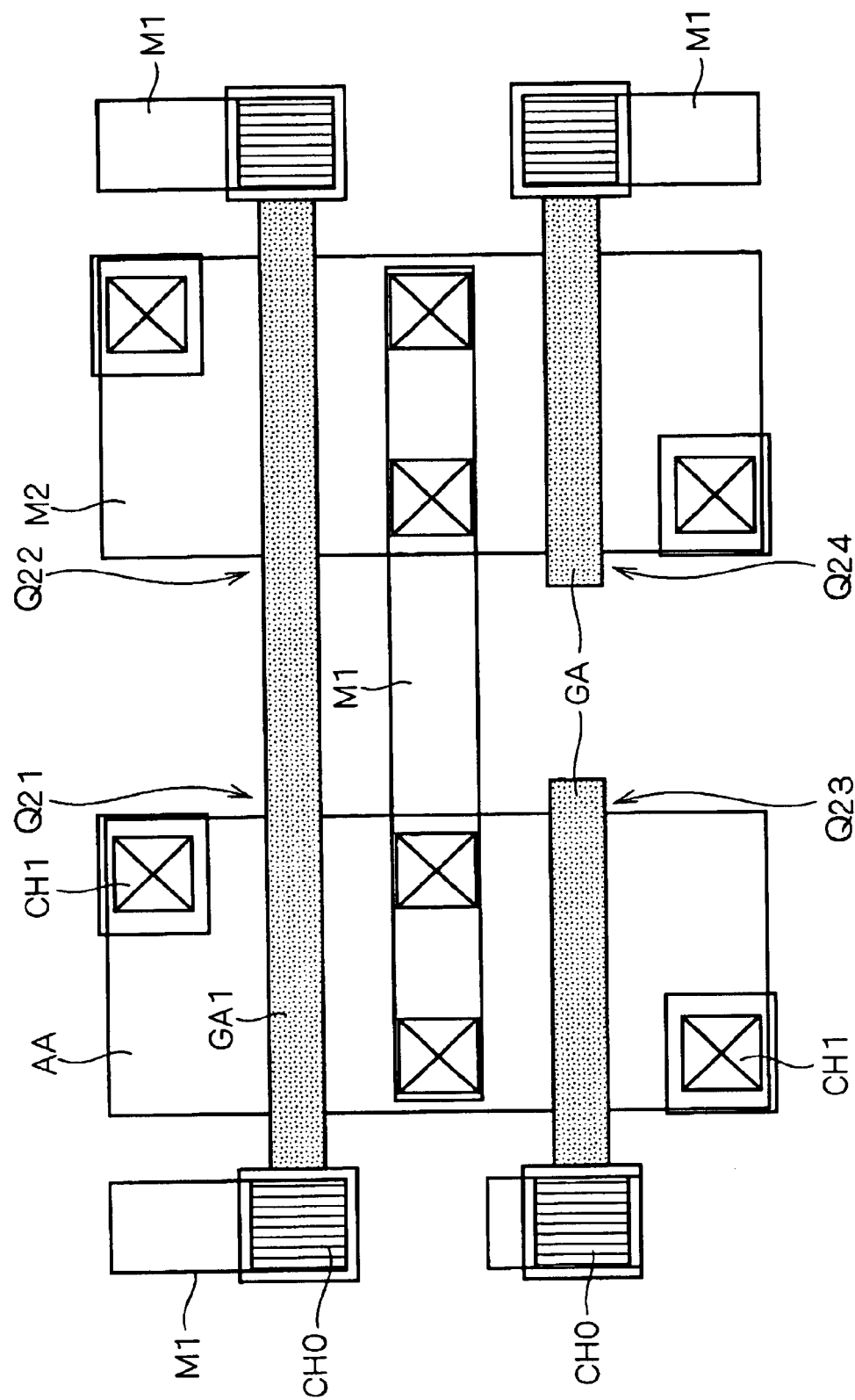
FIG. 30 is a diagram showing a plan layout of the lowermost layer of one memory cell of the first modification of the MRAM in the fourth preferred embodiment.

FIG. 30 is a plan layout showing the configuration of the first metal layer M1 and the underlying layers, wherein each first metal layer M1 is connected via a contact part CH1 to the active region AA.

Figure 31:
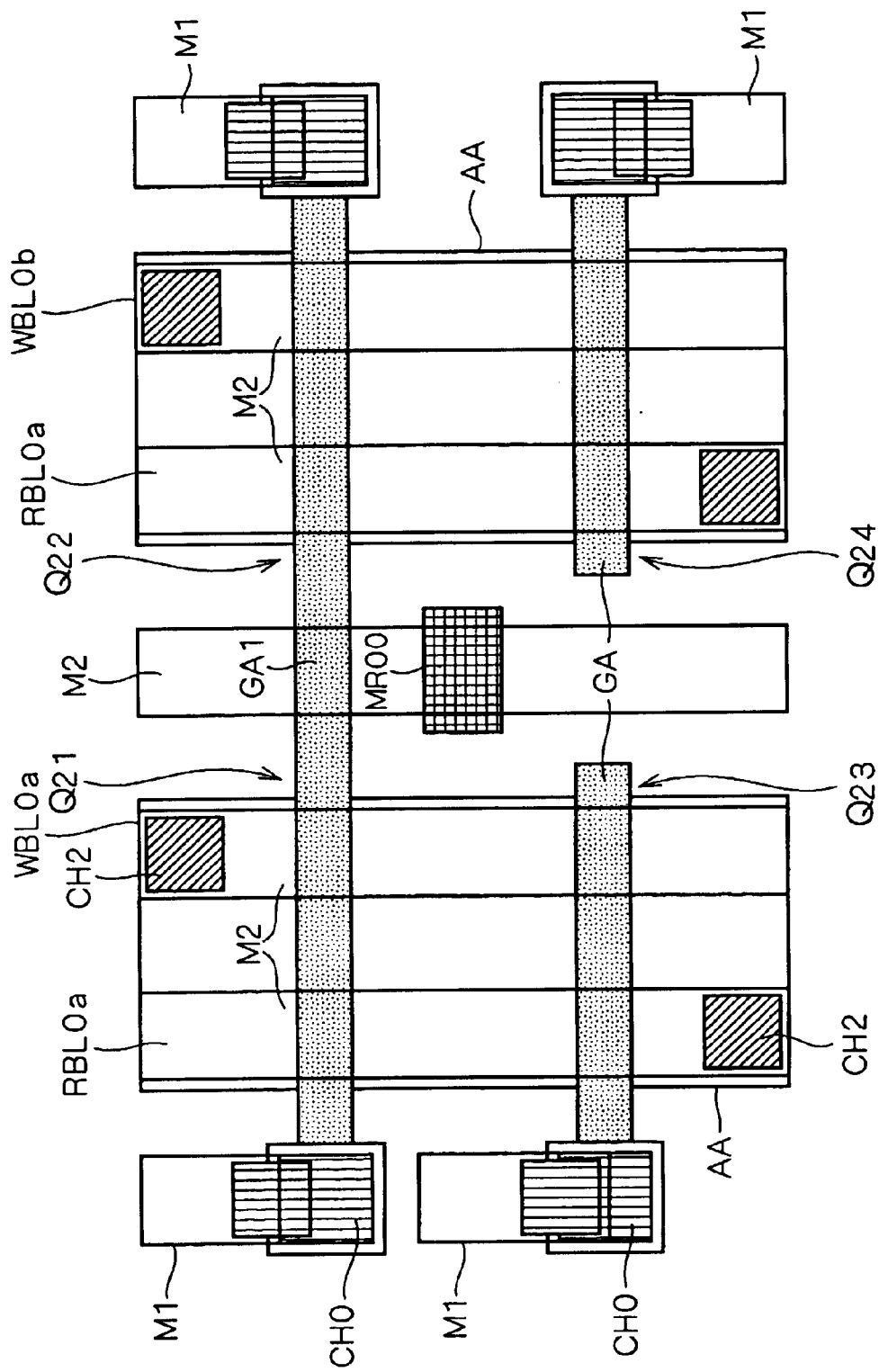
FIG. 31 is a diagram showing a plan layout of bit lines and the underlying layers of one memory cell of the first modification of the MRAM in the fourth preferred embodiment.

FIG. 31 is a plan layout mainly showing the second metal layer M2. That is, the second metal layer M2 corresponding to a memory line ML0 is disposed on the magnetic tunnel resistive element MR00. Above two active regions AA, a plurality of the second metal layers M2 corresponding to bit lines RBL0a, WBL0a, RBL0b, and WBL0b are disposed in this order from the left side as seen in FIG. 31. The plural second metal layers M2 are disposed in parallel so as to be orthogonal, when viewed from above, to the lengthwise direction of the gate electrode GA1 and gate electrodes GA.

Figure 32:
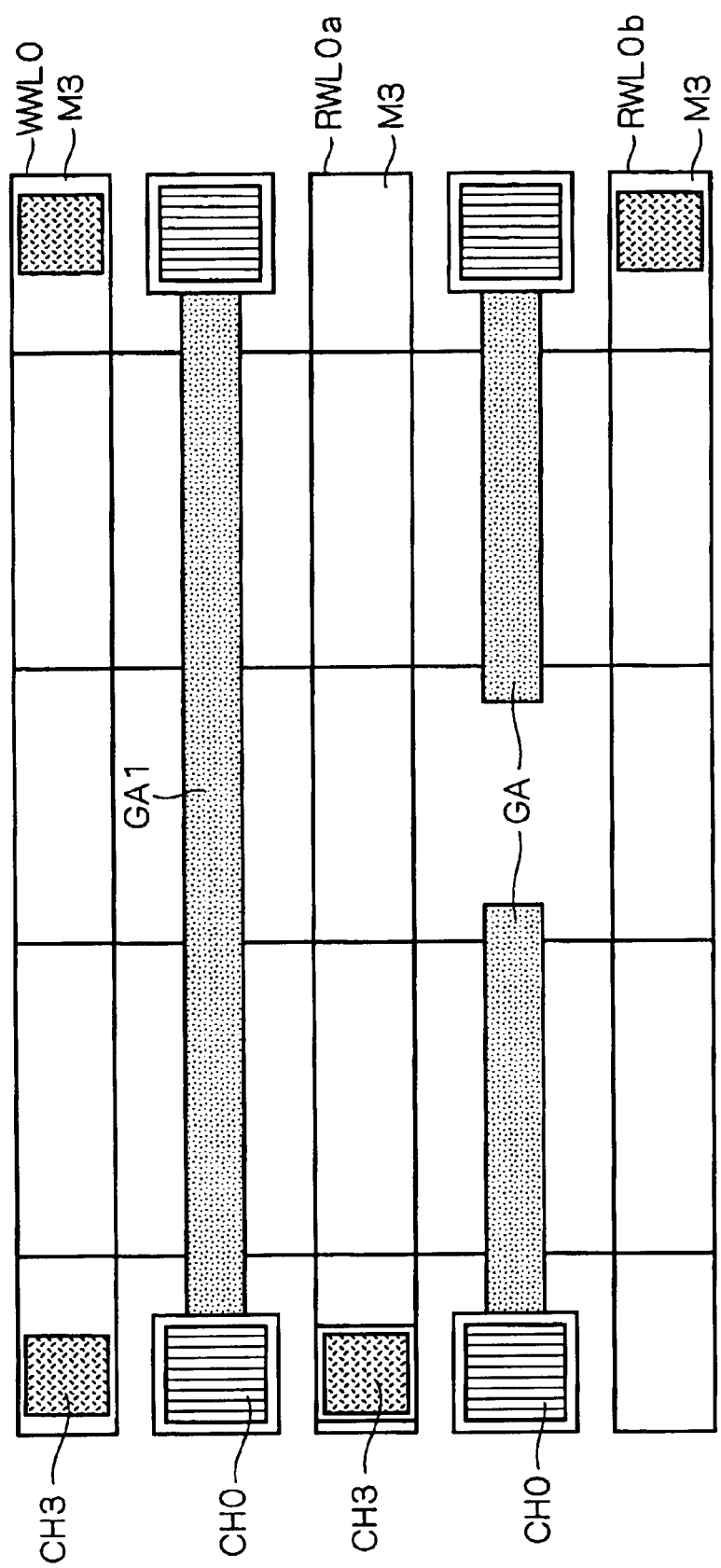
FIG. 32 is a diagram showing a plan layout of word lines and the underlying layers of one memory cell of the first modification of the MRAM in the fourth preferred embodiment.

FIG. 32 is a plan layout showing mainly the third metal layer M3, wherein a plurality of the third metal layers M3 corresponding to word lines WWL0, RWL0a, and RWL0b are disposed in the order named from the upper side as seen in FIG. 32, so that these lines cross over two active regions AA. The plural third metal layers M3 are disposed in parallel so as to be parallel, when viewed from above, to the lengthwise direction of each gate electrode GA.

As described above, on the plan layout of the MRAM 400A, all the gate electrodes of the MOS transistors in a single memory cell are disposed in bilateral symmetry around the magnetic tunnel resistive element. It is therefore possible to reduce the CD shift when performing patterning of gate electrodes in the manufacturing steps.

D-6. Second Modification
D-6-1. Device Configuration

In the configuration of the MRAM 400 shown in FIG. 21, the word lines RWL0a, RWL0b, RWL1a, and RWL1b are provided as word lines for reading information; the word lines WWL0a, WWL0b, WWL1a, and WWL1b are provided as word lines for writing information; the bit lines RBL0a, RBL0b, RBL1a, and RBL1b are provided as bit lines for reading information; and the bit lines WBL0a, WBL0b, WBL1a, and WBL1b are provided as word lines for writing information. In an alternative, a single word line for writing information, a single bit line for reading information may be provided per memory cell, and only one bit line for reading information may be provided per memory cell, as in a MRAM 400B shown in FIG. 33.

Figure 33:
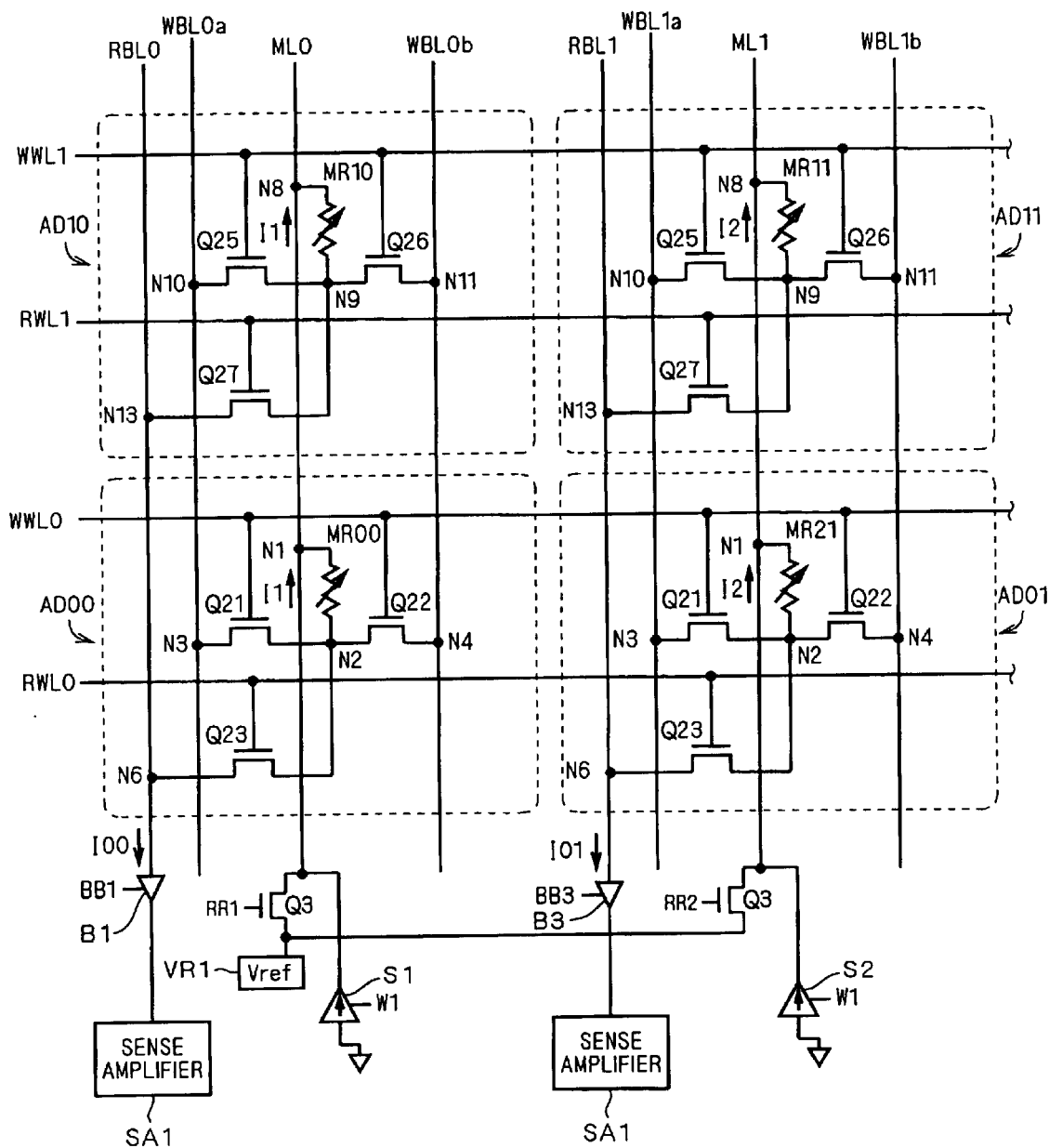
FIG. 33 is a diagram showing a circuit configuration of a second modification of the MRAM in the fourth preferred embodiment.

Specifically, in FIG. 33, the memory cell of the address AD00 has the MOS transistor Q23 alone as a MOS transistor for writing, and the MOS transistor 23 is electrically connected between a bit line RBL0 and node N9.

The memory cell of an address AD01 has a MOS transistor Q23 alone as a MOS transistor for writing, and the MOS transistor 23 is electrically connected between a bit line RBL1 and node N9.

The memory cell of an address AD10 has a MOS transistor Q27 alone as a MOS transistor for writing, and the MOS transistor 27 is electrically connected between the bit line RBL0 and node N9.

The memory cell of the address AD11 has the MOS transistor Q27 alone as a MOS transistor for writing, and the MOS transistor 27 is electrically connected between the bit line RBL1 and the node N9.

In the memory cells of the addresses AD00 and AD01, the gate electrodes of the MOS transistors Q21 and Q22 are connected to a word line WWL0, and the gate electrode of the MOS transistor Q23 is connected to a word line RWL0.

In the memory cells of the addresses AD10 and AD11, the gate electrodes of the MOS transistors Q25 and Q26 are connected to a word line WWL1, and the gate electrode of the MOS transistor Q27 is connected to the word line RWL1. Otherwise, the configuration is the same as that of the MRAM 400 shown in FIG. 21.

D-6-2. Operation

The operation of the MRAM 400B will be described using timing charts of FIGS. 34 and 35.

Figure 34:
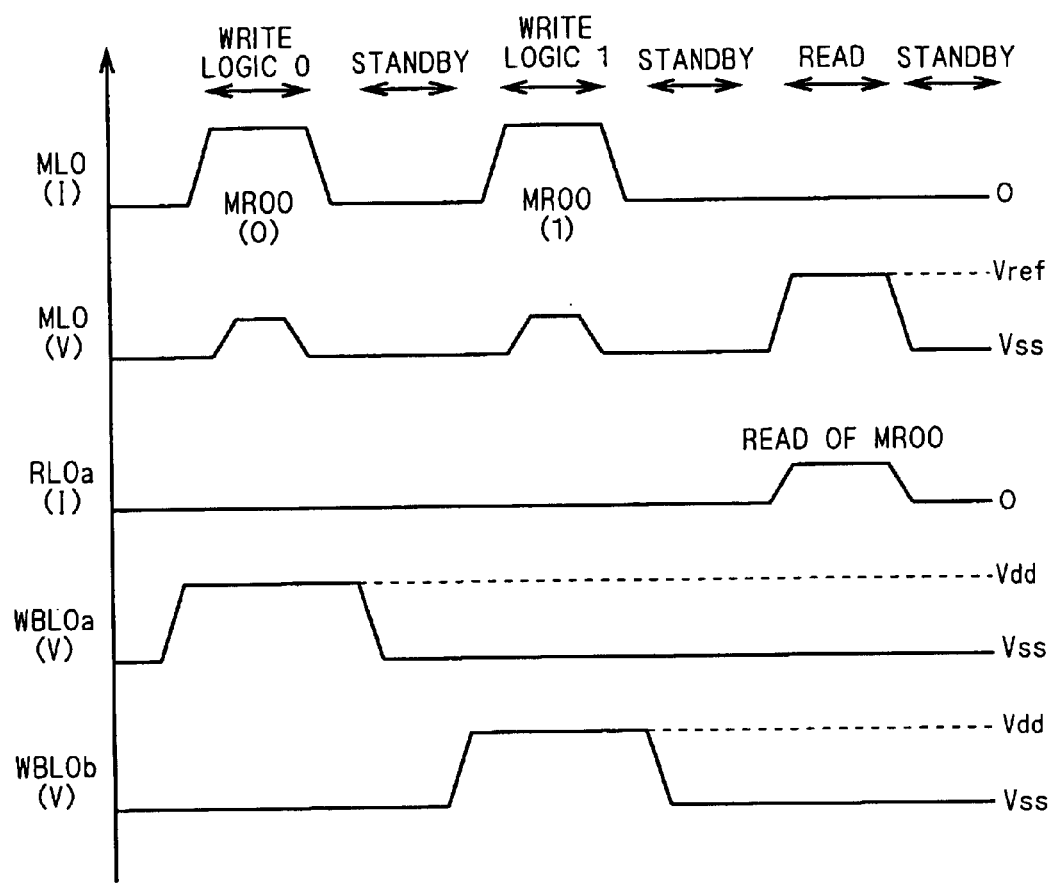
FIGS. 34 and 35 are timing charts illustrating the operation of the second modification of the MRAM in the fourth preferred embodiment.
Figure 35:
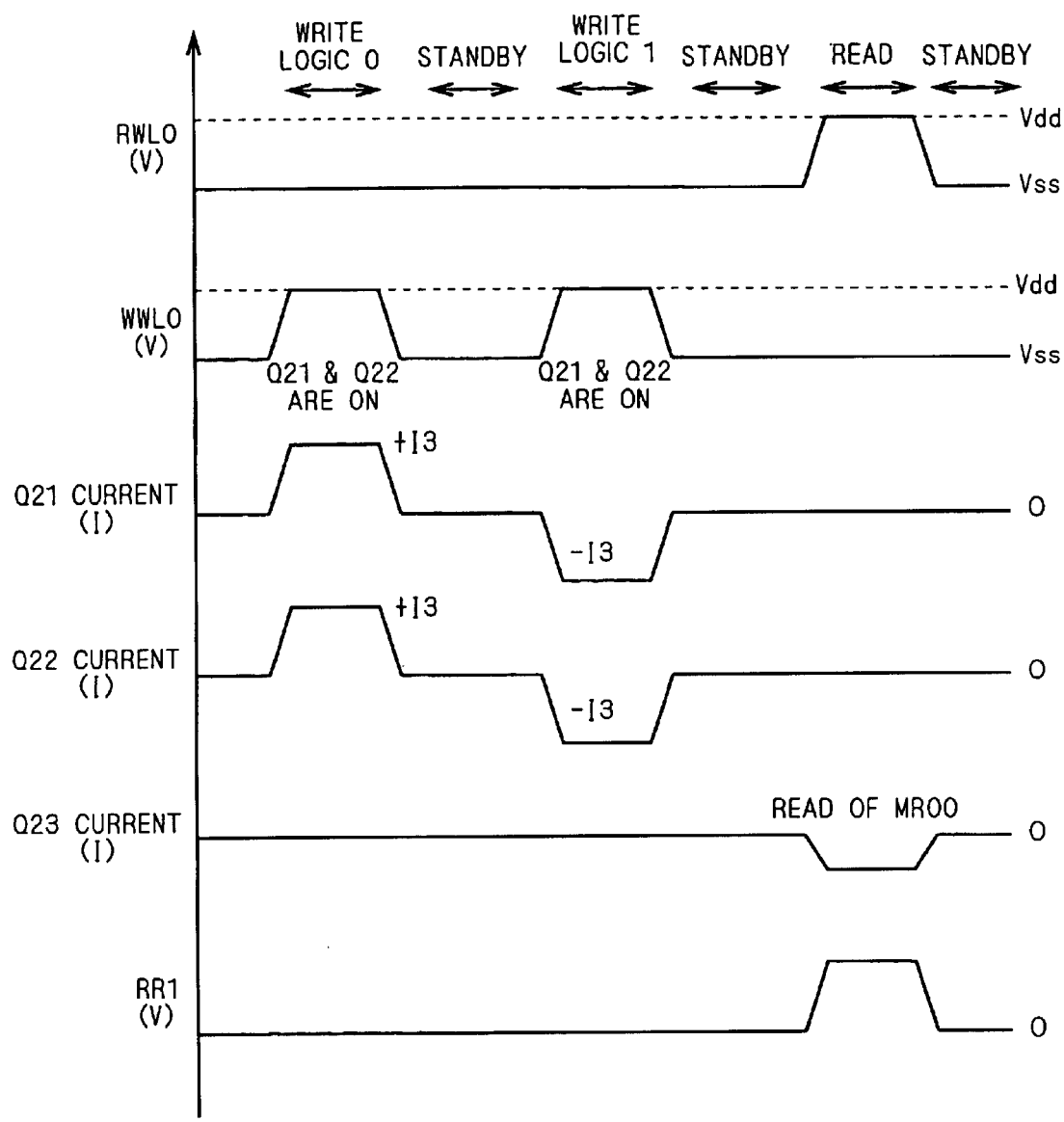

FIGS. 34 and 35 are timing charts of various voltages and currents in data write/read operation to the address AD00 in the MRAM 400B.

D-6-2-1. Write Operation

In the case of writing data onto the address AD00, a predetermined voltage is supplied to a switch W1 of a current source with a switch S1 such that the switch W1 is on, and current I1 is passed to a memory line ML0.

Voltage Vdd is supplied to the bit line WBL0a for a predetermined period necessary for writing, whereas voltage Vss is supplied to the bit line WBL0b for that period.

Subsequently, voltage Vdd is supplied to the word line WWL0 for a predetermined period such that the MOS transistors Q21 and Q22 enter the on state. Thereby, current I3 passes from node N3 to node N4. The direction of the current I3 is taken as a positive "+" direction, and referred to as a "current +I3."

FIG. 34 shows a timing chart of current passing through the MOS transistors Q21 and Q22, and indicates that the current +I3 passes at the above-mentioned timing. In FIG. 35, a positive symbol "+" is appended when the current passing through the MOS transistor Q21 is directed from the node N3 to N2, and a negative symbol "−" is appended when directed to the opposite direction; and a positive symbol "+" is appended when the current passing through the MOS transistor Q22 is directed from the node N2 to N4, a negative symbol "−" is appended when directed to the opposite direction.

As the result, by an alternating magnetic field that the currents I1 and I3 generate, the magnetization vector of the ferromagnetic layer FM1 of the magnetic tunnel resistive element MR00 is determined to perform writing. The magnetization vector of the ferromagnetic layer FM2 is fixed and remains unchanged.

Through the above-mentioned sequence of operations, information is written on the magnetic tunnel resistive element MR00 (i.e., the address AD00). This written information is taken as "logic 0".

Subsequently, when the switch W1 of the current source with a switch S1 is off, no current I1 passes through the memory line ML0. Thereafter, the potential of the memory line ML0 is precharged up to voltage Vss.

The voltage of the word line WWL0 is set at voltage Vss to bring the MOS transistors Q21 and Q22 into the off state. Voltage Vss is also supplied to the bit lines WBL0a and WBL0b. This period is referred to as a "standby period."

Meanwhile, if "logic 1" opposite the above-mentioned logic is written on the magnetic tunnel resistive element MR00, a predetermined voltage is supplied to the switch W1 of the current source with a switch S1 so that the switch W1 is on, and current I1 is passed through the memory line ML0.

Then, voltage Vdd is supplied to the bit line WBL0b for a predetermined period necessary for writing, whereas voltage Vss is supplied to the bit line WBL0a for that period.

Next, the voltage Vdd is supplied to the word line WWL0 for a predetermined period so that the MOS transistors Q21 and Q22 enter the on state. Thereby, current I3 passes from the node N4 to N3. The direction of this current I3 is taken as a negative "−" direction, and referred to as a "current −I3."

The timing chart of current passing through the MOS transistors Q21 and Q22, as shown in FIG. 35, indicates that the current –I3 passes at the above-mentioned timing.

As the result, by an alternating magnetic field that the currents I1 and I3 generate, the magnetization vector of the ferromagnetic layer FM1 of the magnetic tunnel resistive element MR00 is determined to perform writing. Since the current I3 passes from the node N4 to N3, the magnetization vector is different from that in the writing of "logic 0," thereby to write "logic 1" opposite "logic 0." At this time, the magnetization vector of the ferromagnetic layer FM2 remains unchanged.

D-6-2-2. Read Operation

In the case of reading data from the address AD00, as a gate control signal RR0, a predetermined voltage is first supplied to a MOS transistor Q3 serving as an output switch of a reference voltage source VR1 so that the MOS transistor Q3 enters the on state. As shown in FIG. 35, the period of supplying the predetermined voltage is set so as to be more than the predetermined period necessary for reading.

By this operation, a reference voltage Vref is supplied to the memory line ML0.

In the case of reading information into the bit line RBL0, voltage Vdd is supplied to the word line RWL0 such that the MOS transistor Q23 enters the on state.

When the MOS transistor Q23 enters the on state, current passes through the magnetic tunnel resistive element MR00 and the current is passed from node N1 via node N2 to node N6. The magnitude of this current is determined by the resistance value of the magnetic tunnel resistive element MR00 (i.e., the magnetization direction of the ferromagnetic material).

Referring to FIG. 35, the current passing through the MOS transistor Q23 by this read operation is indicated as a negative "–" current.

Almost all the current passing through the magnetic tunnel resistive element MR00 pass via the MOS transistor Q23 to the bit line RBL0, as current I00.

By supplying voltage Vdd to a switch BB1 of a buffer with a switch B1, the buffer B1 enters the on state, so that the current I00 is amplified and supplied to the sense amplifier SA1. In the sense amplifier SA1, the amplified current I00 is sensed and amplified to read information.

After the information is read into the bit line RBL0, voltage Vss is supplied to the switch BB1 of the buffer with a switch B1, and the buffer B1 enters the off state.

Voltage Vss is also supplied to the word line RWL0 such that the MOS transistor Q23 enters the off state.

Thereafter, voltage Vss is supplied to the gate control signal RR1 of the MOS transistor Q3 that is the output switch of the reference voltage source VR1, so that the MOS transistor Q3 enters the off state. The potential of the memory line ML0 is precharged up to voltage Vss.

As the result, voltage Vss is supplied to the word line RWL0 and the bit lines RBL0a and RBL0b, and the potential of the memory line ML0 is precharged up to voltage Vss, thereby initiating the standby period.

Thus, in the above-mentioned MRAM 400B, such a configuration that lines for information writing to memory cells and lines for information reading from the memory cells are provided separately can be kept at a minimum.

D-6-3. Plan Configuration

Figure 36:
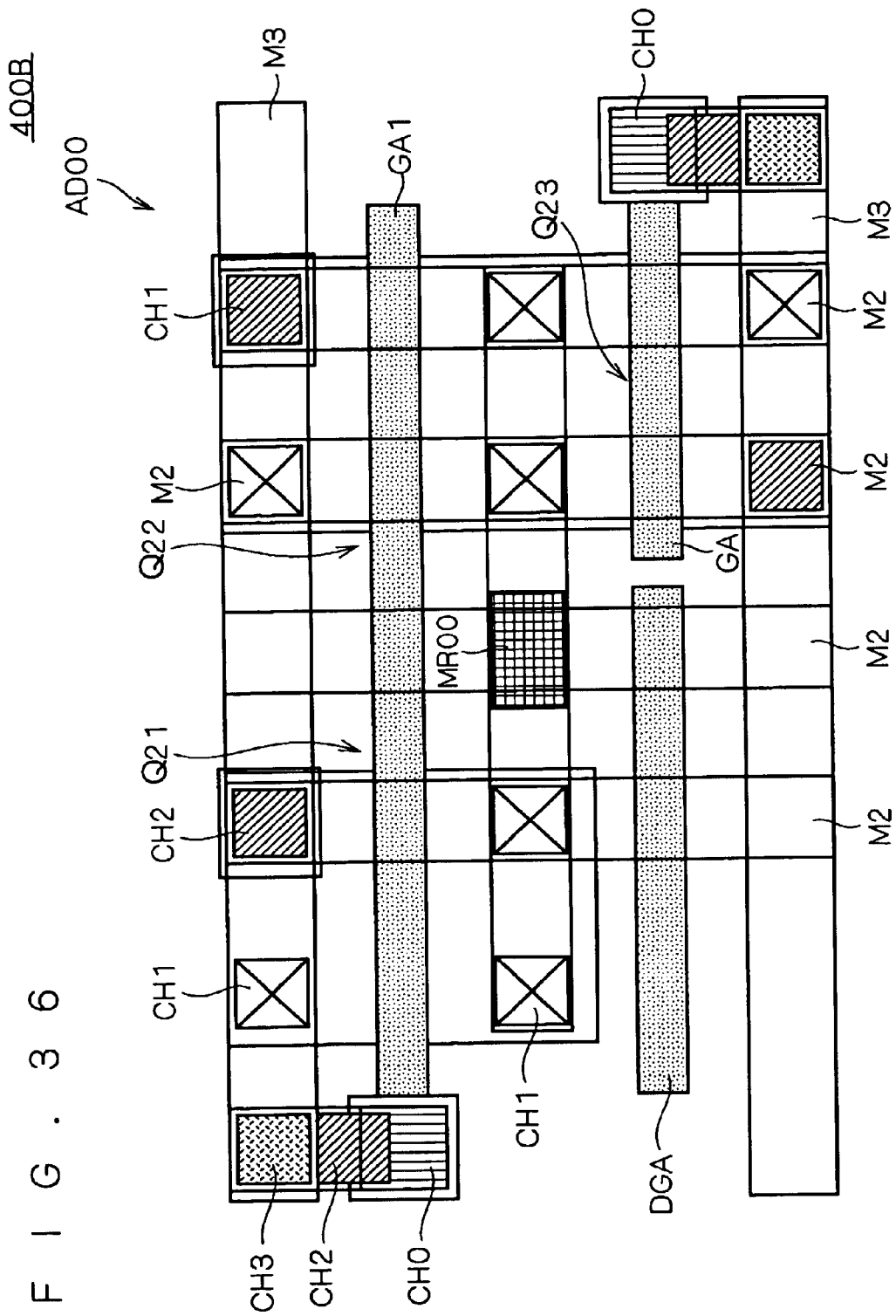
FIG. 36 is a diagram showing a plan layout of one memory cell of the second modification of the MRAM in the fourth preferred embodiment.

FIG. 36 shows schematically a plan layout of one memory cell constituting the MRAM 400B.

Specifically, FIG. 36 shows the state that plan layouts of the respective layers of the memory cell of the address AD00 are overlapped with each other, wherein a gate electrode GA of MOS transistor Q23 and a dummy gate electrode DGA are disposed in parallel widthwise of a common gate electrode GA1 of MOS transistors Q21 and Q22. The gate electrodes GA and the dummy gate electrode DGA are disposed in a row lengthwise. A magnetic tunnel resistive element MR00 is disposed centrally in an area surrounded by the gate electrode GA1 and the array of the gate electrode GA and dummy gate electrode DGA.

The gate electrodes GA1 and GA are connected via a contact part CH0 to an upper-layer first metal layer M1, the first metal layer M1 is connected via a contact part H2 to an upper-layer second metal layer M2, and the second metal layer M2 is connected via a contact part CH3 to an upper-layer third metal layer M3.

The magnetic tunnel resistive element MR00 is disposed between the first metal layer M1 and second metal layer M2, and the first metal layer M1 is electrically connected via a contact part CH1 to an active region AA.

Figure 37:
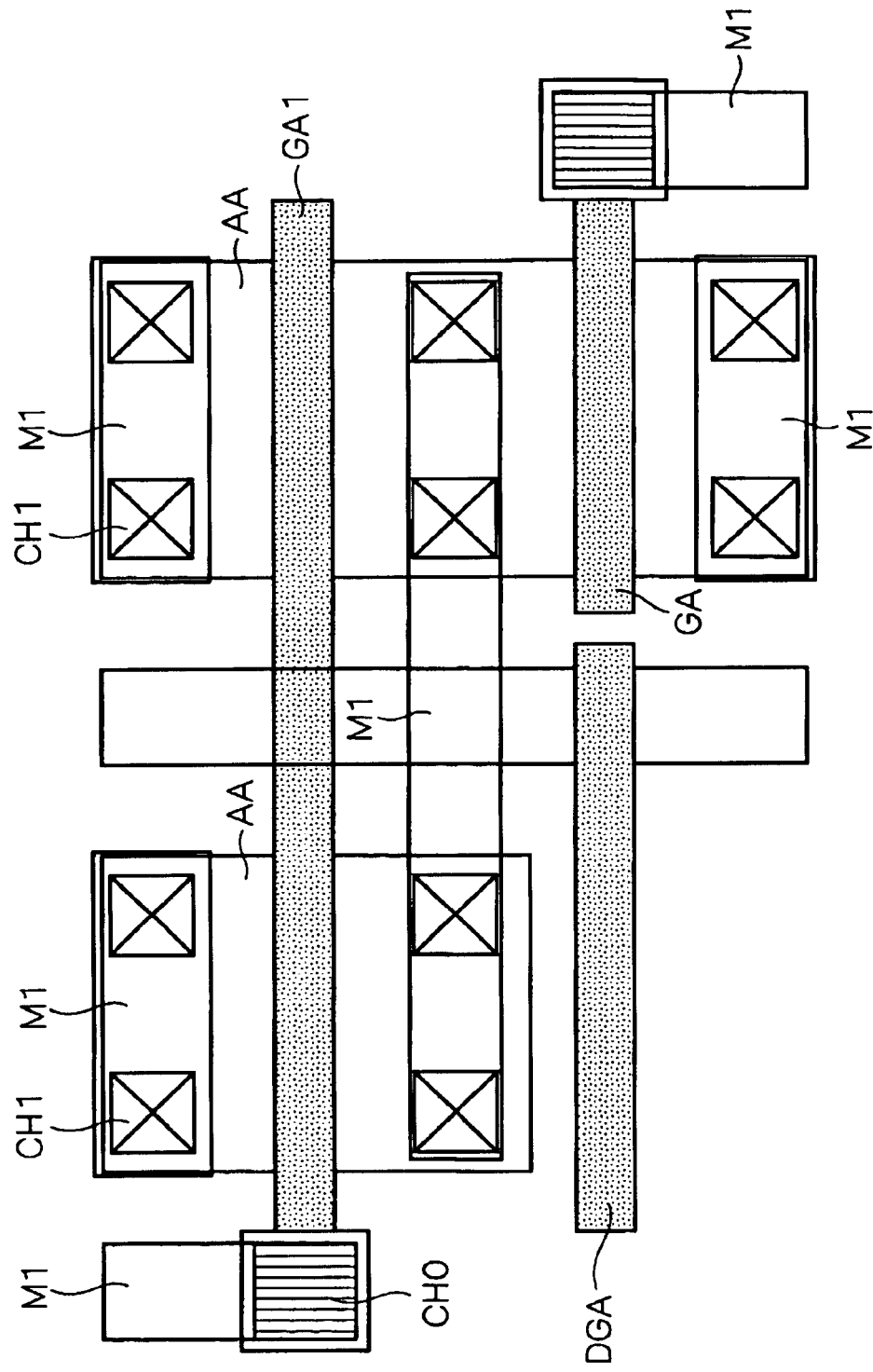
FIG. 37 is a diagram showing a plan layout of the lowermost layer of one memory cell of the second modification of the MRAM in the fourth preferred embodiment.

FIG. 37 is a plan layout showing the configuration of the first metal layer M1 and the underlying layers, wherein each first metal layer M1 is connected via the contact part CH1 to the active region AA.

Figure 38:
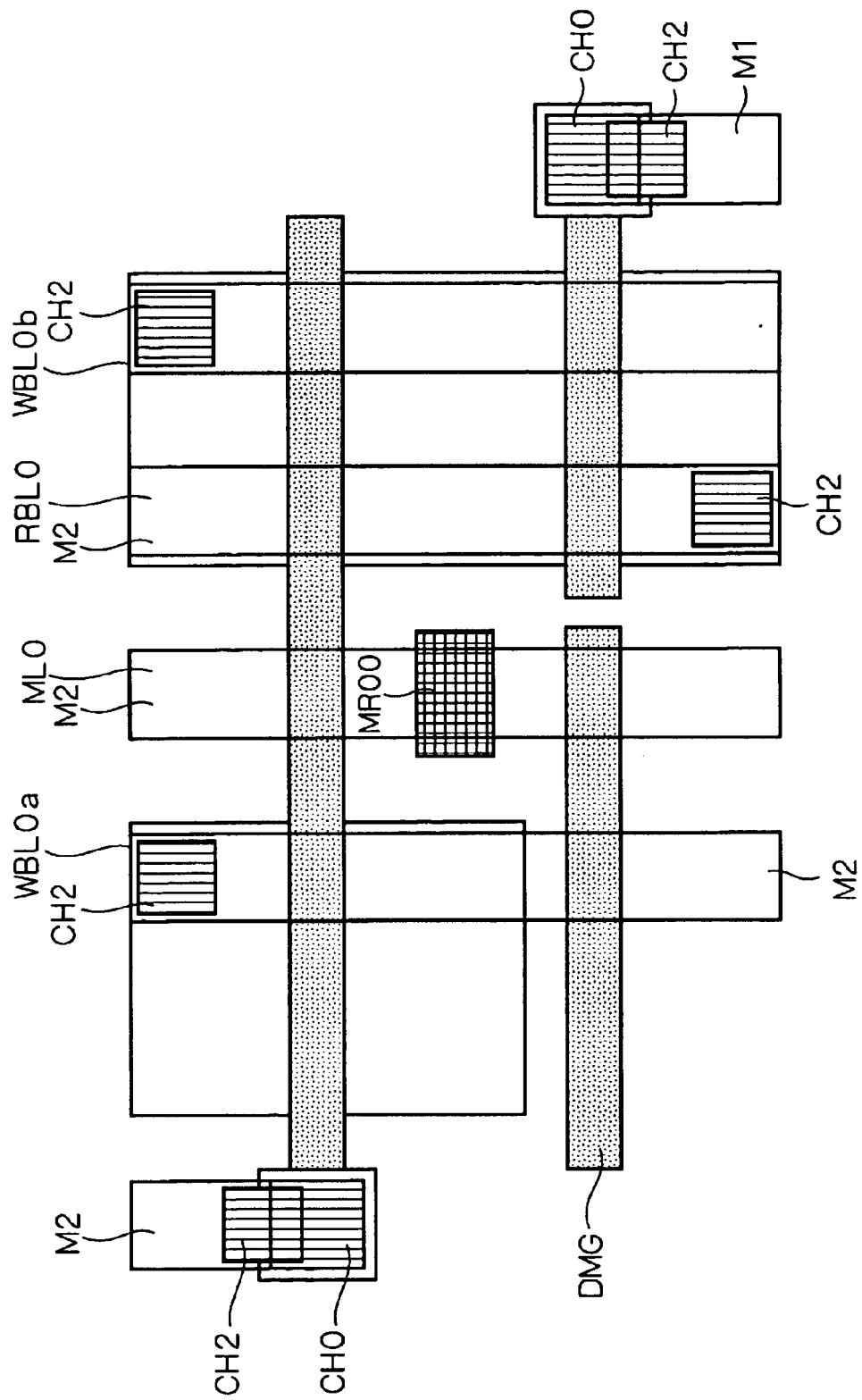
FIG. 38 is a diagram showing a plan layout of bit lines and the underlying layers of one memory cell of the second modification of the MRAM in the fourth preferred embodiment.
Figure 42:
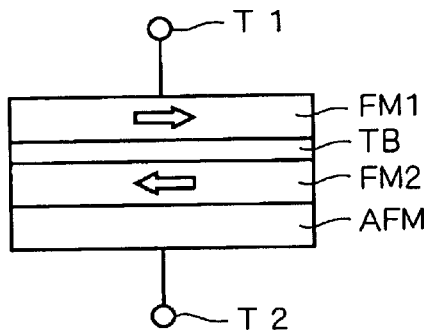
FIG. 42 is a diagram showing a basic configuration of a spin valve magnetic tunnel junction element.
Figure 43:
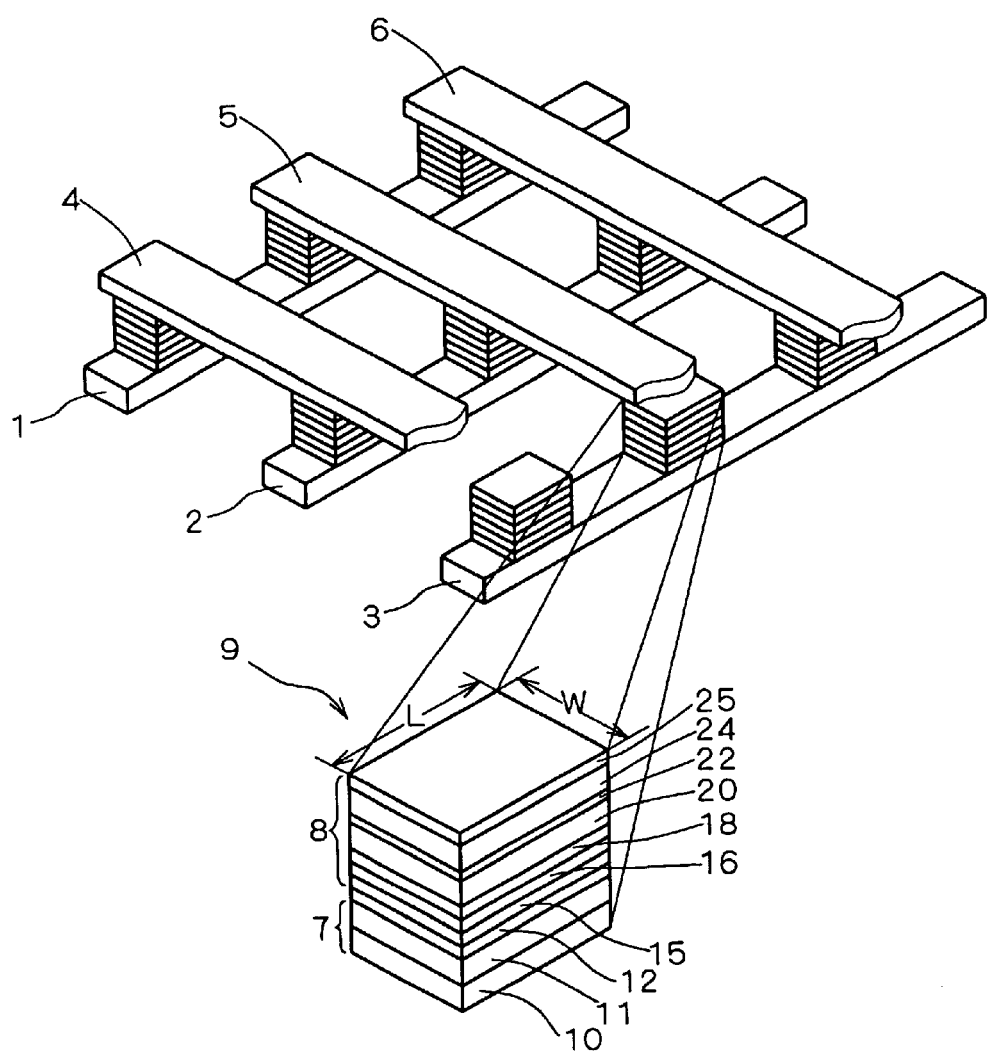
FIG. 43 is a perspective view of the configuration of a conventional MRAM cell array.
Figure 44:
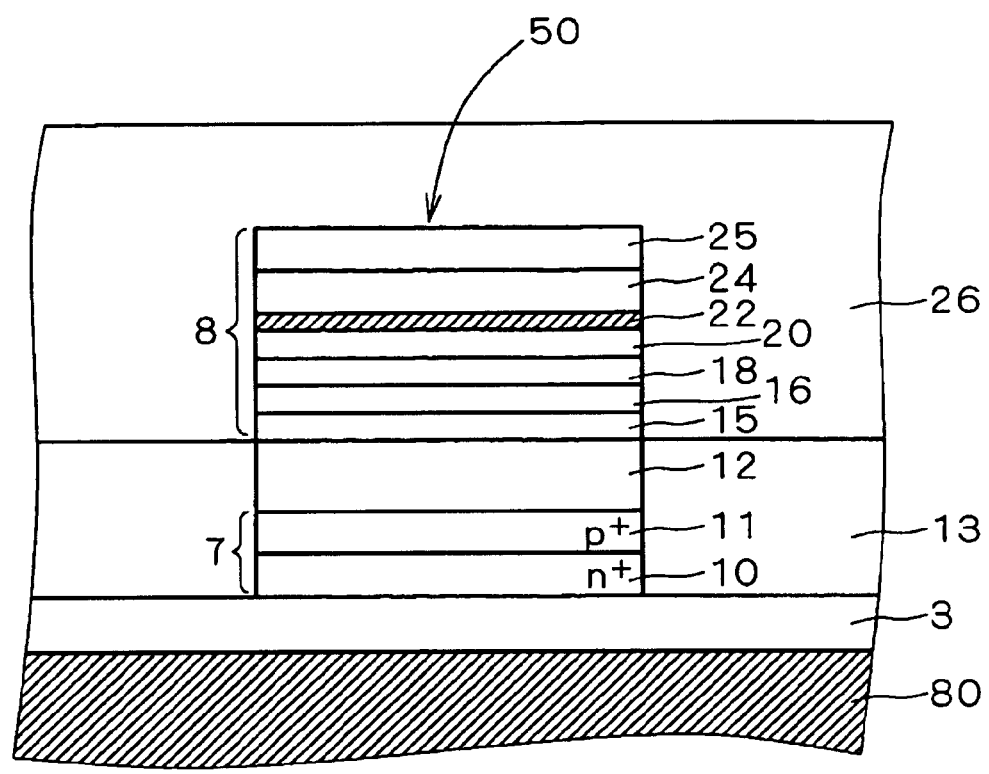
FIG. 44 is a sectional view of the configuration of the conventional MRAM cell array.

FIG. 38 is a plan layout mainly showing the second metal layer M2. That is, the second metal layer M2 corresponding to a memory line ML0 is disposed on the magnetic tunnel resistive element MR00. Above two active regions AA, a plurality of the second metal layers M2 corresponding to bit lines WBL0a, RBL0, and WBL0 are disposed in this order from the left side as seen in FIG. 38. These second metal layers M2 are disposed in parallel such that they are orthogonal, when viewed from above, to the lengthwise direction of the dummy gate electrode DGA, gate electrodes GA1 and GA.

Thus, the plan layout of the MRAM 400B has the dummy gate DGA in order to avoid that the array pattern of gate electrodes is irregular when the number of MOS transistors per memory cell is three. It is therefore possible to reduce the CD shift when performing patterning of gate electrode in the manufacturing step.

While the invention has been shown and described in detail, the foregoing description is in all aspects illustrative and not restrictive. It is therefore understood that numerous modifications and variations can be devised without departing from the scope of the invention.

What is claimed is:

1. A magnetic memory device comprising a memory cell array made by disposing in a matrix plural memory cells each having at least plural bit lines, plural word lines, and a magnetic tunnel junction element, said memory cells including:
a first current path that is electrically connected to a pair of first and second bit lines and functions as at least a current path for information reading to said magnetic tunnel junction element,
said first current path including:
first and second switch elements disposed in said first current path,
said first and second switch elements being commonly connected to one of the nodes of the magnetic tunnel junction,
said first switch element controlling electrical connection/non-connection between said first bit line and said magnetic tunnel junction element, and
said second switch element controlling electrical connection/non-connection between said second bit line and said magnetic tunnel junction element.

2. The magnetic memory device according to claim 1 wherein said first current path also functions as a current path for information writing to said magnetic tunnel junction element,
said memory cells further have a second current path which functions as a current path for information writing/reading to said magnetic tunnel junction element, said first and second current paths have no contact with each other and cross at right angles to each other in a plan view, and said magnetic tunnel junction element is electrically connected between said first and second current paths.

3. The magnetic memory device according to claim 2 wherein said memory cells further have a third current path that is electrically connected to a pair of third and fourth bit lines and functions as a current path for information writing/reading to said magnetic tunnel junction element, said third current path has third and fourth switch elements disposed in said third current path, said third switch element controls electrical connection/non-connection between said third bit line and said magnetic tunnel junction element, and said fourth switch element controls electrical connection/non-connection between said fourth bit line and said magnetic tunnel junction element.

4. The magnetic memory device according to claim 2 wherein among said plural memory cells arranged in a matrix, said memory cells that are disposed in different bit strings and adjacent to each other share at least one of said first and second bit lines disposed therebetween.

5. The magnetic memory device according to claim 1 wherein said first and second switch elements open and close based on a control signal supplied from first and second word lines, respectively.

6. The magnetic memory device according to claim 3 wherein said first and second switch elements open and close based on a control signal supplied from first and second word lines, respectively, and said third and fourth switch elements open and close based on a control signal supplied from third and fourth word lines, respectively.

7. The magnetic memory device according to claim 3 wherein said first and second switch elements open and close based on a control signal supplied from a first word line, and said third and fourth switch elements open and close based on a control signal supplied from second and third word lines, respectively.

8. The magnetic memory device according to claim 2 further comprising:

a voltage source and a current source that are connected to said second current path, wherein a voltage supply from said voltage source and a current supply from said current source to said second current path are selectively performed.

9. The magnetic memory device according to claim 2 wherein said memory cells further have a third current path that is electrically connected to a third bit line and functions as a current path for information reading to said magnetic tunnel junction element, said third current path having a third switch element disposed in said third current path, and said third switch element being disposed so as to control electrical connection/non-connection between said third bit line and said magnetic tunnel junction element.

10. The magnetic memory device according to claim 9 wherein said first and second switch elements open and close based on a control signal supplied from a first word, and said third switch element opens and closes based on a control signal supplied from a second word line.

11. The magnetic memory device according to claim 1 wherein said memory cells further have:

a second current path which functions as a current path for information writing to said magnetic tunnel junction element; and a third current path which functions as a current path for controlling magnetization direction of a magnetic material constituting said magnetic tunnel junction element when information is written onto said magnetic tunnel junction element, said magnetic tunnel junction element electrically connected between said first and second current paths.

12. The magnetic memory device according to claim 3 wherein said magnetic tunnel junction element has a multilayer magnetic film that is made by stacking so as to form at least one magnetic tunnel junction, said first current path electrically being connected to one of the uppermost layer and lowermost layer of said multilayer film, said second current path electrically connected to the other, and said third current path being disposed in the vicinity of said second current path while being electrically isolated from said second current path, and crossing at right angles to said first current path in a plan view.

13. The magnetic memory device according to claim 12 further comprising:

a current source and a voltage source that are electrically connected to said second current path, wherein said current source is a bidirectional current source capable of selecting the direction of current passed to said second current path, and a voltage supply from said voltage source and a current supply from said current source to said second current path are selectively performed.

14. The magnetic memory device according to claim 1 wherein said plural bit lines and said plural word lines are branch lines constituting a hierarchical bit line structure and a hierarchical word line structure, respectively.

15. The magnetic memory device according to claim 1 wherein said first and second bit lines are respectively connected to a sense amplifier.

16. The magnetic memory device according to claim 15 wherein said sense amplifier is connected to a power supply line that is a branch line constituting a hierarchical power line structure.

17. The magnetic memory device according to claim 1 wherein said magnetic tunnel junction element is disposed in a layer at which said first and second switch elements are disposed.

18. The magnetic memory device according to claim 1 wherein said magnetic tunnel junction element is disposed in an upper layer than a layer of said first and second bit lines.

* * * * *